US006806553B2

(12) United States Patent
Yashima et al.

(10) Patent No.: US 6,806,553 B2
(45) Date of Patent: Oct. 19, 2004

(54) TUNABLE THIN FILM CAPACITOR

(75) Inventors: Yukihiko Yashima, Kyoto (JP); Kazuhiro Kusabe, Kyoto (JP); Tsuneo Mishima, Kyoto (JP); Tetsuya Kishino, Kyoto (JP)

(73) Assignee: Kyocera Corporation, Kyoto (JP)

( * ) Notice: Subject to any disclaimer, the term of this patent is extended or adjusted under 35 U.S.C. 154(b) by 105 days.

(21) Appl. No.: 10/113,776

(22) Filed: Mar. 28, 2002

(65) Prior Publication Data

US 2003/0071300 A1 Apr. 17, 2003

(30) Foreign Application Priority Data

| Mar. 30, 2001 | (JP) | P2001-102710 |
| Apr. 27, 2001 | (JP) | P2001-131680 |
| Apr. 27, 2001 | (JP) | P2001-131681 |
| Apr. 27, 2001 | (JP) | P2001-131682 |
| Apr. 27, 2001 | (JP) | P2001-131683 |
| Jul. 26, 2001 | (JP) | P2001-226644 |
| Jul. 26, 2001 | (JP) | P2001-226645 |
| Jul. 26, 2001 | (JP) | P2001-226646 |
| Jul. 26, 2001 | (JP) | P2001-226647 |
| Jul. 26, 2001 | (JP) | P2001-226648 |

(51) Int. Cl.[7] .............. H01L 27/108; H01L 29/76; H01L 29/94; H01L 31/119
(52) U.S. Cl. .................. 257/532; 257/296; 257/295
(58) Field of Search ............... 257/295–310, 257/532; 438/253–254; 361/310–312

(56) References Cited

U.S. PATENT DOCUMENTS 5,856,242 A 1/1999 Arai et al.

6,100,773 A * 8/2000 Nakamichi et al. ........... 333/32

FOREIGN PATENT DOCUMENTS

| JP | 08-241830 | 9/1996 |
| JP | 09-031645 | 2/1997 |
| JP | 09-260603 | 10/1997 |
| JP | 11-003839 | 1/1999 |
| JP | 11-260667 | 9/1999 |

OTHER PUBLICATIONS

A. Walkenhorst et al., "Dielectric properties of SrTiO3 thin films used in high Tc superconducting filed–effect devices", Appl. Physics Lett. 60 (14), Apr. 6, 1992, USA; pp. 1744–1746.

Cem Basceri, et al., "The dielectric response as a function of temperature and film thickness of fiber–textured (Ba,Sr) TiO3 thin films grown by chemical vapor deposition.", Appl. Physics 82 (5), Sep. 1, 1997, USA; pp. 2497–2504.

W. Chang, et al., "The effect of (Ba,Sr) and (Mn,Fe,W) Dopants on the microwave properties of BaxSr1–xTio3 thin films" Mat. Res. Soc. Symp. Proc. vol. 541, 1999, USA, pp. 699–704.

* cited by examiner

Primary Examiner—Cuong Nguyen
(74) Attorney, Agent, or Firm—Hogan & Hartson, LLP

(57) ABSTRACT

It is an object of the invention to provide a variable capacitor constituted such that, even when an external control voltage is applied, a stable dielectric constant of the dielectric layer can be obtained. A variable capacitor constituted such that a dielectric layer whose dielectric constant is changed by the application of an external voltage is held between an upper electrode layer and a lower electrode layer, wherein a plurality of capacitance-producing regions a, b are connected to each other.

12 Claims, 14 Drawing Sheets

TUNABLE THIN FILM CAPACITOR

BACKGROUND OF THE INVENTION

1. Field of the Invention

The present invention relates to a tunable thin film capacitor with a thin film dielectric layer whose dielectric constant is changed by the voltage applied across a lower electrode layer and an upper electrode layer.

2. Description of the Related Art

It is so far known that a strontium titanate ($SrTiO_3$) thin film that is a paraelectric substance or a strontium barium titanate (Ba, Sr) $TiO_3$ thin film that is a ferroelectric substance exhibits a non-linear change in the dielectric constant thereof upon application of a predetermined voltage to the dielectric thin film thereof (A. Walkenhorst et al., Appl. Phys. Lett. 60 (1992) 1744 and Cem Bascriet. al., J. Appl. Phys 82 (1997) 2497).

Thin film capacitors using as their thin film dielectric layers perovskite structure ferroelectric oxide thin films of these strontium titanate and strontium barium titanate, etc. are proposed (Japanese Unexamined Patent Publication JP-A 11-260667 (1999)).

These tunable thin film capacitors are each constituted in such a manner that, on a support substrate 161, a lower electrode layer 162, a thin film dielectric layer 163 and an upper electrode layer 164 are successively formed by deposition as shown in a sectional view of FIG. 24. More specifically, on the support substrate 161, a conductor layer that will become the lower electrode layer 162 is formed by deposition over approximately the whole surface of the substrate 161, and then, patterning is performed to form the lower electrode layer 162 of a predetermined shape. Next, the dielectric layer 163 is formed on the lower electrode layer 162. This dielectric layer 163 is formed, by the thin film method, with a mask placed at a predetermined position, or formed by the spin coating process, and then patterned into a predetermined shape. Further, the layer is heated for hardening as required. The upper electrode layer 164 is formed in such a manner that a conductor layer that will become the upper electrode layer 164 is formed on the dielectric film 163 and then pattern-processed. Here, the facing region of the dielectric layer 163 which is actually held between the lower electrode layer 162 and the upper electrode layer 164 becomes a capacitance-producing region.

In the dielectric layer 163 in this capacitance-producing region, the dielectric constant that the dielectric layer 163 has is changed by an external control voltage fed across the lower electrode layer 162 and the upper electrode layer 164.

Accordingly, in case that the mutually facing areas of both electrodes layers 162 and 164 and the thickness of the dielectric layer 163 are made constant, the capacitance value obtained between both electrode layers 162 and 164 can be varied by setting the external control voltage at a predetermined voltage.

Further, the thin film capacitor shown in FIG. 24 is constituted such that, in order to prevent the lower electrode layer 162 and the upper electrode layer 164 from short-circuiting to each other, the upper electrode layer 164 is extended onto the support substrate 161 so as to form an air bridge 165. In other words, by extending the upper electrode layer 164 onto the support substrate 161, as pace is formed around the dielectric layer 163.

This space can be formed in such a manner that an organic resist member that is formed by heat treatment or the like is formed, and thereafter, the upper electrode layer 164 is formed and heat-treated.

In such a variable capacitor, the capacitance thereof is changed by a control voltage applied across the lower electrode layer 162 and the upper electrode layer 164, and therefore, it is important that this voltage be uniformly applied to the dielectric layer 163.

This external control voltage is, for example, ten to several tens of volts, but this external control voltage is, actually, hard to be uniformly applied to the capacitance-producing region; and thus, it is difficult to stabilize the dielectric constant of the dielectric layer 163 to a predetermined value. For example, by taking the maximum capacitance into consideration, the facing area of the capacitance-producing region is set, but, in case that an attempt is made to obtain this capacitance value from one capacitance-producing region, the area of the capacitance-producing region is increased. As a result, the voltage drop of the control voltage occurs in the upper electrode layer 164 and the lower electrode layer 162; and, of the lower electrode layer 162 and the upper electrode layer 164, the portions adjacent to portions 162a, 164a extended from the capacitance-producing region become high in potential, while, in the central portion of the capacitance-producing region and portions away from the extension portions 162a, 164a shown in FIG. 25, the potential becomes relatively low. In other words, in the same capacitance-producing region, a distribution of potential takes place, resulting in the problem that the sufficient dielectric constant control, i.e., a sufficiently wide variable range, cannot be obtained; due to this, there has been the problem that a capacitance corresponding to the external voltage cannot be obtained as according to the specifications.

Further, in order to structurally prevent the upper electrode layer 164 and the lower electrode layer 162 from short-circuiting to each other, the air bridge 165 is provided. The existence of this hollow structure results in giving a large restriction when the capacitor is mounted on a mother board and in lacking in reliability. Further, as for the method of manufacturing the upper electrode layer 164, an organic resist is used for the formation of the air bridge 165, and thus, a manufacturing method deviating from the thin film technology must be used, so that the manufacturing steps become very complicated.

To a tunable thin film capacitor that operates in a high-frequency region, it is important to reduce the loss of the respective electrode layers. For this, it necessary to increase the thickness of a lower electrode layer 162 and an upper electrode layer 164. In practice, however, it is difficult to increase the thickness of the lower electrode layer 162.

It is because, in the case of increasing the thickness of the lower electrode layer 162, the coverage of the lower electrode layer 162 to the dielectric layer 163 is deteriorated. Further, separation by peeling takes place between a substrate 161 and the lower electrode layer 162. Moreover, separation by peeling takes place between the dielectric layer 163 and the lower electrode layer 162. These inconveniences are caused because, by increasing the thickness of the lower electrode layer 162, the stress resulting from the difference between the thermal expansion coefficients of the substrate 161 and the dielectric layer 163 is increased.

Particularly, in the case of such a variable capacitance element, the increase in thickness of both electrode layers 162, 164 is very important in view of the fact that a relatively high capacitance controlling voltage of about 10 V must be applied to the dielectric layer 163 between the lower electrode layer 162 and the upper electrode layer 164.

Further, in the case of the known tunable thin film capacitor, an air bridge 165 was formed around the dielectric layer 163 in order to prevent the upper electrode layer 164 from short-circuiting to the lower electrode layer 162. Thus, a portion of the upper electrode layer 164 is positioned in the air like a bonding air, so that it is very difficult to actually mount the capacitor onto a mother board or the like; and thus, the known tunable thin film capacitor could hardly be put to practical use.

Concerning a tunable thin film capacitor constituted such that, by application of an external voltage, the dielectric constant of the dielectric layer is changed to vary the capacitance, the important problems to be solved are to reduce the voltage loss and signal component loss (hereinafter referred to merely as loss) due to the resistance component of the electrode portions and to improve the drapeability or coverage of the dielectric layer.

However, in the case of the known structure, if the thickness of a lower electrode layer 162 is increased in order to reduce the loss of the lower electrode layer 162 and the upper electrode layer 164, the coverage of a dielectric layer 163 for the lower electrode layer 162 is deteriorated. Further, when an external voltage (driving voltage) for varying the capacitance is applied, the electric field intensity becomes the maximum in a thin portion of the dielectric layer 163 (for example, the end of that portion of the dielectric layer 163 which covers the lower electrode layer 162), whereby dielectric breakdown takes place. Or, a crack is made in the dielectric layer 163, so that the lower electrode layer 162 and an upper electrode layer 164 opposite to it are short-circuited through the dielectric layer 163.

Further, there is the problem that, in case that a crack is produced at the end of the dielectric layer 163 in the externally extended portion of the upper electrode layer 164, of the lower electrode layer 162 and the upper electrode layer 164 that face each other through the dielectric layer 163, the portion that constitutes the capacitance is opened, and thus, the designed capacitance cannot be obtained.

Among the capacitors, there is a thin film capacitor constituted such that the electrode layers and the dielectric layer being constituent elements of the capacitor are formed of thin films. In this capacitor, normally, the thin film lower electrode layer, the thin film dielectric layer, and the upper electrode layer are successively laminated on an electrically insulating substrate in this order. In such a thin film capacitor, the lower electrode layer and the upper electrode layer are respectively formed by sputtering, vapor deposition or the like, and in addition, the dielectric layer is also formed by sputtering, the sol-gel process or the like. In the manufacture of such a thin film capacitor, normally the photolithography method is employed as follows: First, a conductor layer that will become the lower electrode layer is formed over the whole surface of an insulating support substrate, only the necessary portion of the conductor layer is then covered with a resist, and thereafter, the unnecessary portion of this conductor layer is removed by wet etching or dry etching to form the lower electrode layer of a predetermined shape. Next, on the support substrate, a dielectric layer that will become the thin film dielectric layer is formed over the whole surface, and the unnecessary portion of this dielectric layer is removed therefrom as in the case of the lower electrode layer, whereby the thin film dielectric layer of a predetermined shape is formed. Finally, a conductor layer that will become the upper electrode layer is formed over the whole surface, and the unnecessary portion of this conductor layer is removed to form the upper electrode layer of a predetermined shape. Further, a protective layer and solder bumps are formed, whereby it becomes possible to surface-mount the capacitor. Further, a tunable thin film capacitor constituted such that, as the material of the thin film dielectric layer, a dielectric material comprised of $(Ba_xSr_{1-x}) TiO_3$ is used, and, by applying a predetermined potential across the upper electrode layer and the lower electrode layer to change the dielectric constant of the dielectric layer, whereby the capacitance is controlled, is also of the same structure.

In order to use a thin film capacitor as, e.g., a capacitor in a high-frequency circuit, the self-resonant frequency thereof must be positioned at the side higher than the frequency used. Such a thin film capacitor can be realized by making the inductance at the lower electrode layer and the upper electrode layer small; a thin film capacitor with a small inductance is disclosed in, e.g., Japanese Unexamined Patent Publication JP-A 8-241830 (1996).

In order to use a thin film capacitor as a capacitor in a high-frequency circuit as mentioned above, the self-resonant frequency must be positioned at the side higher than the used frequency, the inductance must be small, and in addition, the loss of the lower electrode layer and the upper electrode layer must also be low. This is because, even in case that the resonance point is positioned at the side higher than the frequency at which the capacitor is used, the impedance resulting from the capacitor is small at a frequency in the vicinity of the resonance point, so that, in a capacitor with a large loss, the resistance component becomes predominant. Therefore, in order to reduce the loss due to the lower electrode layer and the upper electrode layer, a metal with a small resistivity must be used as the material of the lower electrode layer and the upper electrode layer, and the lower electrode layer and the upper electrode layer must be made as thick as possible.

Further, by making the capacitance of the capacitor small, it becomes possible to shift the self-resonant frequency thereof further towards the high-frequency side, and thus, the increase in the loss by the influence of resonance can be reduced. In order to reduce the capacitance of the capacitor, it is necessary to decrease the area of the capacitance-producing region comprised of the thin film dielectric layer sandwiched between the lower electrode layer and the upper electrode layer, but, by decreasing the area of the capacitor, a step that deteriorates the leakage characteristic is formed in the dielectric portion constituting the capacitor, and the accuracy in positional matching becomes hard to achieve at the manufacturing steps, thus resulting in a fall in manufacturing yield.

In order to use a thin film capacitor as a constituent part of a filter, a resonator or the like in a high-frequency circuit, it is required for the capacitor to have a high Q-value. The Q-value depends on the losses in the respective constituent elements of the capacitor; the dielectric loss of the dielectric, the ohmic loss in the electrodes, etc. are the main causes for lowering the Q-value.

In order to reduce the loss due to the lower electrode layer and the upper electrode layer, it is necessary to use a metal with a low resistivity; gold, silver, copper, aluminum, etc. are efficient, but, in the case of these metals, there is the possibility that there may be caused the problem that these metals are each oxidized at a high temperature during the manufacturing steps, the film quality thereof is deteriorated, the metals are chemically reacted with the dielectric layer. For example, in the case of an electrode comprised of gold, the smoothness of the electrode is deteriorated at a high temperature, which will cause the short-circuiting of the capacitor. Due to this, the structure constituted such that, on a layer of tungsten or molybdenum that is a high-melting metal material, platinum or the like is laminated as a reaction-preventing layer has so far been used as an electrode material (See Japanese Unexamined Patent Publication JP-A 9-260603 (1997)).

Further, it is a common practice to laminate an adherent layer using Ti or Cr between the support substrate and the electrode material for the purpose of enhancing the adherence.

However, there has been caused the problem that the high-melting metal material is low in conductivity as compared with gold or the like, and, in particular, the electrode loss cannot be reduced in a high frequency region higher than 1 GHz. Further, in case that platinum is used as the material of the reaction-preventing layer, there has also been caused the problem that the thermal stress of the reaction-preventing layer is large, so that the reaction-preventing layer is apt to peel off from the interface between the lower electrode layer and the support substrate due to the change in temperature during the manufacturing steps. Further, in case that gold is used as the conductive layer of the lower electrode layer, the film quality is markedly deteriorated due to the high temperature during the manufacturing steps, and thus, there have been caused problems such as the problem that the capacitor is short-circuited and the problem that the leakage current becomes large. Further, Ti, Cr, and the like are easy to react with BST and PZT that are general dielectric materials, so that, in case that these metals are used as adherent layers, there is the possibility that the characteristic of the dielectric may be deteriorated at the time of a process using a high temperature.

In such a tunable thin film capacitor, the upper electrode layer 164 was made into an air bridge structure 165, and therefore, the electrode length thereof became large, so that the conductor loss became increased. Further, due to the curved shape which is peculiar to the air bridge structure, there was caused the problem that the self-inductance L was large, so that the self-resonant frequency, defined by the condition: fo=½ $(LC)^{1/2}$ wherein C represents a static capacitance, was small, and thus, the operating frequency was limited to a low frequency region.

As a variable capacitance capacitor, there has so far been used a varactor diode constituted such that, by applying a reverse bias to the diode, the capacitance is changed. A diode is used in a rectifier circuit, etc., utilizing the phenomenon that, when a bias is forwardly applied to the PN junction thereof, a current flows. In the PN junction interface, there exists a region called a depletion layer in which no electron or hole exists. When a reverse bias is applied to the diode, the electrons and holes are both pulled in the direction a way from the PN junction interface, so that the depletion layer becomes thick, and the thickness of the depletion layer changes depending on the magnitude of the reverse bias. This depletion layer can be considered to be a dielectric, so that, in case that a reverse bias is applied to the diode, the thickness of the dielectric changes depending on the magnitude of the reverse bias, as a result of which the diode can be utilized as a capacitor whose capacitance changes.

The varactor diode is standardized for the utilization thereof as a variable capacitance capacitor. The varactor diode is used as the variable capacitance capacitor in communication apparatus, but, recently, due to the increase in the demand for portable communication terminals, the frequency band used for communications is being made higher, and in addition, efforts are being made to lower the voltage at the terminals. In the varactor diode, its loss is increased at high frequencies, and, in the case of using a low voltage, the depletion layer becomes thin, and the leakage current increases; and thus, the varactor diode theoretically ceases to function as a capacitor, so that it is difficult to make the varactor diode compatible with a high-frequency circuit (compatibility with the high-frequency operation).

Due to this, $(Ba_xSr_{1-x})TiO_3$ (hereinafter abbreviated as BST) and other dielectric materials are proposed in order to constitute an element that is usable as a variable capacitance capacitor even in a high-frequency operation (See, for example, Japanese Unexamined Patent Publication JP-A 11-3839 (1999)).

The rate of change in the capacitance of a variable capacitance capacitor having a dielectric layer made of such a dielectric material becomes a function of the electric field intensity applied to the dielectric layer, so that the thickness of the dielectric layer used in a variable capacitance capacitor whose capacitance is changed by a low voltage must normally be several $\mu$m or less. In order to fabricate such a dielectric layer, methods such as the sputtering process, the sol-gel process and the CVD process are used. In order to fabricate variable capacitance capacitors comprising dielectric layers at low costs, in large quantities and stably, it is considered that the use of the sputtering process is effective. In order to fabricate the dielectric layer by the use of the sputtering process, it is a common practice to use, as the target, ceramics of the same composition as the dielectric to be obtained. In the sputtering process using such a ceramics target, it is a common practice that an RF sputtering apparatus is used, and that, as the sputtering atmosphere, a mixture resulting from adding an $O_2$ gas into an Ar gas is used. Normally, in the case of forming a thin metal film, sputtering is performed in an atmosphere comprising only an Ar gas, but, in the case of using ceramics, the elimination of oxygen takes place at the time of film-forming deposition, as a result of which the oxygen concentration of the fabricated dielectric layer becomes less than that of the stoichiometric composition, and a large amount of lattice defects of oxygen are produced. In order to suppress the production of such lattice defects of oxygen, an $O_2$ gas is introduced into the atmosphere at the time of sputtering. As a matter of fact, only by the alteration of the sputtering atmosphere by the introduction of an $O_2$ gas, the formation of lattice defects of oxygen cannot be completely suppressed, and thus, in order to further reduce the lattice defects of oxygen, heat treatment is performed, after the sputtering, for a long time at a temperature higher than the substrate temperature at the time of sputtering (See, for example, Japanese Unexamined Patent Publication JP-A 9-31645 (1997)).

Further, a report is made on the method according to which, in order to suppress the deterioration in dielectric loss due to the lattice defects of oxygen, Mn or the like is added into the dielectric layer in addition to the heat treatment performed after the sputtering (See, for example, W. Chang, et al., Mat. Res. Soc. Symp. Proc. Vol. 541, (1999) 699) However, the method of suppressing the deterioration in dielectric loss due to the lattice defects of oxygen or the production itself of lattice defects of oxygen is problematic in that the method requires a heat treatment extending over a long time after the sputtering and thus poor in efficiency from the viewpoint of a method of fabricating variable capacitance capacitors with an enhanced productivity; and thus, variable capacitance capacitors cannot be fabricated with low costs.

In order to use the thin film capacitor as a capacitor in a high-frequency circuit as mentioned above, the self-resonant frequency must be positioned at the side higher than the frequency used, the inductance must be small, and further, the loss of the electrodes must also be low. This is because, even in case that the resonance point is positioned at the side higher than the frequency at which the capacitor is used, the impedance resulting from the capacitor becomes small at a frequency in the vicinity of the resonance point, so that, in a capacitor with a large loss, the resistance component becomes predominant.

Thus, in order to reduce the loss due to the electrodes (for example, the loss of the high-frequency signal component when the capacitor is used in a high-frequency circuit), a metal that has a small resistivity must be used as the material of the electrodes, and the electrodes must be made as thick as possible.

However, at the steps of manufacturing a thin film capacitor, the electrodes are formed by the thin film technique and the photolithography method, so that the manufacturing steps become complicated. Further, there is the problem that, in case the electrodes are made too thick, the electrodes peel off from the surfaces to which they are to adhere.

SUMMARY OF THE INVENTION

The present invention has been made in view of the problematic points mentioned above, and it is the object of the invention to provide a tunable thin film capacitor of such a structure that an external control voltage applied can be uniformly applied to the dielectric layer.

Another object of the invention is to provide a tunable thin film capacitor of such a structure that the manufacturing steps thereof are simplified, and yet, the upper electrode layer and the lower electrode layer are structurally hard to short-circuit to each other and suited to surface mount.

Still another object of the invention is to provide a tunable thin film capacitor constituted such that the dielectric layer does not peel off, and in addition, the resistance in the upper electrode layer of the capacitance can be easily lowered, and, even in the case a relatively high capacitance-controlling voltage is applied to the dielectric layer, the capacitor can withstand it.

Further another object of the invention is to provide a tunable thin film capacitor constituted such that, by appropriately altering the electrode structure and appropriately setting the thickness of the respective electrodes, the coverage of the dielectric layer and the coverage of the upper electrode are enhanced to prevent the short-circuiting or open-circuiting between the two electrodes, whereby a tunable thin film capacitor which allows the stable derivation of the capacitance component is provided, maintaining the productivity.

Further another object of the invention is to provide a tunable thin film capacitor constituted such that the electrode loss of the lower electrode layer and the upper electrode layer is small, and the area of the capacitance-producing region can be formed with a high accuracy.

Further another object of the invention is to provide a tunable thin film capacitor constituted such that the loss due to the electrodes is small even at a high frequency, so that the Q-value is large, and, during the manufacturing steps, the lower electrode layer is hard to peel off, and thus, the reliability is high.

Further another object of the invention is to provide a tunable thin film capacitor with a high self-resonant frequency.

Further another object of the invention is to provide a tunable thin film capacitor that has a protective film with a good adherence and thus is high in reliability.

Further another object of the invention is to provide a tunable thin film capacitor that comprises a dielectric layer with less lattice defects of oxygen.

Further another object of the invention is to provide a method of manufacturing a tunable thin film capacitor comprising a dielectric layer with less lattice defects of oxygen, which need not be heat-treated for a long time, can be formed in a short time and with low costs.

Further another object of the invention is to provide a tunable thin film capacitor constituted such that, even in case that the upper electrode is made thick in order to reduce the loss of the electrode, the electrode is hard to peel off.

The present invention relates to a tunable thin capacitor characterized by comprising a support substrate, a lower electrode layer provided on the support substrate, a thin film dielectric layer which is provided on the lower electrode layer and whose dielectric constant is changed by application of a control voltage, and an upper electrode layer provided on the thin film dielectric layer, wherein the thin film dielectric layer is held between the lower electrode layer and the upper electrode layer so as to form a plurality of capacitance-producing regions, and the respective capacitance-producing regions are electrically connected to each other.

The invention is further characterized in that the upper electrode layer on one of the mutually adjacent capacitance-producing regions is connected so as to be equipotential to the lower electrode layer of the other capacitance-producing region.

The invention is further characterized in that the plurality of capacitance-producing regions are an even number of capacitance-producing regions.

According to the invention, the tunable thin film capacitor is constituted such that the capacitance-producing region held between the upper electrode layer and the lower electrode layer is divided into a plurality of capacitance-producing regions, and the plurality of capacitance-producing regions thus divided are connected to each other.

More specifically, in case it is assumed that the thickness of the thin film dielectric layer is fixed, and the whole area of the capacitance-producing region necessary to produce a predetermined capacitance is fixed, this capacitance-producing region is divided into a plurality of capacitance-producing regions, and yet, they are joined with each other.

Accordingly, the area of each of the individual capacitance-producing regions is reduced, as a result of which the area of each of the individual mutually facing portions of the upper electrode layer and the lower electrode layer is also reduced. In other words, in case that a predetermined external control voltage is applied across the plurality of upper electrodes and lower electrodes, the voltage drop due to the conductor resistance can be suppressed in the plane portions of the electrodes effectively by an amount corresponding to the area reduction of the respective electrode layers.

The plurality of divided capacitance-producing regions can be electrically connected in parallel to each other, and thus, the lower electrodes of the mutually adjacent capacitance-producing regions can be made equipotential to each other, and the upper electrodes can be made equipotential to each other. Further, the plurality of divided capacitance-producing regions can be electrically connected in series to each other; and thus, the lower electrodes of the mutually adjacent capacitance-producing regions can be made different in potential from each other, and the upper electrodes can be made different in potential from each other.

Further, the planar shape of one of the upper and lower electrode layers, for example the planar shape of the lower electrode layer, is in a relationship of similitude to the planar shape of the capacitance-producing region. The area of the capacitance-producing region is determined depending on the mutually facing areas of the upper electrode layer and the lower electrode layer. This means that, for example, since the planar shape of the lower electrode layer is similar to the planar shape of the capacitance-producing region, there exists a portion, in the planar shape of the lower electrode layer, for which the upper electrode layer is not formed; and thus, the shape of the lower electrode layer is larger than that of the upper electrode layer. Accordingly, even in case that a positional offset is caused in the formation of both electrode layers, the positional divergence or offset is absorbed in case the positional offset is caused in the region in which the lower electrode layer and the thin film dielectric layer are formed; and thus, the capacitance characteristic is not varied. This structure is applied not only to the lower electrode layer side but also to the upper electrode side.

Further, in either case, the lower electrode layer is formed by deposition on the support substrate, the thin film dielectric layer is formed by deposition on the lower electrode layer and the support substrate, the upper electrode layer can be formed by deposition on the support substrate and the dielectric layer. Since the air bridge structure is not used unlike in the case of the known technique, the manufacturing steps can be performed by using substantially the thin film method. Further, the capacitor according to the invention structurally has no hollow structure portion in the structure thereof, so that the structural reliability can be enhanced, and the capacitor can be mounted on a mother board easily and infallibly by using the upper surface side of the support substrate as a mounting surface.

Further, the current due to the external control voltage dispersedly passes through the plurality of capacitance-producing regions, so that the parasitic inductance can be reduced. As a result, the self-resonant frequency defined as $fo=½\,(LC)^{1/2}$ can be enhanced, and the frequency region in which the capacitor operates as such can be shifted to the high-frequency side.

In the tunable thin film capacitor according to the invention, the capacitance-producing region in which a predetermined capacitance is formed is divided into a plurality of capacitance-producing regions, and in addition, the thus divided capacitance-producing regions are electrically connected to each other. In other words, when a predetermined potential is applied across the upper electrode layer and the lower electrode layer holding the thin film dielectric layer therebetween to control the dielectric constant of the thin film dielectric layer, the potential distribution of the applied external voltage in the respective divided capacitance-producing regions can be decreased, so that the range of change by control is wide; and thus, a variable capacitor is realized in which a stable capacitance is obtained.

Further, current can be made to flow through each of the plurality of capacitance-producing regions, so that the parasitic inductance can be reduced.

Further, the directions in which the currents flow through in the mutually adjacent capacitance-producing regions are made to be the same direction, so that the magnetic fluxes produced by the currents can cancel each other, and thus, the change in the electrostatic capacitance can be further reduced.

Further, the shape of one electrode layer is made larger than the shape of the capacitance-producing region (the shape of the mutually facing areas of one electrode layer and the other electrode layer), so that, even in case that a positional of set is caused when one or the other electrode layer is formed, the variation in the area of the capacitance-producing region can be reduced, and thus, a stable characteristic can be obtained.

Further, no hollow structure exists between the respective electrode layers and the terminal electrode layers, so that the capacitor can be easily and infallibly mounted onto the mother board by using the upper surface side of the support substrate as a mounting surface.

The invention is characterized in that the lower electrode layer includes a first thin film substratum conductor layer formed by deposition on the support substrate, and a first thin film superstratum conductor layer formed by deposition on the first thin film substratum conductor layer, the upper electrode layer includes a second thin film substratum conductor layer formed by deposition on the support substrate in a state separated from the first thin film substratum conductor layer, and a second thin film superstratum conductor layer formed by deposition on the second thin film substratum conductor layer so as to face the first thin film substratum conductor layer, the thin film dielectric layer is formed by deposition so as to extend over the first thin film substratum conductor layer and the second thin film substratum conductor layer, the first thin film superstratum conductor layer is formed by deposition so as to cover a portion of the thin film dielectric layer, and, by a portion of the first thin film substratum conductor layer and a portion of the second thin film superstratum conductor layer, the thin film dielectric layer is held therebetween to thereby constitute the capacitance-producing region.

In this way, one capacitance electrode, which is the lower electrode layer for example, of the capacitance electrodes that hold the thin film dielectric layer therebetween is comprised of the first thin film substratum conductor layer and the first thin film superstratum conductor layer. Further, the other capacitance electrode, which is the upper electrode layer for example, is comprised of the second thin film substratum conductor layer and the second thin film superstratum conductor layer. Further, the capacitance-producing region of the thin film dielectric layer is the facing region through which the first thin film substratum layer and the second thin film superstratum conductor layer face each other.

Further, in the invention, the first thin film substratum conductor layer and the second thin film substratum conductor layer should desirably be comprised of a material composed mainly of Au. Further, the first thin film superstratum conductor layer and the second thin film superstratum conductor layer should also desirably be comprised mainly of Au.

In the invention, the thickness $t1$ of the first thin film substratum conductor layer and the second thin film substratum conductor layer should desirably be larger than the thickness $t2$ of the first thin film superstratum conductor layer and the second thin film superstratum conductor layer.

According to the invention, the means for applying an external voltage to the thin film dielectric layer and, also, for deriving the capacitance component are a first capacitance electrode and a second capacitance electrode. Either one of these capacitance electrodes comprises a laminated structure of a thin film substratum conductor layer and a thin film superstratum conductor layer. Thus, since each capacitance electrode is of this laminated structure, it becomes easy to lower the resistance of the capacitance electrode itself. Further, since the thickness of the capacitance electrode is fixed and the thickness of the thin film substratum conductor layer can be made extremely small, the adherence between the thin film substratum conductor layer and the support substrate can be enhanced. Further, the adherence between the thin film substratum conductor layer and the thin film dielectric layer can be maintained, and in addition, the occurrence of a step coverage defect of the thin film dielectric layer at the ridgeline of the thin film substratum conductor layer can be prevented.

No air bridge is formed unlike in the case of the known thin film capacitor, and the short-circuiting between the two capacitance electrodes can be prevented. Further, since the capacitance electrodes are structured minutely, bump terminals, etc. can be easily formed, and further, in the case of mounting this element on a mother board, the mounting thereof can be easily performed.

Further, Au is used as the material of the thin film substratum conductor layer and the thin film superstratum conductor layer, so that the formation of an oxidation-preventing layer becomes unnecessary since Au is a non-oxidizing metal; and thus, the conductor loss of the capacitance electrodes can be further reduced. Moreover, since the thin film substratum conductor layer and the thin film superstratum conductor layer are made of the same metal material, the two conductor layers well adhere to each other when they are laminated.

According to the invention, the tunable thin film capacitor is constituted such that thin film dielectric layers are formed separated from each other so as to extend over the first thin film substratum conductor layer and the second thin film substratum conductor layer, and further, the first thin film superstratum conductor layer is disposed on the first thin film substratum conductor layer, while the second thin film superstratum conductor layer is disposed on the second thin film substratum conductor layer. In other words, the first capacitance electrode is formed of the first thin film substratum conductor layer and the first thin film superstratum conductor layer, and the second capacitance electrode is formed of the second thin film substratum conductor layer and the second thin film superstratum conductor layer.

Due to this structure, the adherence between the first thin film substratum conductor layer and the first thin film superstratum conductor layer and the adherence between the second thin film substratum conductor layer and the second thin film superstratum conductor layer are enhanced, and, even in case that the thickness of the first thin film superstratum conductor layer and the second thin film superstratum conductor layer is increased, the separation by peeling of the various conductor layers and thin film dielectric layers can be prevented. Further, by using Au as the respective materials of the first thin film substratum conductor layer, the second thin film substratum conductor layer, the first thin film super stratum conductor layer, and the second thin film superstratum conductor layer, the conductor loss of the capacitance electrodes can be reduced.

Further, since the resistance of the capacitance electrodes is lowered, the distribution of potential of the capacitance electrodes in the capacitance-producing region can be suppressed, and thus, a variable capacitance element that can withstand the application of an external voltage and is thus very high in practical utility can be realized.

The present invention is characterized in that a thickness of the thin film dielectric layer is 0.5 to 3.0 times as large as the thickness of the first and second thin film substratum conductor layers.

The invention is further characterized in that thicknesses of the first and second thin film superstratum conductor layers are 0.5 to 10 times as large as the thickness of the first and the second thin film substratum conductor layers.

According to the invention, one of the capacitance electrodes that hold the thin film dielectric film therebetween is comprised of a first thin film substratum conductor layer and a first thin film superstratum conductor layer, while the other capacitance electrode is comprised of a second thin film substratum conductor layer and a second thin film superstratum conductor layer.

According to the invention, one capacitance electrode can be comprised of a thin film substratum conductor layer and a thin film superstratum conductor layer, so that, even in case that the thickness of the thin film substratum conductor layer is made to be the same as the thickness of the known lower electrode layer, and the thickness of the thin film superstratum conductor layer is made to be the same as the thickness of the known upper electrode layer, the effective thickness of the capacitance electrode is increased, so that the loss of the capacitance electrode portion is reduced. Further, even in case that only the thickness of the thin film superstratum conductor layer is increased, the peeling of the layer is hard to take place since it closely adheres to the thin film substratum conductor layer.

On the other hand, the thinner the thin film substratum conductor layer is, the better the coverage of the thin film dielectric layer with respect to the thin film substratum conductor layer is; and, in the structure according to the invention, the thickness of the thin film substratum conductor layer can be positively reduced. Further, by setting the thickness of the thin film dielectric layer to a value that is 0.5 to 3.0 times as large as the thickness of the thin film substratum conductor layer, it is possible to obtain such a coverage that no step coverage defect exists in the stepped portion of the thin film dielectric layer disposed between the pair of thin film substratum conductor layers. In case that the thickness of the thin film dielectric layer is made less than 0.5 times as large as the thickness of the thin film substratum conductor layers, the thickness of the thin film dielectric layer becomes relatively small as compared with the thickness of the thin film substratum conductor layers, and thus, the coverage of the thin film dielectric layer lowers. Conversely, in case that the thickness of the thin film dielectric layer is made larger than 3.0 times as large as the thickness of the thin film substratum conductor layers, the problem pertaining to the coverage of the thin film dielectric layer is solved, but it takes a great deal of time to form the thin film dielectric layer, and thus, the productivity deteriorates.

Further, by setting the thickness of the thin film superstratum conductor layers to 0.5 to 10 times as large as the thickness of the thin film substratum conductor layers, the loss in the capacitance electrode portions can be reduced.

In case that the thickness of the thin film superstratum conductor layers is less than 0.5 times as large as the thickness of the thin film substratum conductor layers, the effect of reducing the loss of the capacitance electrodes is decreased, and at the same time, the thickness of the thin film superstratum conductor layers becomes relatively small, so that a step coverage defect takes place at the end of the portion covered by the thin film superstratum conductor layers and the thin film dielectric layer. In other words, the coverage of the thin film superstratum conductor layers lowers. Conversely, in case that the thickness of the thin film superstratum conductor layers exceeds a value that is ten times as large as the thickness of the thin film substratum conductor layers, the thickness of the thin film substratum conductor layers and the thin film superstratum conductor layers put together becomes too large, peeling becomes apt to take place in the interface therebetween. In connection with this, it is considered that, since a long deposition time is required for the formation of the thin film superstratum conductor layers, internal stresses such as the heat, etc. at the time of deposition are accumulated in the thin film superstratum conductor layers, and, due to these internal stresses, peeling is caused.

According to the invention, by setting the thickness of the thin film dielectric layer to a value that is 0.5 to 3.0 times as large as the thickness of the thin film substratum conductor layers, the coverage of the thin film dielectric layer is enhanced, the occurrence of a short-circuiting phenomenon between the first capacitance electrode and the second capacitance electrode can be prevented, and in addition, the productivity of the thin film dielectric layer can be maintained.

Further, by setting the thickness of the thin film superstratum conductor layers to a value that is 0.5 to 10 times as large as the thickness of the thin film substratum conductor layers, the effective thickness of the electrodes can be increased to reduce the loss in the capacitance electrode portion, and in addition, the occurrence of circuit-opening in the upper electrode layer can be prevented; and thus, the adherence of both electrodes can be maintained.

The present invention is characterized in that the lower electrode layer comprises a thin film substratum conductor layer formed by deposition on a support substrate and an upper conductor layer formed so as to project, in correspondence to the capacitance-producing region, from the thin film substratum conductor layer, and, around the upper conductor layer, an insulator layer is disposed so as to be substantially flush with at least the surface of the upper conductor layer.

According to the invention, the lower electrode layer comprises a thin film substratum conductor layer formed in a state closely adhering to the support substrate and an upper conductor layer which is formed in a state projecting, in correspondence to the capacitance-producing region, from the thin film substratum conductor layer and which is smaller in area than the thin film substratum conductor layer for example and closely adheres to a thin film dielectric layer to define the capacitance-producing region.

As a result, the thickness of the capacitance-producing region of the lower electrode layer can be increased, and the electrode loss can be reduced. Further, by the region of the upper conductor layer, the capacitance-producing region can be defined, so that, by the formation of the upper conductor layer, the control of the capacitance component becomes possible, and thus, the area of the capacitance-producing region can be accurately formed.

Further, by forming, around the upper conductor layer, an insulator layer that is substantially flush with the surface of the upper conductor layer, the occurrence of step coverage defects can be prevented in the case of forming the thin film dielectric layer on the upper conductor layer and in the case of forming the upper electrode layer on the thin film dielectric layer. In addition, the thickness of the upper electrode layer can be easily increased, and therefore, the electrode loss of the upper electrode layer can be effectively suppressed. Further, the thin film substratum conductor layer and the upper conductor layer of the lower electrode layer can also be formed integrally.

By composing the thin film dielectric layer by the use of $(Ba_xSr_{1-x})TiO_3$, it is also possible to realize a tunable thin film capacitor whose dielectric constant is changed by the application of an external voltage. In particular, a DC bias is applied across the lower electrode layer and the upper electrode layer, but, by increasing the electrode thickness in the portion of the capacitance-producing region, the non-uniformity of the bias is not caused, and thus, a stable control for the dielectric constant becomes possible.

Thus, according to the invention, as a thin film capacitor, a capacitor with a small capacitance for example can be easily fabricated, and, even in case that thick electrodes are used, the occurrence of steps which deteriorates the leakage characteristic of the dielectric portion and is caused during the manufacturing steps can be prevented; and further, depending on the area of the lower electrode that is contacted with the dielectric, the capacitance of the capacitor is substantially determined, so that the accuracy in positioning matching at the photolithography step is enhanced.

According to the invention, the tunable thin film capacitor is a thin film capacitor constituted such that, a lower electrode layer, a thin film dielectric layer, and an upper electrode layer are successively deposited on a support substrate, wherein the lower electrode layer is comprised of two layers, i.e., a thin film substratum conductor layer and an upper conductor layer, and further, by the upper conductor layer, the capacitance-producing region is defined. In addition, around the upper conductor layer, an insulator layer is formed so as to become substantially flush with the surface of the upper conductor layer.

As a result, there is obtained a thin film capacitor in which no step coverage defect exists in the thin film dielectric layer and the upper electrode layer, and the thickness of the upper electrode layer and the lower electrode layer in the capacitance-producing region can be increased as much as possible, so that the electrode loss can be effectively suppressed.

In particular, since the capacitance of the capacitor is almost determined depending on the area of the substratum conductor layer, a very high accuracy is not required in the positional matching at the photolithography step; and thus, a stable capacitance characteristic can be obtained without fail.

In particular, in the tunable thin film capacitor in which the dielectric constant of the thin film dielectric layer is changed by applying a DC bias across the lower electrode layer and the upper electrode layer, the potential dispersion can be suppressed within the electrodes.

The present invention is characterized in that the lower electrode layer includes an adherent layer formed by deposition on the support substrate, a thin film conductor layer formed in a state closely adhering to the adherent layer, and a buffer layer formed by deposition on the thin film conductor layer, wherein the thin film conductor layer is comprised substantially of gold.

The invention is further characterized in that the adherent layer and the buffer layer comprise at least one of platinum, palladium and rhodium.

Further, in the invention, the thickness of the buffer layer is desirably at least 30 nm but not more than 0.5 $\mu$m and 6% or higher with reference to the thickness of the thin film conductor layer.

Further, in the invention, the thickness of the adherent layer is at least 5 nm but not more than 0.5 μm and 12% or higher of the thickness of the buffer layer.

According to the invention, a tunable thin film capacitor is constituted such that a lower electrode layer, a thin film dielectric layer and an upper electrode layer are successively deposited on a support substrate, and the lower electrode layer is constituted such that an adherent layer comprised of at least one of platinum, palladium and rhodium, a thin film conductor layer comprised of gold that is a metal with a high conductivity, and a buffer layer comprised of at least one of platinum, palladium and rhodium are successively laminated on the support substrate.

The buffer layer possesses the effect of suppressing the change in properties and oxidation of the thin film conductor layer due to the high temperature during the manufacturing steps and, in addition, preventing the reaction of the thin film conductor layer to the thin film dielectric layer.

The thin film conductor layer enhances the conductivity of the whole lower electrode layer and increases the Q-value of the capacitor.

Further, the adherent layer enhances the adherence between the support substrate and the thin film conductor layer, cancels out the thermal stress produced by the buffer layer and prevents the occurrence of inconveniences such as the peeling of the substratum conductor layer and the thin film dielectric layer as well as the peeling of the lower electrode layer from the support substrate during the manufacturing steps.

As the material of the thin film conductor layer, gold is used from the viewpoint that gold well adheres to the materials constituting the buffer layer and adherent layer and, further, low in reactivity to the dielectric material.

Further, the thickness of the buffer layer is at least 30 nm but not more than 0.5 μm, and the buffer layer has a thickness that is 6% or more of the thickness of the thin film conductor layer. In case that the thickness of the buffer layer is less than 30 nm and, in addition, less than 6% with reference to the thickness of the thin film conductor layer, the change in properties and the oxidation of the thin film conductor layer and the reaction of the thin film conductor layer to the thin film dielectric layer can not be effectively prevented. Further, in case that the thickness of the buffer layer is more than 0.5 μm, the thickness of the buffer layer becomes relatively large, so that the internal stress at the time of forming the buffer layer by deposition tends to become large. As a result, the peeling of the electrode becomes noticeable. Further, since the buffer layer is made of a material having a conductivity lower than that of gold which is the material of the thin film conductor layer, the electrode loss of the lower electrode layer as a whole tends to increase.

In particular, in case that the thickness of the buffer layer is not 6% or higher of the thickness of the thin film conductor layer, the electrode surface is roughened due to the change in properties of the thin film conductor layer due to the high temperature during the manufacturing steps, as a result of which leakage current, short-circuit and the reaction of the buffer layer to the thin film dielectric layer are caused more.

Further, the thickness of the adherent layer is at least 5 nm but not more than 0.5 μm, and the adherent layer has a thickness that is 12% or more with reference to the thickness of the buffer layer. In case that the thickness of the adherent layer is less than 5 nm, the adherence of the adherent layer to the support substrate is deteriorated, and thus, inconveniences such as the peeling of the lower electrode layer, etc. are caused. Further, in case that the thickness of the adherent layer is more than 0.5 μm, the thickness of the adherent layer becomes relatively large, and thus, the internal stress at the time of forming the adherent layer by deposition tends to increase, as a result of which the peeling of the electrode becomes noticeable. Further, since the material of the adherent layer is low in conductivity as compared with that of gold that is the material of the thin film conductor layer, the electrode loss of the whole lower electrode layer tends to increase. In case that the thickness of the adherent layer is lower than 12% of the thickness of the buffer layer, the stress caused by the buffer layer cannot be cancelled out, and thus, inconveniences such as the electrode peeling of the lower electrode layer, etc. are caused.

According to the present invention, a tunable thin film capacitor is constituted such that a lower electrode layer, a thin film dielectric layer, and an upper electrode layer are successively deposited on a support substrate, and the lower electrode layer is constituted such that an adherent layer comprised of at least one of platinum, palladium and rhodium, a thin film conductor layer comprised of gold that is a metal with a high conductivity, and a buffer layer comprised of at least one of platinum, palladium and rhodium are successively deposited on the support substrate. Thus, there can be provided a thin film capacitor in which the loss in the lower electrode layer is small, particularly, even at a high frequency, and therefore, the Q-value is high, and the lower electrode layer is hard to peel off during the manufacturing steps; and thus, the reliability is high.

The present invention is characterized in that there is included a protective film covering approximately the whole surface of the support substrate on which the lower electrode layer, the thin film dielectric layer and the upper electrode layer are formed, and a region on the lower electrode layer and a region on the upper electrode layer are exposed from the protective film.

The invention is further characterized in that, on the lower electrode layer and on the upper electrode layer, an adherent layer is formed.

The invention is further characterized in that the adherent layer comprises platinum and/or palladium, and a thickness thereof is 0.1 to 1 μm.

The invention is further characterized in that the adherent layer is exposed from the protective layer, and, on the thus exposed adherent layer portions, external terminal electrodes are formed.

The invention is further characterized in that the outer peripheral portion of the protective layer adheres to the peripheral portion of the surface of the support substrate.

According to the invention, a tunable thin film capacitor comprises a lower electrode layer formed on a support substrate, a thin film dielectric layer formed on the lower electrode layer, an upper electrode layer comprised of a low-resistance conductor and formed on the thin film dielectric layer, an adherent layer comprised of Pt and/or Pd and formed on the upper electrode layer, solder bumps formed as external terminal electrodes on the adherent layer and a protective film.

The tunable thin film capacitor can be mounted on a mother board easily and infallibly through solder bumps by using the upper surface of the support substrate as a mounting surface, and the loss due to the unnecessary electrode length and the self-inductance as in the case of the air bridge structure can be reduced. Due to this, the self-resonant frequency is high, and the capacitor is operable even in a high-frequency region.

Further, as the material of the upper electrode layer, a low-resistance conductor such as, e.g., Au is used, so that the electrode loss can be further reduced.

Further, on this upper electrode layer, the adherent layer comprised of Pt and/or Pd is formed, so that the adherence of the protective film formed on the adherent layer is good, and, by the protective film, the occurrence of cracks and peeling can be prevented. Due to this, a tunable thin film capacitor with a high reliable can be realized. Accordingly, by the provision of this adherent layer, the reliability in moisture resistance of the protective film is enhanced, whereby the migration of a low-resistance conductor such as, e.g., Au or Ag can be suppressed. In connection with this, it is pointed out that, in the case of a tunable thin film capacitor, a predetermined DC voltage is applied across the upper electrode layer and the lower electrode layer to control the dielectric constant of the dielectric layer, and thus, migration is more ready to be caused as compared with an ordinary thin film capacitor. However, due to the provision of the adherent layer, particularly the occurrence of migration can be suppressed, and the insulation resistance can be well maintained.

The present invention is characterized in that the thin film dielectric layer comprises perovskite-type oxide crystal grains containing at least Ba, Sr and Ti, and the crystal grains are orientated in a plane (111).

The invention is further characterized in that, in the perovskite-type oxide constituting the thin film dielectric layer, x in $(Ba_xSr_{1-x})TiO_3$ is in a range of 0.4 to 0.6.

The invention is further characterized in that the thickness of the thin film dielectric layer is 1 $\mu$m or less, the dielectric crystal grains constituting the thin film dielectric layer are columnar grains that are long in the film thickness direction, and an average grain diameter in the film surface direction of the crystal grains is smaller than 0.5 $\mu$m.

The invention is further characterized in that the lower electrode layer contacted with the thin film dielectric layer comprises Pt, Au or a solid solution thereof that is orientated in the plane (111).

The invention is further characterized in that the thin film dielectric layer is composed of a lower thin film dielectric layer having a thickness that is ½ or less of the thickness of the thin film dielectric layer and an upper thin film dielectric layer being the remainder, wherein, after the lower thin film dielectric layer is formed by deposition, the lower thin film dielectric layer is orientated in the plane (111) by heat-treating.

The invention is based on the discovery of the fact that the lattice defects of oxygen resulting from the heat treatment performed after the sputtering of a BST thin film being a thin film dielectric layer can be suppressed in a short time in case that the thickness of the BST thin film is sufficiently small. Further, this thin layer in which the lattice defects of oxygen have been suppressed is used as a lower dielectric layer, and the crystal structure grows columnar in the film thickness direction. By so doing, a thin film dielectric layer can be obtained in which the lattice defects of oxygen are less and the dielectric loss has been suppressed as compared with the case that the thin film dielectric layer is deposited directly on the lower electrode layer. More specifically, on the support substrate on which the thin film dielectric layer is to be formed, the lower electrode layer comprised of Pt, Au or a solid solution thereof is formed by sputtering, whereby these metals that are of the face centered cubic lattice structure are orientated in the (111) plane. In this state, the lower dielectric layer of BST formed on this layer can also be orientated in the (111) plane.

According to the invention, the tunable thin film capacitor is constituted such that the thickness of the thin film dielectric layer is 1 $\mu$m or less, the thin film dielectric layer is comprised of perovskite-type oxide crystal grains containing at least Ba, Sr and Ti, and the crystal grains are orientated in the (111) plane. Further, the dielectric crystal grains constituting the thin film dielectric layer are columnar grains that are long in the film thickness direction, and the average grain diameter in the film surface direction of the crystal grains is smaller than 0.5 $\mu$m. Such a thin film dielectric layer is contacted with the lower electrode layer on the support substrate and is comprised of Pt, Au or a solid solution thereof orientated in the (111) plane.

Thus, a tunable thin film capacitor that comprises a thin film dielectric layer having a small number of lattice defects of oxygen can be provided, and in addition, the tunable thin film capacitor having a thin film dielectric layer having a small number of lattice defects of oxygen can be manufactured without the necessity of performing heat treatment extending over a long time and thus in a short time and at a low cost.

The capacitor according to the invention is a tunable thin film capacitor comprising a thin film dielectric layer with a very little loss due to very small number of lattice defects of oxygen provided to the whole of the thin film dielectric layer.

Further, a thin film dielectric layer with a small number of lattice defects of oxygen can be formed without the necessity of a heat treatment extending over a long time, that is, in a short time, at a low cost and easily.

The present invention is characterized in that the thin film dielectric layer comprises perovskite-type crystal grains containing at least Ba, Sr and Ti, and a composition thereof is represented as $(BaSr)Ti_xO_3$, wherein x in the composition is in a range of 0.7 to 0.9.

The invention is further characterized in that the perovskite-type oxide crystal grains constituting the thin film dielectric layer are orientated in a plane (110).

The invention is further characterized in that the thin film dielectric layer is formed on a lower electrode layer comprising Pt, Au or a solid solution thereof orientated in the plane (111) on the support substrate, by the sputtering process at a substrate temperature of 400° C. to 600° C.

According to the invention, in the thin film dielectric layer of the tunable thin film capacitor, the range of x in the perovskite-type oxide, $(BaSr)Ti_xO_3$ is 0.7 to 0.9. By setting the range of x to 0.7 to 0.9 and shifting to the side at which Ti is less, the composition of the thin film of BST is also shifted from the stoichiometric composition to the side at which Ti is less, whereby the lattice defects of oxygen in the thin film dielectric layer can be suppressed, and the increase in the dielectric loss due to the these lattice defects of oxygen can be suppressed. In case that the range of x is less than 0.7, the deviation from the specified composition range is too large to maintain the perovskite-type structure. Further, in case that the value of x exceeds 0.9, the effect due to the decrease of Ti is small, and the loss increases.

Further, the substratum electrode layer is formed by sputtering Pt, Au or a solid solution thereof, and these metals that are of the face centered cubic lattice structure are orientated in the (111) plane. Further, on the substratum electrode layer that is orientated in the (111) plane, a BST layer that is the thin film dielectric layer is formed by sputtering at a low temperature of 400° C. to 600° C., whereby the BST layer is orientated in the (110) plane.

In general, a thin film of BST that is formed at a low temperature contains a large amount of lattice defects of oxygen, so that it is a common practice to heat-treat the BST thin film in an oxygen atmosphere at a high temperature for a long time, but, according to the invention, the range of x in the composition of the target used for the sputtering is set to 0.7 to 0.9 in the stoichiometric composition, and the composition is deviated toward the side at which Ti is less, and the composition of the BST thin film is also deviated from the stoichiometric composition toward the side at which Ti is less, whereby the increase in the dielectric loss due to the lattice defects of oxygen is suppressed. Thus, a tunable thin film capacitor that comprises a thin film dielectric layer that has a small number of lattice defects of oxygen is realized; that is, a tunable thin film capacitor that comprises a thin film dielectric layer that exhibits a stable dielectric constant and a large rate of change of the dielectric constant with respect to the application of an external control voltage is realized.

Further, there can be realized a method of manufacturing a tunable thin film capacitor comprising a thin film dielectric layer that need not be heat-treated extending over a long time, that is, can be formed in a short time and at a low cost and yet has a small number of lattice defects of oxygen.

In the invention, the thickness of the thin film dielectric layer is 1 $\mu$m or less, the thin film dielectric layer is comprised of perovskite-type oxide crystal grains containing at least Ba, Sr and Ti, the composition of the crystal grains is represented as (BaSr) $Ti_xO_3$, the range of x in the composition is 0.7 to 0.9, the crystal grains are orientated in the (110) plane, the dielectric crystal grains constituting the dielectric layer are columnar grains that are long in the film thickness direction, and the average grain diameter in the film surface direction of the crystal grains is smaller than 0.5 $\mu$m.

According to the invention, the thin film dielectric layer is disposed on a lower electrode comprised of Pt, Au or a solid solution thereof orientated in the (111) plane and is comprised of perovskite-type oxide crystal grains containing at least Ba, Sr and Ti, wherein the range of x in the (BaSr) $Ti_xO_3$ is 0.7 to 0.9, and the crystal grains are orientated in the (110) plane. Accordingly, the deterioration in the dielectric loss due to the lattice defects of oxygen or the generation itself of the lattice defects of oxygen can be suppressed. Further, a heat treatment extending over a long time which was needed in the case of the known technique is not needed any more, and thus, a large quantity of tunable thin film capacitors can be fabricated with high efficiency and yet at low costs.

The invention is characterized in that the thin film dielectric layer comprises perovskite-type oxide crystal grains containing at least Ba, Sr and Ti, and the crystal grains are orientated at random.

The invention is further characterized in that x in the perovskite-type oxide, $(Ba_xSr_{1-x})TiO_3$, constituting the thin film dielectric layer is in a range of 0.4 to 0.6.

The invention is further characterized in that a thickness of the thin film dielectric layer is 1 $\mu$m or less, and the dielectric crystal grains constituting the thin film dielectric layer are equiaxial grains, and an average grain diameter of the crystal grains is 0.5 $\mu$m or less.

The invention is further characterized in that the thin film dielectric layer is constituted such that, on the lower electrode layer, an amorphous dielectric layer is deposited, and then the amorphous dielectric layer is crystallized by heat treatment to orientate the crystal grains at random.

The random orientation means a state in which, though the crystal grains exhibit some orientation in the crystal grain level, the crystal grains are not orientated in any specific plane as viewed from the whole thin film dielectric layer.

As a result of the examination ardently made by the present inventor, it was found that, by sputtering the dielectric layer at a low temperature of 200° C. or below, an amorphous dielectric layer can be formed, and, thereafter, by crystallizing the amorphous dielectric layer by heat treatment, oxygen can be supplemented in the amorphous state in which the oxygen is more apt to diffuse than in the crystal, so that the suppression of the lattice defects of oxygen is made possible by heat treatment for a short time, and thus, the loss is decreased.

According to the invention, the thickness of the thin film dielectric layer is 1 $\mu$m or less, the thin film dielectric layer is comprised of a perovskite-type oxide crystal particles containing at least Ba, Sr and Ti, and the crystal grains are orientated at random.

Further, according to the invention, the dielectric crystal grains constituting the thin film dielectric layer are equiaxial, and the average grain diameter in the film surface direction of the crystal grains is smaller than 0.5 $\mu$m. Further, according to the invention, on the support substrate on which the thin film dielectric layer is to be formed, a lower electrode layer is formed, and the lower electrode layer is comprised of Pt, Au or a solid solution thereof orientated in the (111) plane.

As a result, a tunable thin film capacitor comprising a thin film dielectric layer in which the lattice defects of oxygen are small in number and the dielectric loss is small can be realized; a tunable thin film capacitor constituted such that, by application of a control voltage from outside, a predetermined electrostatic capacitance can be obtained can be realized.

Further, a method of manufacturing a variable capacitor comprising the dielectric layer that does not require a heat treatment extending over a long time and has a small number of lattice defects of oxygen, can be realized in a short time and at a low cost.

According to the invention, the tunable thin film capacitor is constituted such that the dielectric layer is formed in such a manner that, on a lower electrode layer comprised of Pt, Au or a solid solution thereof and orientated in the (111) plane, an amorphous dielectric layer is formed by sputtering at a low temperature and then crystallized by a heat treatment for a short time, where by a dielectric layer that is not orientated in any specific plane orientation is formed. Accordingly, the deterioration of the dielectric loss due to the lattice defects of oxygen that has so far caused or the generation itself of the lattice defects of oxygen can be suppressed. In addition, a large quantity of variable capacitance capacitors can be fabricated efficiently and at low costs without the necessity of performing heat treatment extending over a long time.

The present invention is characterized in that the thin film dielectric layer comprises a dielectric layer with a high dielectric constant that is positioned at the lower electrode layer side and comprises perovskite-type oxide crystal grains containing at least Ba, Sr and Ti and a dielectric layer with a low dielectric constant that is positioned at the upper electrode layer side and comprises oxide grains containing Ba and/or Sr.

The invention is further characterized in that an interface of the thin film dielectric layer with a low dielectric constant with the upper electrode layer assumes a projected/depressed shape due to the crystal grain diameters of the oxide grains.

The invention is further characterized in that the thin film dielectric layer with a low dielectric constant is distributed in an island-like state or in a reticulate state on the thin film dielectric layer with a high dielectric constant.

According to the invention, the thin film dielectric layer is constituted such that a dielectric layer with a low dielectric constant comprised of oxide grains containing Ba and/or Sr is disposed at the side of the upper electrode layer. The surface of this dielectric layer with a low dielectric constant comprised of oxide grains containing Ba and/or Sr is made into an uneven or projected/depressed state due to the grain diameters of the oxide grains. Accordingly, the interface between the thin film dielectric layer and the upper electrode layer is made into an uneven or projected/depressed state, as a result of which the upper electrode layer adheres to the thin film dielectric layer so as to structurally bite wedge-wise in to the depressed portions of the uneven or projected/depressed surface of the thin film dielectric layer. Accordingly, the adherence between the thin film dielectric layer and the upper electrode layer is enhanced, as a result of which a thin film capacitor having a low loss in the upper electrode layer is realized. This structure is particularly suited for a tunable thin film capacitor constituted such that the thin film dielectric layer is comprised of perovskite-type oxide crystal grains containing Ba, Sr and Ti, and, by applying an external voltage across the lower electrode layer and the upper electrode layer, the dielectric constant of the thin film dielectric layer is changed, because the concentration of the voltage at the electrode portions can be alleviated.

According to the invention, the thin film dielectric layer is constituted such that the dielectric layer at the side of the lower electrode layer is comprised of a dielectric with a high dielectric constant, and the dielectric layer at the side of the upper electrode layer is comprised of a dielectric with a low dielectric constant. More specifically, the dielectric layer with a high dielectric constant is comprised of perovskite-type oxide crystal grains containing at least Ba, Sr and Ti, and the dielectric layer with a low dielectric constant is comprised of oxide grains containing at least Ba and Sr.

Particularly, the surface of the dielectric layer with a low dielectric constant is uneven or projected and depressed due to the crystal grain diameters of the oxide grains containing Ba and Sr. As a result, the upper electrode layer formed on the thin film dielectric layer closely adheres to the thin film dielectric layer so as to tightly engage with each other. Accordingly, the upper electrode layer is hard to peel off, and further, even in case that the thickness of the upper electrode layer is increased, the upper electrode layer is still hard to peel off, as a result of which the electrode loss can be reduced.

The invention is directed to a high frequency device which is characterized by having the above-described tunable thin film capacitor.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
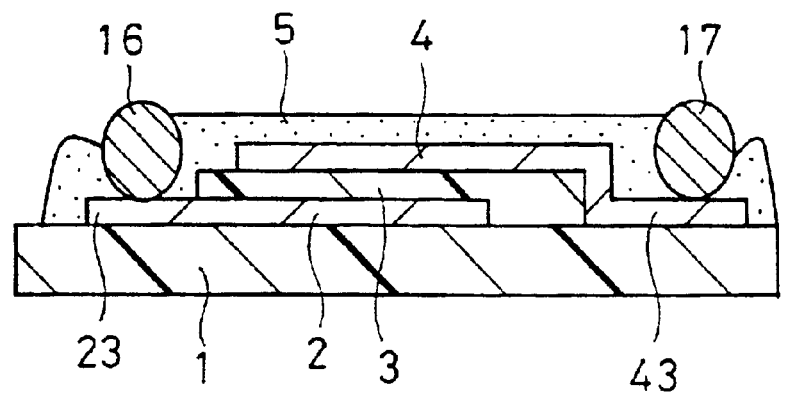
FIG. 1 is a sectional view of the tunable thin film capacitor of the first embodiment according to the present invention.

Now referring to the drawings, preferred embodiments of the invention are described below.

Figure 2:
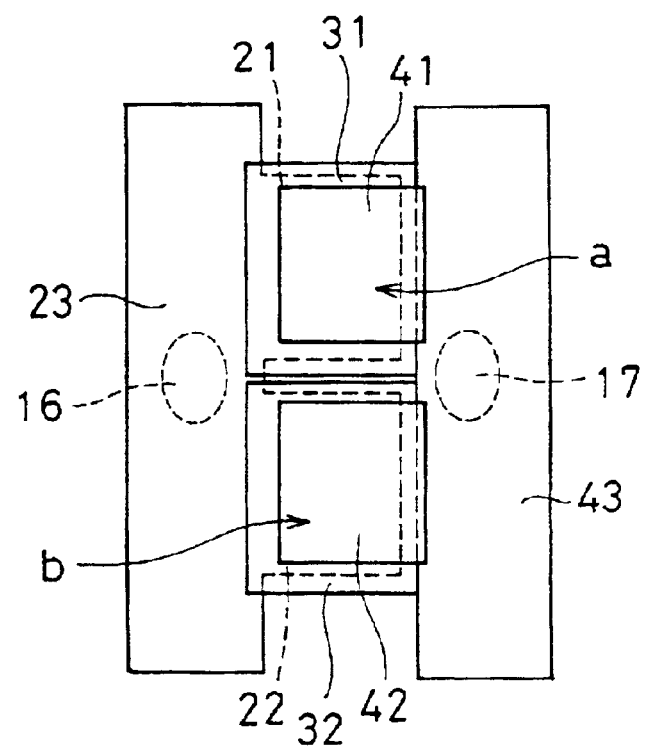
FIG. 2 is a plan view of the essential portion of the tunable thin film capacitor of the first embodiment according to the invention.
Figure 3A:
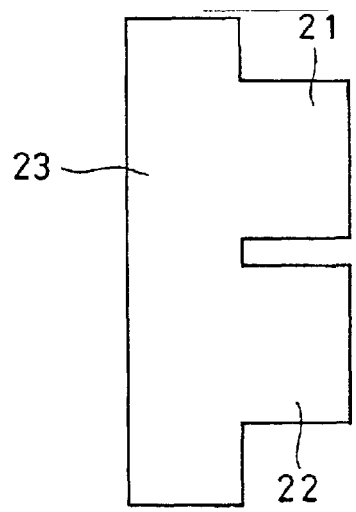
FIGS. 3A to 3C are plan views showing the simplified structure of the tunable thin film capacitor shown in FIG. 2.
Figure 3B:
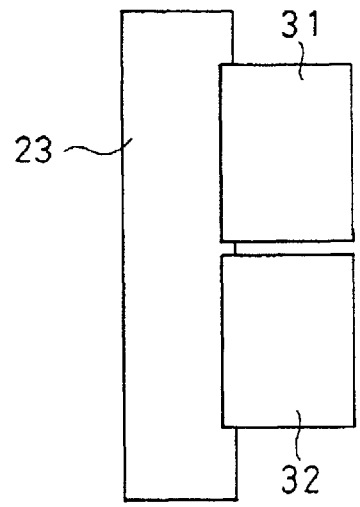
Figure 3C:
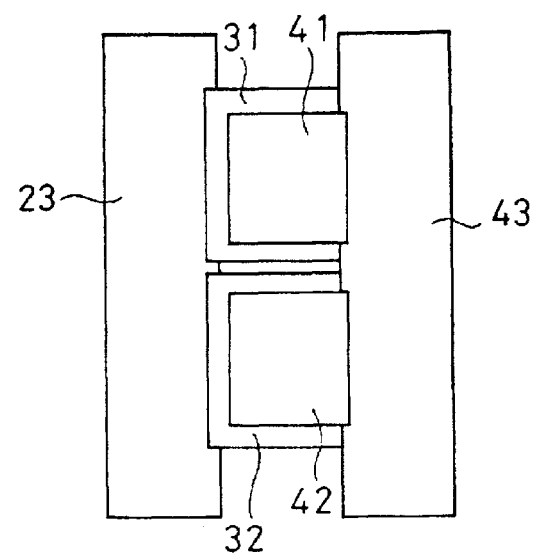
Figure 4:
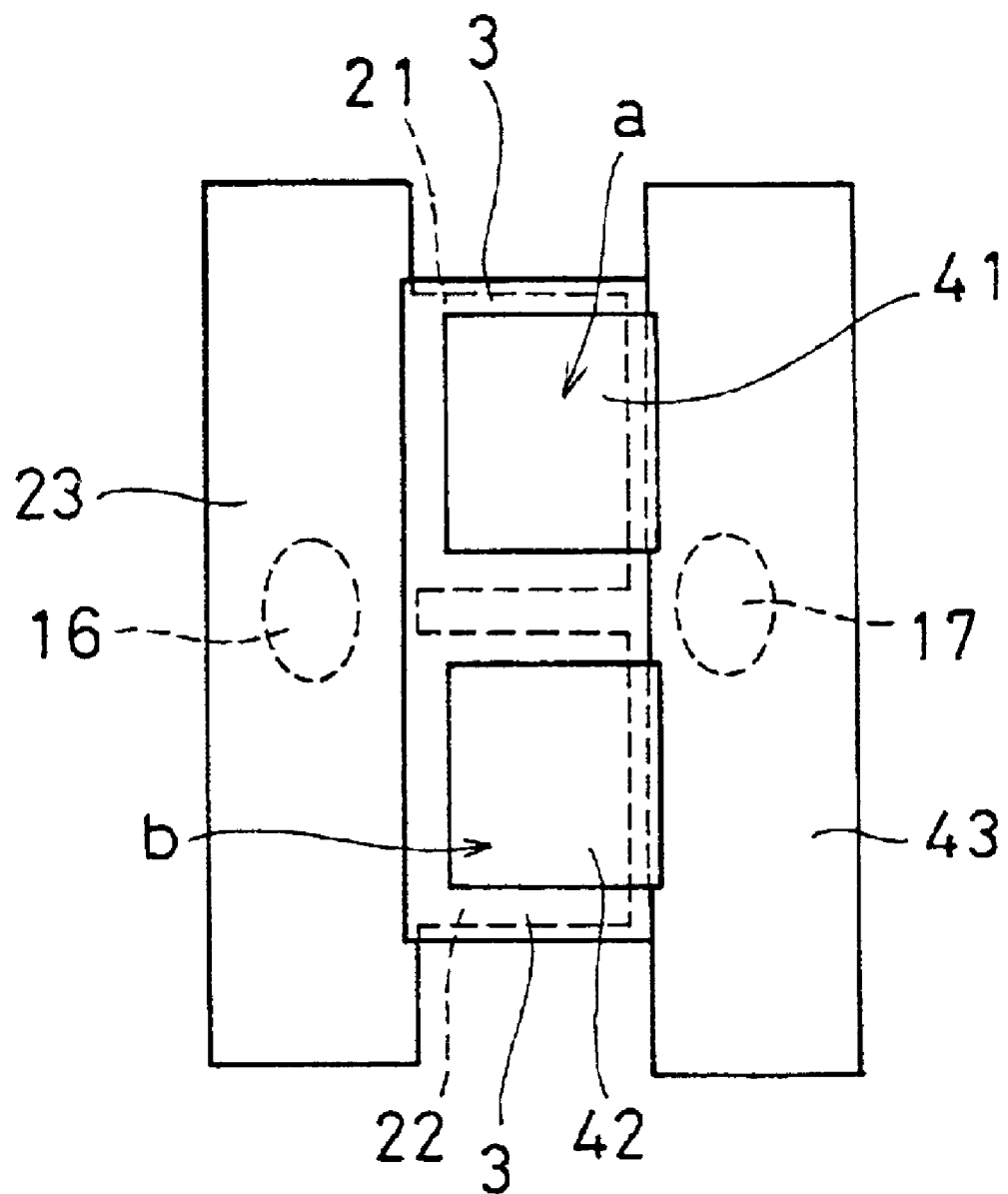
FIG. 4 is a plan view of the essential portion of the tunable thin film capacitor of the second embodiment according to the invention.
Figure 5A:
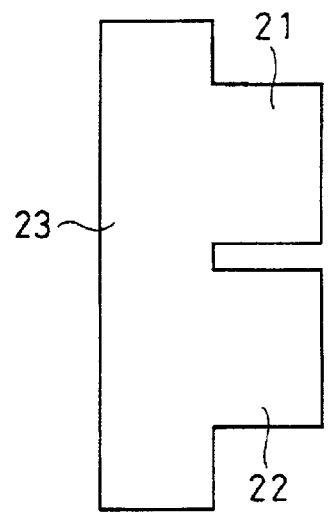
FIGS. 5A to 5C are plan views showing the simplified structure of the tunable thin film capacitor shown in FIG. 4.
Figure 5B:
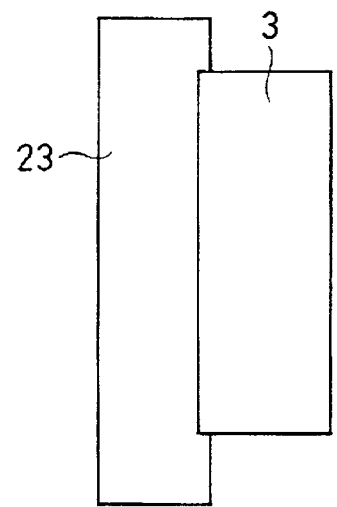
Figure 5C:
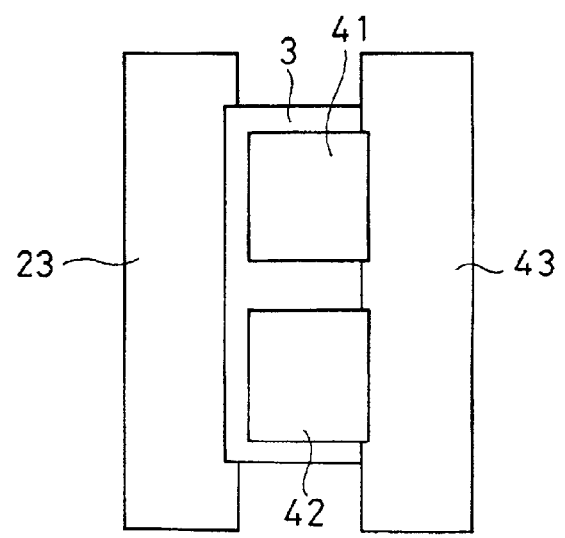

FIG. 1 is a sectional view of the tunable thin film capacitor of the first embodiment according to the present invention; FIG. 2 is a plan view of the essential portion of the tunable thin film capacitor of the first embodiment; FIGS. 3A to 3C are plan views showing the simplified structure of the tunable thin film capacitor shown in FIG. 2; FIG. 4 is a plan view of the essential portion of the tunable thin film capacitor of the second embodiment according to the invention; and FIGS. 5A to 5C are plan views showing the simplified structure of the tunable thin film capacitor shown in FIG. 3.

Referring to the drawings, the reference numeral 1 denotes a support substrate, numerals 21 and 22 denote lower electrode layers (In FIG. 1, the whole lower electrode layer is collectively referenced by the numeral 2), numeral 23 denotes a lower terminal electrode layer, numerals 31 and 32 denote thin film dielectric layers (In FIG. 1, the whole dielectric layer is collectively referenced by the numeral 3), numerals 41 and 42 denote upper electrode layers (In FIG. 1, the whole upper electrode layer is collectively referenced by the numeral 4), numeral 43 denotes an upper terminal electrode layer, numeral 5 denotes a protective layer, and numerals 16 and 17 denote external terminals.

Further, the capacitance-producing regions refer to a facing portion of the dielectric layer 31 that is sandwiched between the lower electrode layer 21 and the upper electrode layer 41 and to a facing portion of the dielectric layer 32 that is sandwiched between the lower electrode layer 22 and the upper electrode layer 42. In the drawing, two capacitance-producing regions a and b are provided.

The support substrate 1 may be composed of any material as long as the material has insulation properties, but particularly suited is $Al_2O_3$, sapphire, glass, MgO and $LaAlO_3$.

On this support substrate 1, there are formed the lower electrode layers 21, 22 and a lower terminal electrode layer 23 that commonly connects these lower electrode layers electrically. The lower electrode layers 21, 22 and the lower terminal electrode layer 23 form a comb-tooth-like shape as a whole (refer to FIGS. 3A and 5A). As the conductor material for the lower electrode layers 21, 22 and the lower terminal electrode layer 23, Au or Cu is suitable, but Al, Ag and the like can also be used. The thickness thereof is 0.1 to 5 $\mu$m. For example, in the case that the thickness is smaller than 0.1 $\mu$m, the resistance of the electrodes themselves increases, and at the same time, the continuity of the electrodes is lost, and thus, the reliability becomes inferior. On the other hand, in the case that the thickness is made larger than 5 $\mu$m, step coverage defects (This means that, in the crossing portions (ridgeline portions) in which the electrode layers cross thin film dielectric layers 31, 32 to be described later, the thin film dielectric layers 31, 32 are exposed) are caused, so that the upper electrode layer 4 and the lower electrode 2 are short-circuited to each other)

The thin film dielectric layers 31, 32 are fabricated by a thin film technology such as sputtering. The thin film technology includes not only the sputtering process but also the vacuum evaporation process, and the spin coating process using a sol-gel liquid.

As the material of the thin film dielectric layer 3, a material that has a high dielectric constant is preferable, and in addition, a dielectric material such as, e.g., $BaTiO_3$, $SrTiO_3$, (Ba Sr) $TiO_3$, etc. whose dielectric constant can be changed by a voltage applied from outside can be pointed out.

The thin film dielectric layers 31, 32 are formed, for example, as shown in FIG. 3B, in such a manner as to cover the surfaces of the lower electrode layers 21, 22. For example, as shown in FIG. 2, the dielectric layers 31, 32 may be formed exclusively in the respective capacitance-producing regions a,b, or, as in the tunable thin film capacitor shown in FIGS. 4 and 5B, the dielectric layer 3 may be formed continuously in the vertical direction in the drawing, that is, formed so as to extend across the lower electrode layers 21, 22, so as for the dielectric layer 3 to be common for the plurality of capacitance-producing regions a,b. On the support substrate 1 is formed the upper terminal electrode layer 43. On the thin film dielectric layer 3 are formed the upper electrode layers 41, 42 opposite to the lower electrode layers 21, 22. The upper electrode layers 41, 42 are electrically connected to the upper terminal electrode layer 43 commonly. The upper electrode layers 41, 42 and the upper terminal electrode layer 43 form a comb-tooth-like shape as a whole (refer to FIGS. 3C and 5C).

The upper electrodes 41, 42 and the upper terminal electrode layer 43 are formed by the use of Au or Cu as the conductor material thereof. Besides, Al, Ag, etc. can also be used. The thickness of the respective layers is set to 0.1 to 5 $\mu$m. The lower limit of the thickness is set by taking the resistance of the electrodes themselves into consideration as in the case of the lower electrode layer 2. Further, the upper limit of the thickness is set so as to prevent the occurrence of peeling due to the concentration of adhesion stress between the upper electrode layer 4 and the member existing there below when the upper electrode layer 4 is formed.

Further, the protective film 5 is formed so as to expose portions of the lower terminal electrode layer 23 and the upper terminal electrode layer 43. As the material of the protective film 5, $SiO_2$, SiN, BCB (benzocyclobutene), polyimide, etc. are suitable. This protective film 5 has the role of protecting the capacitor from mechanical shocks applied from outside and also the role of preventing the deterioration due to moisture, the contamination of chemicals, oxidation, etc. Moreover, the outer peripheral portion of the protective film 5 is kept in intimate contact with the peripheral portion of the support substrate 1. Thus, the protective film 5 is hard to peel off from the support substrate 1.

Further, as the external terminals 16, 17, solder balls, metal bumps, etc. can be pointed out by way of example. More specifically, in the portions in which the lower terminal electrode layer 23 and the upper terminal electrode layer 43 are exposed, solder balls for example may be formed, or metal wires are first-bonded and cut to a predetermined length, whereby bumps of gold or the like may be formed.

Further, in order to form solder balls as the external terminals 16, 17, thin films of Ni or Cr may be formed for preventing the occurrence of solder leaching in the exposed portions of the lower terminal electrode layer 23 and the upper terminal electro delayer 43. Further, in the case that it is a prerequisite that soldering is performed only at the time of mounting, thin films of Ni or Cr that prevent the solder leading may be used as the external terminals.

Referring to FIG. 2, the tunable thin film capacitor according to the invention is comprised of the two capacitance-producing regions a, b. More specifically, the capacitance-producing region a is comprised of the portion in which the lower electrode 21, the thin film dielectric layer 31, and the upper electrode layer 41 are successively laminated, while the capacitance-producing region b is comprised of the portion in which the lower electrode 22, the thin film dielectric layer 32 and the upper electrode layer 42 are successively laminated. The capacitance-producing region a and the capacitance-producing region b are connected to each other in parallel. In other words, the lower terminal electrode layer 23 extending from the lower electrode layer 21, 22 is used in common for each other. Further, the upper terminal electrode layer 43 extending from the upper electrode layers 41, 42 is used in common for each other. Therefore, at the external terminals 16, 17, a composite capacitance comprising the paralleled capacitances of the two capacitance-producing regions a, b can be obtained from the terminal electrodes.

According to the invention, the dielectric constants of the thin film dielectric layers 31, 32 can be variably controlled by applying an external control voltage of a predetermined potential to the dielectric material of the thin film dielectric layers 31, 32. More specifically, by the external control voltage fed to the external terminals 16, 17, the dielectric constants of the thin film dielectric layers 31, 32 in the capacitance-producing regions a, b are changed. At this time, to the two capacitance-producing regions a, b, a uniform potential with a small potential distribution due to the external control voltage is applied. A noteworthy thing here is that, in obtaining a predetermined capacitance, the area of the capacitance-producing region is important. In the tunable thin film capacitor according to the invention, the capacitance-producing region is divided into two portions, and the area of each of the respective regions becomes small. In other words, in the invention, when the external control voltage is applied, variation in the distribution of the potential applied to the capacitance-producing regions a, b becomes small in the capacitance-producing regions. In contrast, in the case of the upper electrode layer 164 as according to the known technique, a relatively high potential is applied in the vicinity portion direct-coupled to the extension portion 164a of the upper electrode layer 164, but, in portions away from the extension portion 164a, a voltage drop is caused in the vicinity of the center portion of the upper electrode layer 164 due to the conductor resistance of the upper electrode layer 164, and thus, the applied potential lowers. In contrast, in the case of the invention, the capacitance-producing region in which a predetermined capacitance is obtained is divided, and the thus divided respective single capacitance-producing regions a, b are each ½ in area with reference to the capacitance-producing region before division. As a result, the voltage drops caused in the upper electrode layers 41, 42 can be reduced, and the external control voltage of a stabilized uniform potential can be applied to the thin film dielectric layers 31, 32. Thus, in the tunable thin film capacitor, the external voltage can be uniformly applied to the thin film dielectric layers 31, 32, so that a capacitance value that is very stable and exactly according to the design can be obtained, and in addition, the capacitance can be variably controlled as designed.

Embodiment 1

The tunable thin film capacitor shown in FIG. 2 was fabricated. On sapphire used as the support substrate 1, a substratum Ti layer and an upper-laid Au layer were formed as the lower electrode layers 21, 22 by the sputtering process. The substratum Ti layer is for enhancing the adherence between the support substrate 1 and the upper-laid Au layer, and, as for the thickness, the thickness of Ti was set to 0.05 μm, and the thickness of Au was set to 1 μm. This substratum electrode layer was processed by the photolithography technology to form the lower electrode layers 21, 22 and the lower terminal electrode layer 23 shown in FIG. 2. More specifically, a resist was applied to a predetermined shape and patterned by wet etching.

Subsequently, for the formation of the thin film dielectric layers 31, 32, (Ba, Sr) TiO$_3$ was deposited to a thickness of 1 μm by the sputtering process, and, by the photolithography and wet etching processes, the thin film dielectric layers 31, 32 were patterned.

Subsequently, for the formation of the upper electrode layers 41, 42 and the upper terminal electrode layer 43, Au was deposited to a thickness of 1 μm by the sputtering process and patterned in the same manner as in the case of the lower electrode layers 21, 22 and the lower terminal electrode layer 23.

Further, there is a positional offset of 2 μm at the maximum in the case of the photolithography employed in this embodiment, so that the lower electrode layers 21, 22 were made in larger shapes in such a manner that margins of 5 μm were provided both in the X-direction and Y-direction of the capacitance-producing regions a,b.

Finally, the protective film 5 comprised of BCB or the like was formed so as to expose portions of the lower terminal electrode layer 23 and the upper terminal electrode layer 43. More specifically, BCB was applied by the spin coating process and etched by performing an exposure processing to pattern the electrode layers.

The facing areas, with respect to both electrode layers 21 (22) and 41 (42), of the capacitance-producing regions a, b thus fabricated were set to 0.02 mm in the X-direction and 0.01 mm in the Y-direction. As a result of evaluating the electrical characteristics of the tunable thin film capacitor, it was found that the electrostatic capacitance was 2 pF, and the self-resonance frequency was 5 GHz. From these, the parasitic inductance was evaluated on the basis of the equation, fo=½(LC)$^{1/2}$; the parasitic inductance was 0.5 nH. Thus, it has been found that the parasitic inductance was about ½ as compared with a known tunable thin film capacitor having the same area and comprising a single capacitance-producing region.

Further, in order to control the dielectric constant of the thin film dielectric layer 3 or 163 of the tunable thin film capacitor according to the invention and the known tunable thin film capacitor, an external control voltage of 10 V was applied across the external terminals 16, 17 (across the extension portion 52a of the lower electrode layer and the extension portion 54a of the upper electrode layer).

As a result, in the case of the known tunable thin film capacitor, the dielectric constant of the thin film dielectric layer 163 was reduced by 16% as compared with the state in which no-voltage was applied. On the other hand, in the case of the tunable thin film capacitor according to the invention, the dielectric constant of the thin film dielectric layer 3 could be reduced by so much as 26% as compared with the state in which no-voltage was applied. This is because the external control voltage was uniformly applied to the whole of the thin film dielectric layer 3, and thus, the variation distribution of the dielectric constant was small.

Figure 6:
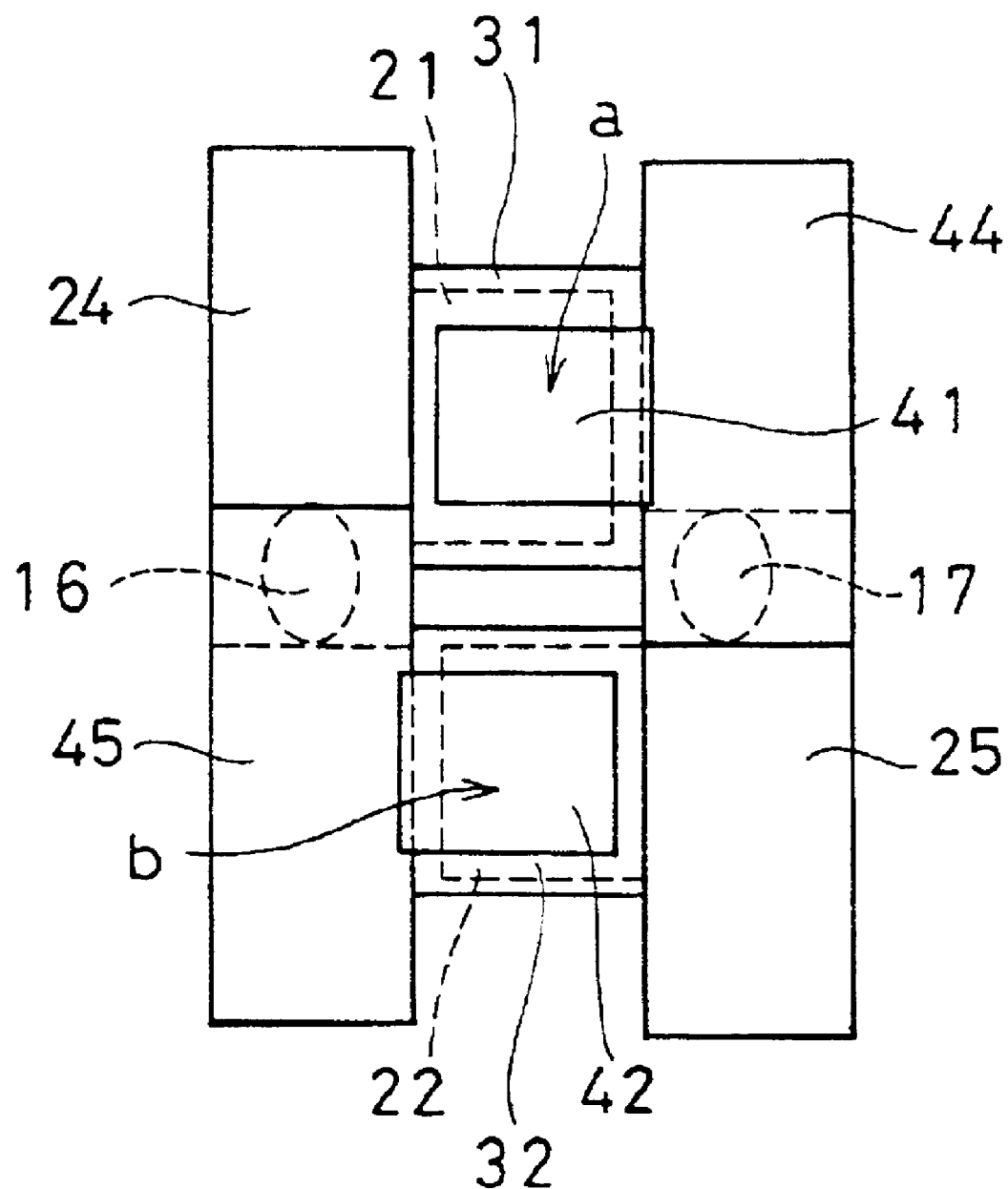
FIG. 6 is a plan view of the essential portion of the tunable thin film capacitor of the third embodiment according to the invention.
Figure 7A:
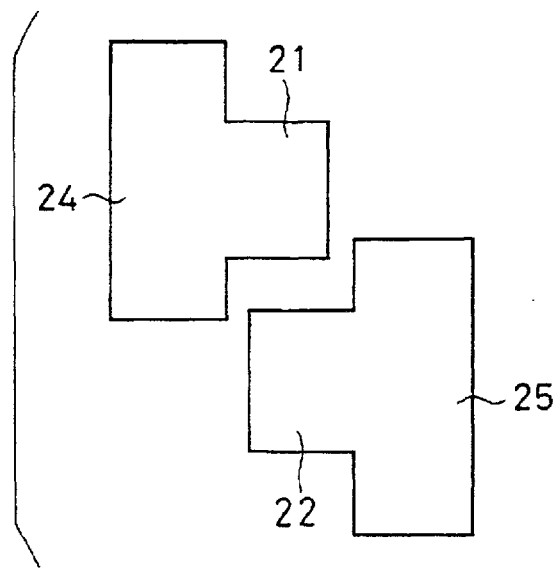
FIGS. 7A to 7C are plan views showing the simplified structure of the tunable thin film capacitor shown in FIG. 6.
Figure 7B:
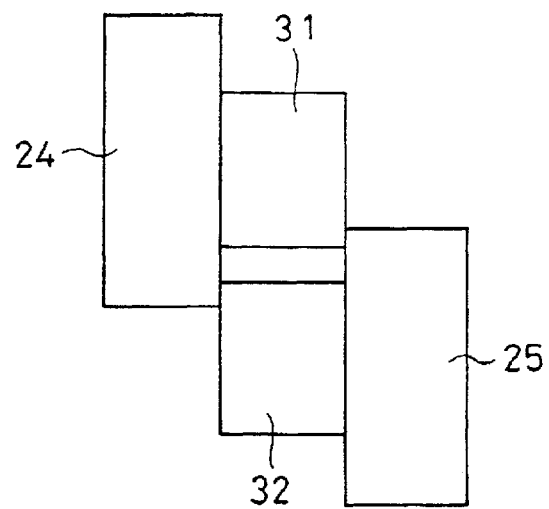
Figure 7C:
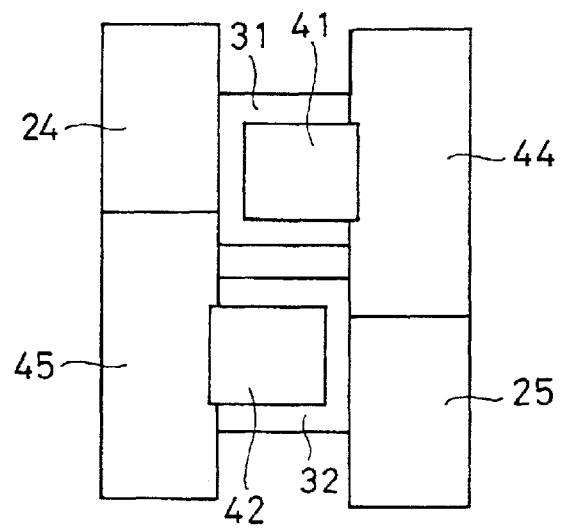

FIG. 6 is a plan view of the essential portion of the tunable thin film capacitor of the third embodiment according to the invention. FIGS. 7A to 7C are plan views showing the simplified structure of the tunable thin film capacitor shown in FIG. 6. In the tunable thin film capacitor of this embodiment, the polarities of the two capacitance-producing regions a, b are set in a reverse potential relationship.

In the case of this structure, the lower electrode layer 21 of the first capacitance-producing region a is electrically connected to the upper electrode layer 42 of the second capacitance-producing region b. More specifically, an extension portion 24 extended from the lower electrode layer 21 and an extension portion 45 extended from the upper electrode layer 42 are electrically connected to each other integrally. Similarly, the lower electrode layer 22 of the second capacitance-producing region a is electrically connected to the upper electrode layer 41 of the second capacitance-producing region b. More specifically, an extension portion 25 extended from the lower electrode layer 22 and an extension portion 44 extended from the upper electrode layer 41 are electrically connected to each other integrally.

The method of manufacturing this capacitor is as follows: As shown in FIG. 7A, on the support substrate 1, the lower electrode layer 21 and the extension portion 24 extended from this lower electrode layer 21, the lower electrode layer 22 and the extension portion 25 extended from this lower electrode layer 22 are formed zigzag (in an oblique direction, i.e. diagonally, in FIG. 6, due to the two capacitance-producing regions). Next, as shown in FIG. 7B, the dielectric layers 31, 32 are formed on the lower electrode layers 21, 22. Subsequently, the upper electrode layer 41, the extension portion 44 extended from this upper electrode layer 41, the upper electrode layer 42, and the extension portion 45 extended from this upper electrode layer 42 are formed zigzag. That is, as shown in FIG. 7C, on the thin film dielectric layers 31, 32 are formed the upper electrode layers 41, 42 opposite to the lower electrode layers 21, 22; on the lower extension portion 24 is formed the upper extension portion 45 so as to be partly superposed thereon; and on the lower extension portion 25 is formed the upper extension portion 44 so as to be partly superposed thereon.

In such a structure, the upper side extension portions 45, 46 are formed in a state superposed on portions of the lower side extension portions 24, 25. More specifically, the lower side extension portion 24 and the upper side extension portion 45 are integrated to become a terminal electrode layer at one side, and the lower side extension portion 25 and the upper side extension portion 44 are integrated to become a terminal electrode layer at the other side. Further, in the case of forming the external terminals 16, 17 in these superposed connection portions, the thermal shock caused when the capacitor is mounted on the mother board can be alleviated, and the adherence between the respective terminal electrode layers and the support substrate 1 can be enhanced.

In the case of the structure shown in FIG. 6 and FIGS. 7A to 7C, current paths for the current flowing to the thin film dielectric layers 31, 32, that is, the capacitance-producing regions a, b, are formed when an external control voltage is applied across one terminal electrode layer and the other terminal electrode layer. This current uniformly flows into the capacitance-producing regions a, b.

Further, one current path runs in the same direction (for example, from the right side to the left side in the paper surface) in the capacitance-producing regions a, b, so that the magnetic fluxes produced by the current paths cancel each other in the portion between the regions, and thus, the magnetic fluxes are substantially reduced. Due to this, the inductance L (L=Φ/I) defined by the magnetic flux quantity Φ produced by the unit current I can be reduced due to the fall of the magnetic fluxes.

Even in such a structure, the thin film dielectric layers 31, 32 may be formed continuously, ranging over a plurality of capacitance-producing regions as shown in FIG. 4 and FIG. 5A to 5C.

In the case of FIG. 6 and FIG. 7A to 7C, the capacitance-producing regions a, bare comprised of two regions, but these regions may be set on the support substrate 1 by forming them in the form of an even number of regions such as two regions, four regions, six regions or the like so as to mutually cancel out the magnetic fluxes in the adjacent capacitance-producing regions.

Moreover, according to the invention, the terminal electrode layers (extension portions) 23, 24 and 25 of the lower electrode layers 21, 22 and the terminal electrode layers (extension portions) 43, 44 and 45 of the upper electrode layers 41, 42 are formed on the support substrate 1. Further, on these terminal electrode layers, the external terminals 16, 17 are formed, and therefore, it becomes easy to mount the upper surface side of the support substrate 1 on them other board. In addition, a hollow portion like the air bridge in the known capacitor is not provided in the structure, and therefore, the capacitor according to the invention is very stable and can be mounted with high reliability.

Figure 8:
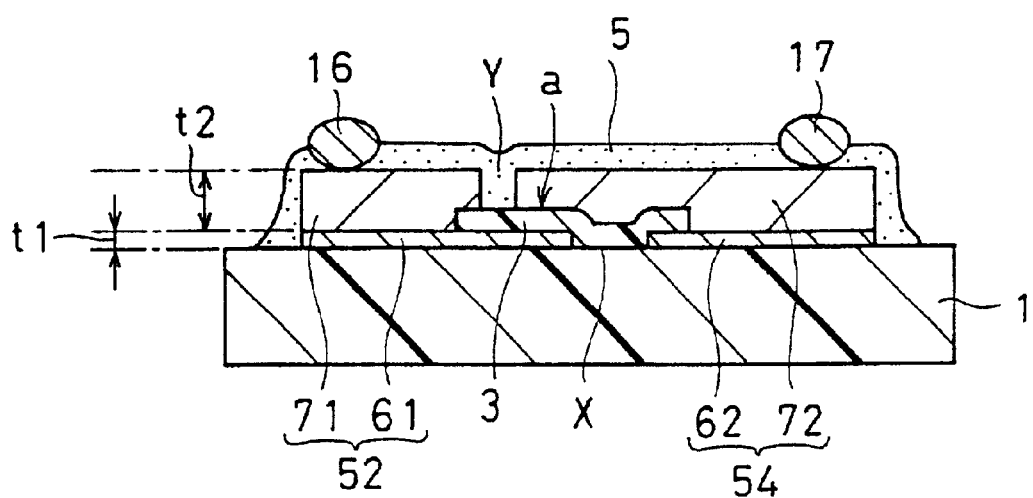
FIG. 8 is a schematic sectional view of the tunable thin film capacitor of the fourth embodiment according to the invention.

FIG. 8 is a sectional view showing the sectional structure of the tunable thin film capacitor of the fourth embodiment according to the invention. In this embodiment, the components that play the same or corresponding roles as in the above-described embodiment will be identified with the same reference symbols, and in some cases overlapping descriptions will be omitted. In the tunable thin film capacitor according to the invention, a first thin film substratum conductor layer 61 and a second thin film substratum conductor layer 62 are formed by deposition in a state separated from each other on a support substrate 1. This separating portion is referenced by a symbol x.

A thin film dielectric layer 3 whose dielectric constant is changed by the application of an external voltage is formed by deposition so as to extend over the first thin film substratum conductor layer 61 and the second thin film substratum conductor layer 62. Further, on the first thin film substratum conductor layer 61, a first thin film superstratum conductor layer 71 is formed by deposition, and at the same time, a second thin film superstratum conductor layer 72 is formed by deposition on a portion (indicated by a symbol a) of the thin film dielectric layer 3 disposed on the first thin film substratum conductor layer 61 and the second thin film substratum conductor layer 62.

In this way, a first capacitance electrode 52 acting as the lower electrode layer is constituted of the first thin film substratum conductor layer 61 and the first thin film superstratum conductor layer 71. Further, a second capacitance electrode 54 acting as the upper electrode layer is constituted of the second thin film substratum conductor layer 22 and the second thin film superstratum conductor layer 72. The capacitance-producing region of the thin film dielectric layer 3 is the region, i.e., a region a, through which the first thin film substratum conductor layer 61 and the second thin film superstratum conductor layer 72 face each other. Moreover, in this embodiment, as in the case of the above-described embodiment, the capacitance-producing region is plurally provided and they are electrically connected to one another.

As the support substrate 1, there can be used a ceramic substrate made of, e.g., alumina, a glass substrate, an insulating substrate such as, e.g., a resin substrate, a semiconductor substrate made of, e.g., silicon or germanium, a compound semiconductor substrate made of, e.g., GaAs or In GaAs, or the like, whose dielectric loss in a high-frequency operation is small. In particular, a ceramic substrate is preferable in respect of strength, heat resistance, cost, etc.

The first thin film substratum conductor layer 61 that constitutes the first capacitance electrode 52 and the second thin film substratum conductor layer 62 that constitutes the second capacitance electrode 54 may be comprised of any thin film conductor layers that only can withstand the film-forming deposition temperature when the thin film dielectric layer 3 is deposited. More specifically, the material of the first thin film substratum conductor layer 61 and the second thin film substratum conductor layer 62 is desirably Au in view of making the conductor loss in the electrode portion extremely small when the variable capacitance element is operated in a high-frequency region. For example, Au as an electrode material is a non-oxidizing metal, so that it is not necessary to form an oxidation preventing film. Further, though not shown in the drawing, in order to improve the adhesion between the support substrate 1 and the first thin film substratum conductor layer 61, as well as the adhesion between the support substrate 1 and the second thin film substratum conductor layer 62, it is permissible to interpose Ti, $TiO_2$ or the like as an adherent layer in the interface between the support substrate 1 and the first thin film substratum conductor layer 61 and in the interface between the support substrate 1 and the second thin film substratum conductor layer 62.

The first thin film substratum conductor layer 61 and the second thin film substratum conductor layer 62 are formed at the same manufacturing step. As for the concrete forming method, a conductor layer (a single layer of Au or multilayers comprising Ti/Au layers) that is a material for forming the first and second thin film substratum conductor layers is formed on approximately the whole surface of the support substrate 1 to a desired film thickness by various known methods such as, e.g., the electron beam deposition process, a vacuum process such as, e.g., the sputtering process, the printing process, the MOD process, the process of applying and heat-degradation, such as, e.g., the sol-gel process, etc. Thereafter, the conductor layer thus formed is patterned into a desired shape by the photolithography and etching process, the lift off process or the like.

In this way, the first thin film substratum conductor layer 61 and the second thin film substratum conductor layer 62, which are, for example, separated from each other, can be formed.

Here, the film thickness t1 of the first thin film substratum conductor layer 61 and the second thin film substratum conductor layer 62 is desirably about 0.1 to 3.0 $\mu$m. An important thing here is to set the film thickness t1 of the first thin film substratum conductor layer 61 and the second thin film substratum conductor layer 62 so that, when the thin film dielectric layer 3 is formed, no step coverage defect may be produced in the end face ridge portions of the first thin film substratum conductor layer 61 and the second thin film substratum conductor layer 62.

Further, the separation distance x between the first thin film substratum conductor layer 61 and the second thin film substratum conductor layer 62 is 10 $\mu$m.

The thin film dielectric layer 3 is formed by deposition so as to extend over the first thin film substratum conductor layer 61 and the second thin film lower conductor 62, centering around the region x that separates the first thin film substratum conductor layer 61 and the second thin film substratum conductor layer 62. In the drawing, the portion of the thin film dielectric layer 3 that is deposited on the first thin film substratum conductor layer 61 is larger in area. Further, this portion of the thin film dielectric layer 3 that is deposited on the first thin film substratum conductor 61 constitutes a capacitance-producing region a.

This thin film dielectric layer 3 is a ferroelectric oxide thin film that has a perovskite-type crystal structure represented by $(Ba_{1-x}Sr_x) TiO_3$ (wherein 0<x<1.0). The dielectric constant of this thin film dielectric layer 3 is varied by applying an external voltage as mentioned above. The film thickness of the thin film dielectric layer 3 can be suitably adjusted by taking the rate of change of the dielectric constant, etc. in to consideration and is, for example, about 0.15 $\mu$m to 3 $\mu$m. More specifically, the dielectric film adjusted so as to satisfy $(Ba_{1-x}Sr_x) TiO_3$ (wherein 0<x<1.0) is formed by patterning the material to a predetermined shape. By various methods such as, e.g., the sputtering process, the vacuum deposition process, the sol-gel process, the MOCVD process and the MOD process, a thin film dielectric layer is formed on the whole surface (the whole surface of the support substrate 1) of the first thin film substratum conductor layer 21 and the second thin film substratum conductor layer 22, and then, the dielectric layer is formed by patterning the thus formed thin film dielectric layer to a desired shape by the photolithography and etching process, the lift off method or the like.

The first thin film superstratum conductor layer 71 constituting the first capacitance electrode 52 and the second thin film superstratum conductor layer 72 constituting the second capacitance electrode 54 are formed of Au or the like in order to make the conductor loss in the electrode portions extremely small when operated in a high-frequency region. For example, Au that is the electrode material is a non-oxidizing metal, so that the formation of an oxidation-preventing film is not necessary.

Here, the first thin film superstratum conductor layer 71 and the second thin film superstratum conductor layer 72 are separated from each other on the thin film dielectric layer 3, for example, that is deposited on the first thin film substratum conductor layer 61. This separation portion is indicated by a symbol Y. The first thin film superstratum conductor layer 71 is laminated and disposed on the first thin film substratum conductor layer 61 in such a state that the first thin film superstratum conductor layer 71 is superposed on one end portion of the thin film dielectric layer 3. That portion of the first thin film superstratum conductor layer 71 which is superposed on one end portion of the thin film dielectric layer 3 is the end portion of the thin film dielectric layer 3 that lies on the first thin film substratum conductor layer 61; the first thin film superstratum conductor layer 71 is superposed on this end portion so as to prevent the thin film dielectric layer 3 from peeling off from this end portion.

The second thin film superstratum conductor layer 72 is disposed in a state laminated on the second thin film substratum conductor layer 62 so as to be superposed on the large portion of the thin film dielectric layer 3. More specifically, the second thin film superstratum conductor layer 72 is laminated on the second thin film substratum conductor layer 62, extending as far as that portion of the thin film dielectric layer 3 which is deposited on the first thin film substratum conductor layer 61, beyond the thin film dielectric layer 3 portion deposited on the second thin film substratum conductor layer 62 and the thin film dielectric layer 3 portion deposited in the separation portion X. In other words, that portion of the thin film dielectric layer 3 that covers the first thin film substratum conductor layer 61 constitutes the capacitance-producing portion.

The first thin film superstratum conductor layer 71 and the second thin film superstratum conductor layer 72 are formed by the same manufacturing step. As for the concrete forming method, a conductor layer that will constitute the first thin film superstratum conductor layer 71 and the second thin film superstratum conductor layer 72 is formed to a desired film thickness of t2 on approximately the whole surface of the support substrate 1 so as to cover the first thin film substratum conductor layer 61, the second thin film substratum conductor layer 62, and the thin film dielectric layer 3 by the use of various known methods such as, e.g., the electron beam vacuum deposition process, a vacuum process such as the sputtering process, etc., the printing process, the MOD process and the process of applying and heat-degradation such as the sol-gel process. After this, the conductor layer thus formed is patterned to a desired shape by the photolithography and etching process, the lift off process or the like. By this patterning, the separation portion Y is formed, and the first thin film superstratum conductor layer 71 and the second thin film superstratum conductor layer 72 that are separated from each other on the thin film dielectric layer 3 portion laying on the first thin film substratum conductor layer 61 are formed.

Here, the film thickness t2 of the first thin film superstratum conductor layer 71 and the second thin film superstratum conductor layer 72 is about 0.3 to 4.5 μm. An important thing here is to set the film thickness t2 of the first thin film superstratum conductor layer 71 and the second thin film superstratum conductor layer 72 as large as possible by taking into consideration the conductor losses of the first capacitance electrode 52 formed by lamination on the first thin film substratum conductor layer 61 and the second capacitance electrode 54 formed by lamination on the second thin film substratum conductor layer 62. Further, the distance of the separation portion Y between the first thin film superstratum conductor layer 71 and the second thin film superstratum conductor layer 72 is 10 μm.

Here, the conductor layer comprised of Au must be etched in order to form the separation portion Y. The etchant used in this case is, for example, a cyan solution or a mixture solution consisting of iodine and potassium iodide. This etchant has the feature that it does not etch the thin film dielectric layer 3, so that only the first thin film superstratum conductor layer 71 and the second thin film superstratum conductor layer 72 can be easily etched, and it is not necessary to form a resist film for protecting the thin film dielectric layer 3. As a result, the process of fabricating the tunable thin film capacitor becomes easy as a whole.

As described above, in the case of the tunable thin film capacitor, by feeding an external voltage across the first capacitance electrode 52 and the second capacitance electrode 54 to apply a predetermined potential to the capacitance-producing region a of the thin film dielectric layer 3, the dielectric constant of the thin film dielectric layer 3 itself is changed. As a result, the value of the capacitance obtained from the first capacitance electrode 52 and the second capacitance electrode 54 can be variably controlled.

The voltage applied across the first capacitance electrode 52 and the second capacitance electrode 54 can be suitably adjusted depending on the kind, the film thickness, the use or the like of the thin film dielectric material, but the voltage applied is desirably about 10 V or below, for example, in view of the leakage current of the thin film dielectric layer 3, the practical usability of the power source, etc.

Further, the larger the rate of change of the capacitance ([the capacitance after the application of voltage—the capacitance at 0 V]/the capacitance at 0 V×100) that changes corresponding to the applied voltage is, the more desirable it is; for example, about —25% or more is pointed out.

Further, the dielectric constant of the thin film dielectric layer 3 that changes depending on the application of the external control voltage varies in accordance with the kind of the dielectric material, the film thickness of the thin film dielectric layer 3, the facing area and the forming method of the right-hand capacitance electrode 52, 54, the fabrication accuracy of the first thin film superstratum conductor layer 71 and the second thin film superstratum conductor layer 72, etc. but is, for example, about 200 to 500.

In this structure, a protective film 5 may be formed by deposition on the first thin film superstratum conductor layer 71 and the second thin film superstratum conductor layer 72. In forming this protective film 5, through holes must be formed in the regions in which bump terminal 16, 17, etc. for connecting to the mother board substrate will be formed. The first bump terminal 16 is formed in this first thin film superstratum conductor layer 71, and the second bump terminal 17 is formed in the second thin film superstratum conductor layer 72. In case that the material of these bump terminals 16, 17 is solder for example, it is necessary to form a solder diffusion preventing layer of Ni or the like on the first thin film superstratum conductor layer 71 and the second thin film superstratum conductor layer 72 that are exposed from the through holes.

The positions of the through holes thus formed in the protective film 5 (the regions in which the bump terminals 16, 17 are formed) are the region in which the first thin film substratum conductor layer 61 and the first thin film superstratum conductor layer 71 are laminated on each other and the region in which the second thin film substratum conductor layer 62 and the second thin film superstratum conductor layer 72 are laminated on each other. This is for the purpose of preventing the mechanical stress and the thermal stress at the time of forming the bump terminals 16, 17 from affecting the capacitance-producing region a. Moreover, the outer peripheral portion of the protective film 5 is kept in intimate contact with the surface of the support substrate 1. Thus, the protective film 5 is hard to peel off from the support substrate 1.

As mentioned above, according to the invention, in case that the first capacitance electrode 52 and the second capacitance electrode 54 that hold the thin film dielectric layer 3 between them are made constant, the thickness t2 of the first thin film superstratum conductor layer 71 and the first thin film superstratum conductor layer 72 can be made relatively large, and the thickness t1 of the first thin film substratum conductor layer 61 and the second thin film substratum conductor layer 62 that constitute substrata for the thin film dielectric layer 3 can be made relatively small. For example, the thickness t1 of the first thin film substratum conductor layer 61 and the second thin film substratum conductor layer 62 is set to 0.1 to 3.0 μm, and the thickness t2 of the first thin film superstratum conductor layer 71 and the second thin film superstratum conductor layer 72 is set to 0.3 to 4.5 μm, and t1<t2.

Thus, in forming the thin film dielectric layer 3, no step coverage defect is produced in the end portions of the first thin film substratum conductor layer 61 and the second thin film substratum conductor layer 62 that constitute substrata for the thin film dielectric layer 3, and further, even in the case of applying an external voltage of about 10 V, variation in the distribution of potential can be made small in the first capacitance electrode 52 and the second capacitance electrode 54 as mentioned above. As a result, the realization of a low resistance and a low inductance becomes possible; a tunable thin film capacitor suited for a high-frequency operation is realized.

In addition, unlike in the case of the known structure, a portion of the upper electrode layer 164 is not made hollow by the air bridge 165, etc., so that the bump terminals 16, 17 that can be easily mounted to the mother board can be formed in the first capacitance electrode 52 and the second capacitance electrode 54.

Embodiment 2

On a ceramic substrate, a $TiO_2$ layer with a thickness of 20 nm and an Au film with a thickness of 0.3 μm were formed by the sputtering process under the condition that the deposition temperature be 250° C., and the Ar gas pressure be 5 mTorr. This Au film was processed to a predetermined shape by wet etching, whereby the first thin film substratum conductor layer 61 and the second thin film substratum conductor layer 62, which were both comprised of Au, could be formed.

Next, on the first thin film substratum conductor layer 61 and the second thin film substratum conductor layer 62 formed by Au thus formed, a thin film dielectric layer with a thickness of 0.15 μm was formed by processing a dielectric material represented by $(Ba_{1-x}Sr_x) TiO_3$ (wherein 0<x<1.0) by the use of the sputtering process under the condition that the deposition temperature be 400° C., the Ar gas pressure be 72 mTorr, and the $O_2$ gas pressure be 18 mTorr. Subsequently, by etching this thin film dielectric layer, the thin film dielectric layer 3 having a predetermined shape and covering the separation portion X between the first thin film substratum conductor layer 61 and the second thin film substratum conductor layer 62 was formed.

Further, on the first thin film substratum conductor layer 61, the second thin film substratum conductor layer 62 and the thin film dielectric layer 3 thus formed, an Au film with a thickness of 0.6 μm was formed by the sputtering process under the condition that the deposition temperature be 250° C. and the Ar gas pressure of 5 mTorr. This Au film was processed by etching to a predetermined shape, whereby the first thin film superstratum conductor layer 71 and the second thin film superstratum conductor layer 72 were formed.

In the embodiment of the invention, $(Ba_{1-x}Sr_x) TiO_3$ (wherein 0<x<1.0) was used as the material of the dielectric film, but, in fabricating the thin film capacitor, the material of the dielectric film is not specified.

The tunable thin film capacitor of the fifth embodiment according to the invention will now be described in detail on the basis of the drawings.

This embodiment will be described with reference to a tunable thin film capacitor constituted such that, by the application of an external voltage to the dielectric layer thereof, the dielectric constant is changed corresponding to the thus applied voltage, whereby the capacitance can be arbitrarily controlled. Such a dielectric material is represented by $(Ba_{1-x}Sr_x) TiO_3$ (wherein 0<x<1.0). Further, this dielectric material has the perovskite-type crystal structure, and its dielectric constant is changed by the electric field of the external voltage.

In the description of this invention, the expression, "the dielectric constant is changed by the external voltage", means, for example, that the dielectric layer comprised of the dielectric material mentioned above is held between a first capacitance electrode and a second capacitance electrode, and, in cases such as the case of applying a DC voltage across the two capacitance electrodes, the capacitance of the thin film capacitor can be changed. The voltage applied across the two electrodes can be suitably adjusted depending on the kind, the thickness, the use, etc. of the dielectric material of the dielectric layer, but about 10 V or below is pointed out from the viewpoint of, e.g., the leakage current of the dielectric layer, the practical usability of the power source, etc. Further, the larger the rate of change, ([the capacitance after the application of the voltage—the capacitance at 0 V]/the capacitance at 0 V×100), of the capacitance that changes corresponding to the applied voltage is, the more desirable it is; for example, −25% or more can be pointed out. Further, the dielectric constant of the dielectric that changes corresponding to the external voltage applied, varies in accordance with the kind of the dielectric material, the thickness of the dielectric film, the facing area of the capacitance electrode, the processing accuracy of the respective electrodes, etc., but, for example, about 200 to 600 can be pointed out.

Figure 9:
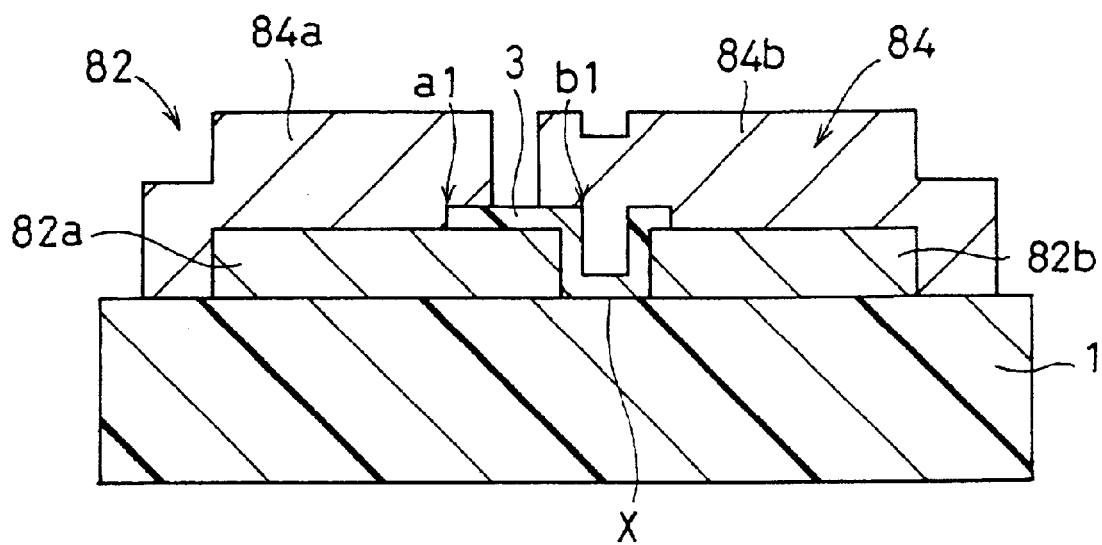
FIG. 9 is a schematic sectional view showing the essential portion of the tunable thin film capacitor of the fifth embodiment according to the invention.

FIG. 9 is a sectional view showing the sectional structure of the tunable thin film capacitor of the fifth embodiment according to the invention. In this embodiment, the components that play the same or corresponding roles as in the above-described embodiment will be identified with the same reference symbols, and in some cases overlapping descriptions will be omitted. The tunable thin film capacitor according to the invention is constituted such that, on a support substrate 1, a first thin film substratum conductor layer 82*a* and a second thin film substratum conductor layer 82*b* are formed by deposition in a state separated from each other. This separating portion is designated by x. Further, a thin film dielectric layer 3 whose dielectric constant is changed by the application of an external voltage is deposited so as to extend over the first thin film substratum conductor layer 82*a* and the second thin film substratum conductor layer 82*b*. Further, a first thin film superstratum conductor layer 84*a* is formed by deposition on the first thin film substratum conductor layer 82*a*, and at the same time, on the second thin film substratum conductor layer 82*b*, a second thin film superstratum conductor layer 84*b* is formed by deposition. This first thin film superstratum conductor layer 84*a* is disposed so as to cover a portion (indicated by the symbol a1) of the thin film dielectric layer 3, and the second thin film superstratum conductor layer 84*b* is disposed so as to cover a portion (indicated by the symbol b1) of the thin film dielectric layer 3 in a state facing the first thin film substratum conductor layer 82*a* through the thin film dielectric layer 3. The first thin film superstratum conductor layer 84*a* is disposed so as to cover one end of the first thin film substratum conductor layer 82*a*. The second thin film superstratum conductor layer 84*b* is disposed so as to cover one end of the second thin film substratum conductor layer 82*b*.

More specifically, the first capacitance electrode 82 acting as the lower electrode layer is comprised of the first thin film substratum conductor layer 82*a* and the first thin film superstratum conductor layer 84*a*. Further, the second capacitance electrode 84 acting as the upper electrode layer is comprised of the second thin film substratum conductor layer 82*b* and the second thin film superstratum conductor layer 84*b*. Further, the capacitance-producing region of the thin film dielectric layer 3 is the region through which the first thin film substratum conductor layer 82*a* and the second thin film superstratum conductor layer 84*b* face each other. In this embodiment, as in the case of the above-described embodiments, the capacitance-producing region is plurally provided and they are electrically connected to one another.

As the support substrate 1, there can be used a substrate whose dielectric loss in a high-frequency operation is small; for example, a ceramic substrate made of, e.g., alumina, a glass substrate, an insulating substrate such as, e.g., a resin substrate, a semiconductor substrate made of, e.g., silicon or germanium, a compound semiconductor substrate made of, e.g., GaAs or In GaAs, or the like. In particular, a ceramic substrate is desirable in respect of the strength, thermal resistance, cost, etc.

The first thin film substratum conductor layer 82*a* constituting the first capacitance electrode 82 and the second thin film substratum conductor layer 82*b* constituting the second capacitance electrode 84 are sufficient if they can withstand the deposition temperature at the time of film-forming deposition of the thin film dielectric layer 3. More specifically, the material of the first thin film substratum conductor layer 82a and the second thin film substratum conductor film 82b is desirably Au or Pt in view of minimizing the conductor loss in the electrode portions when the capacitor is operated in a high frequency region. For example, Au or Pt, which is an electrode material, is a non-oxidizable metal, and therefore, the formation of an oxidation-preventing film is not necessary. Further, though not shown, a Ti or $TiO_2$ layer may be interposed as an adherent layer in the interface between the support substrate 1 and the first thin film substratum conductor layer 82a, and in the interface between the support substrate 1 and the second thin film substratum conductor layer 82b in order to enhance the adherence between the support substrate 1 and the first thin film substratum conductor layer 82a, as well as the adherence between the support substrate 1 and the second thin film substratum conductor layer 82b.

The first thin film substratum conductor layer 82a and the second thin film substratum conductor layer 82b are formed by the same manufacturing step. As for the concrete forming method, on approximately the whole surface of the support substrate 1, a conductor layer (a single Au layer or a multi-layer consisting of Ti/Au layers) that will constitute the electrode materials mentioned above is formed to a desired thickness by any of various known application and thermal decomposition processes such as, e.g., the electron beam evaporation process, a vacuum process such as, e.g., the sputtering process, the printing process, the MOD process and the Sol-Gel process. After this, the conductor layers were formed by patterning the thus formed conductor layer into a desired shape by the photolithography and etching process, the lift off process or the like.

In this way, the first thin film substratum conductor layer 82a and the second thin film substratum conductor layer 82b, which are separated from each other, can be formed.

The thickness of the first thin film substratum conductor layer 82a and the second thin film substratum conductor layer 82b varies in accordance with the devices on which the tunable thin film capacitor is mounted, but the thickness is desirably 0.1 $\mu$m or more and, more desirably, about 0.1 to 3.0 $\mu$m in order to decrease the conductor loss in case that the capacitor is used at a high frequency such as, e.g., 1 GHz or higher. Further, the distance of separation x between the first thin film substratum conductor layer 82a and the second thin film substratum conductor layer 82b is 10 $\mu$m.

The thin film dielectric layer 3 is formed by deposition so as to extend over the first thin film substratum conductor layer 82a and the second thin film substratum conductor layer 82b, centering around the region x that separates the first thin film substratum conductor layer 82a and the second thin film substratum conductor layer 82b from each other. In FIG. 9, the thin film dielectric layer 3 deposited on the first thin film substratum conductor layer 82a has a large area. The thin film dielectric layer 3 portion deposited on this first thin film substratum conductor layer 82a constitutes a capacitance-producing region.

This thin film dielectric layer 3 is a ferroelectric oxide thin film that has the perovskite-type crystal structure represented by $(Ba_{1-x}Sr_x) TiO_3$ (wherein 0<x<1.0). The dielectric constant of this thin film dielectric layer 3 changes upon the application of an external voltage. The thickness of the thin film dielectric layer 3 can be suitably adjusted by taking the rate of change of the dielectric constant, etc. in to consideration. More specifically, the thin film dielectric layer 3 is formed by patterning into a predetermined shape a dielectric layer adjusted so as to become $(Ba_{1-x}Sr_x) TiO_3$ (wherein 0<x<1.0). By various processes such as the sputtering process, the vacuum deposition process, the sol-gel process, the MOCVD process and the MOD process, a thin film dielectric layer is formed on the whole surface of the first thin film substratum conductor layer 82a and the second thin film substratum conductor layer 82b (the whole surface of the support substrate 1) and then patterned into the desired shape by the photolithography and etching process, the lift off process, or the like, whereby the thin film dielectric layer 3 is formed.

The thickness of the thin film dielectric layer 3 is set to a thickness value that is 0.5 to 3.0 times as large as the thickness of the thin film substratum conductor layers 82a and 82b, in order to prevent the occurrence of step coverage defects in the end portions of the thin film substratum conductor layers 82a and 82b and to enhance the step coverage. The thickness of the thin film dielectric layer 3 is desirably about 0.05 $\mu$m to 6.0 $\mu$m, for example. Here, in case that the thickness of the thin film dielectric layer 3 is less than 0.5 times as large as the thickness of the thin film substratum conductor layers 82a, 82b, the thickness of the dielectric layer 3 becomes relatively small, as a result of which a good step coverage cannot be obtained. In case that the thickness of dielectric layer 3 is more than 3.0 times as large as the thickness of the thin film substratum conductor layers 82a, 82b, the thickness of the thin film dielectric layer 3 becomes too thick, so that a large amount of time is required for the formation of the dielectric layer by the thin film technology, and the step coverage of the thin film superstratum conductor layers 84a, 84b formed on the thin film dielectric layer 3 is deteriorated.

The first thin film superstratum conductor layer 84a constituting the first capacitance electrode 82 and the second thin film superstratum conductor layer 84b constituting the second capacitance electrode 84 are formed of Au or the like in order to minimize the conductor loss in the electrode portions when operated in high-frequency region. For example, Au that is the electrode material is a non-oxidizable metal, so that the formation of an oxidation-preventing film is not necessary.

Here, the first thin film superstratum conductor layer 84a and the second thin film superstratum conductor layer 84b are separated from each other by the portion of thin film dielectric layer 3 deposited, for example, on the first thin film substratum conductor layer 82a. Further, the first thin film superstratum conductor layer 84a is disposed on the first thin film substratum conductor layer 82a so as to be superimposed on one end portion of the thin film dielectric layer 3. The portion of the first thin film superstratum conductor layer 84a that is superimposed on one end portion of the thin film dielectric layer 3 corresponds to the end portion of the thin film dielectric layer 3 on the first thin film substratum layer 82a; the first thin film superstratum conductor layer 84a portion is thus superposed in order to prevent the thin film dielectric layer 3 from peeling off at this end portion.

The second thin film superstratum conductor layer 84b is disposed in a state laminated on the second thin film substratum conductor layer 82b so as to be superposed on a large portion of the thin film dielectric layer 3. More specifically, the second thin film superstratum conductor layer 84b is laminated on the second thin film substratum conductor layer 82b in a state extending as far as that portion of the thin film dielectric layer 3 which is deposited on the first thin film substratum conductor layer 82a, passing over the thin film dielectric layer 3 portion deposited on the second thin film substratum conductor layer 82b and the thin film dielectric layer 3 portion deposited on the separating portion x. In other words, the portion of the thin film dialectic layer 3 that covers the first thin film substratum conductor 82a constitutes the capacitance-producing region.

The first thin film superstratum conductor layer 84a and the second thin film superstratum conductor layer 84b are formed by the same manufacturing step. As for the concrete forming method, a conductor layer that will become the first thin film superstratum conductor layer 84a and the second thin film superstratum conductor layer 84b is formed over approximately the whole surface of the support substrate 1, for example, so as to cover the first thin film substratum conductor layer 82a, the second thin film substratum conductor layer 82b and the thin film dielectric layer 3, by the use of various known methods such as, e.g., the electron beam evaporation process, vacuum processes such as the sputtering process, the printing process, the MOD process, and application and thermal decomposition processes such as the sol-gel process. After this, the conductor layer thus formed is patterned to a desired shape by the photolithography and etching process, the lift off process, or the like. By this patterning, the first thin film superstratum conductor layer 84a and the second thin film superstratum conductor layer 84b that are separated from each other are formed on the thin film dielectric layer 3 laying on the first thin film substratum conductor layer 82a.

The thickness of the thin film superstratum conductor layers 84a, 84b is set so as to decrease the loss of the electrode portions in the first capacitance electrode 82 and the second capacitance electrode 84. The thickness of the thin film superstratum conductor layers 84a, 84b is set to a thickness 0.5 to 10.0 times as large as the thickness of the first and second thin film substratum conductor layers 82a, 82b; as the actual film thickness, about 0.1 to 25 μm is pointed out for example. In case that the thickness of the thin film superstratum conductor layers 84a, 84b is less than 0.5 times as large as the thickness of the thin film substratum conductor layers 82a, 82b, the thickness of the thin film superstratum conductor layers 84a, 84b becomes relatively small, step coverage defects are produced in the contact portions where the end portions of the dielectric layer 3 and the thin film superstratum conductor layers 84a, 84b are contacted with each other, so that the step coverage is deteriorated. Conversely, in case that the thickness of the thin film superstratum conductor layers 84a, 84b is more than 10 times as large as the thickness of the thin film substratum conductor layers 82a, 82b, the thickness of the thin film substratum conductor layers 82a, 82b and the thin film superstratum conductor layers 84a, 84b put together becomes too large, and thus, peeling becomes apt to take place in the interfaces. This is considered to be because a long deposition time is required for the formation of the thin film superstratum conductor layers 84a, 84b, so that internal stresses such as the heat at the time of deposition are accumulated in the thin film superstratum conductor layers, and thus, due to these internal stresses, peeling is caused.

The distance of the portion that separates the first thin film superstratum conductor layer 84a and the second thin film superstratum conductor layer 84b from each other is 10 μm.

Here, a conductor layer comprised of Au for forming this separating portion must be formed by etching. The etchant used in this case is, for example, a cyan solution or a mixture solution of iodine and potassium iodide. This etchant has the feature of not etching the thin film dielectric layer 3, so that only the first thin film superstratum conductor layer 84a and the second thin film superstratum conductor layer 84b can be easily etched, and thus, it is not necessary to form a resist film for protecting the thin film dielectric layer 3. As a result, the whole process of fabricating the tunable thin film capacitor becomes easy to perform.

As mentioned above, in the tunable thin film capacitor, an external voltage is fed across the first capacitance electrode 82 and the second capacitance electrode 84, whereby the dielectric constant is changed in the region (capacitance-producing region) of the thin film dielectric layer 3 that is sandwiched between the first capacitance electrode 82 and the second capacitance electrode 84, as a result of which the capacitance value obtained from the first capacitance electrode 82 and the second capacitance electrode 84 can be variably controlled.

In the structure described above, a protective film may be formed by deposition on the first thin film superstratum conductor layer 84a and the second thin film superstratum conductor layer 84b. In the case of forming this protective film, through holes must be formed in the regions in which bump terminals, etc. for connecting the capacitor to a mother board or the like are formed. A first bump terminal is formed on the first thin film superstratum conductor layer 84a, and a second bump terminal is formed on the second thin film superstratum conductor layer 84b. In case that the material of these bump terminals is a solder for example, solder spread preventing layers comprised of Ni or the like must be formed on the portions of the first thin film superstratum conductor layer 84a and the second thin film superstratum conductor layer 84b that are exposed from the through holes. Moreover, the outer peripheral portion of the protective film is kept in intimate contact with the surface of the support substrate 1. Thus, the protective film is hard to peel off from the support substrate 1.

Embodiment 3

In this tunable thin film capacitor, for example the thin film substratum conductor layers 82a, 82b, the thin film dielectric layer 3, and the thin film superstratum conductor layers 84a, 84b were successively formed on a ceramic substrate 1, respectively.

First, on the ceramic substrate 1 with a thickness of, e.g., 0.3 mm, a Pt film with a thickness of 0.3 μm was formed by the sputtering process under the condition that the deposition temperature be 600° C., and the Ar gas pressure be 10 mTorr. This Pt film was processed to a predetermined shape by dry etching, whereby the first and second thin film substratum conductor layers 82a, 82b made of Pt were formed.

Next, extending over the first thin film substratum conductor layer 82a and the second thin film substratum conductor layer 82b, both being comprised of Pt, the thin film dielectric layer 3 with a thickness of 0.3 μm was formed by sputtering a dielectric material represented by $(Ba_{1-x}Sr_x)TiO_3$ (wherein, $0<x<1.0$) under the condition that the deposition temperature be 600° C., the Ar gas pressure be 10 mTorr, and the $O_2$ gas pressure be 2.5 mTorr. Subsequently, this thin film dielectric layer 3 was processed to a predetermined shape by the wet etching in the presence of fluo nitric acid so as to expose portions of the thin film substratum conductor layers 82a, 82b; thus, the thin film dielectric layer 3 was formed.

Further, on the thin film substratum conductor layers 82a, 82b and the thin film dielectric film 3 thus formed, an Au film with a thickness of 1.2 μm was formed by the sputtering process under the condition that the deposition temperature be 250° C., and the Ar gas pressure be 10 mTorr. This Au film was processed to a predetermined shape by wet etching, whereby the thin film superstratum conductor layers 84a, 84b made of Au were formed.

However, in the embodiment of the invention, $(Ba_{1-x}Sr_x)TiO_3$ (where, 0<x<1.0) was used, but the dielectric film material is not specified in the fabrication of the thin film capacitor.

The present inventor confirmed that, in case that the thickness of the thin film dielectric layer 3 was set to a thickness value less than 0.5 times as large as the thickness of the thin film substratum layers 82a, 82b, step coverage defects were produced in about 90% of, e.g., 350 thin film capacitor samples, wherein the first thin film substratum conductor layer 82a and the second thin film superstratum conductor layer 84b were short-circuited to each other.

Further, it was confirmed that, in case that the thickness of the thin film superstratum conductor layers 84a, 84b was set to a thickness value less than 0.5 times as large as the thickness of the thin film substratum conductor layers 82a, 82b, step coverage defects were caused in about 65% of, e.g., 350 thin film capacitor samples, wherein an open-circuit state was produced with respect to the second thin film superstratum conductor layers 84b.

Figure 10:
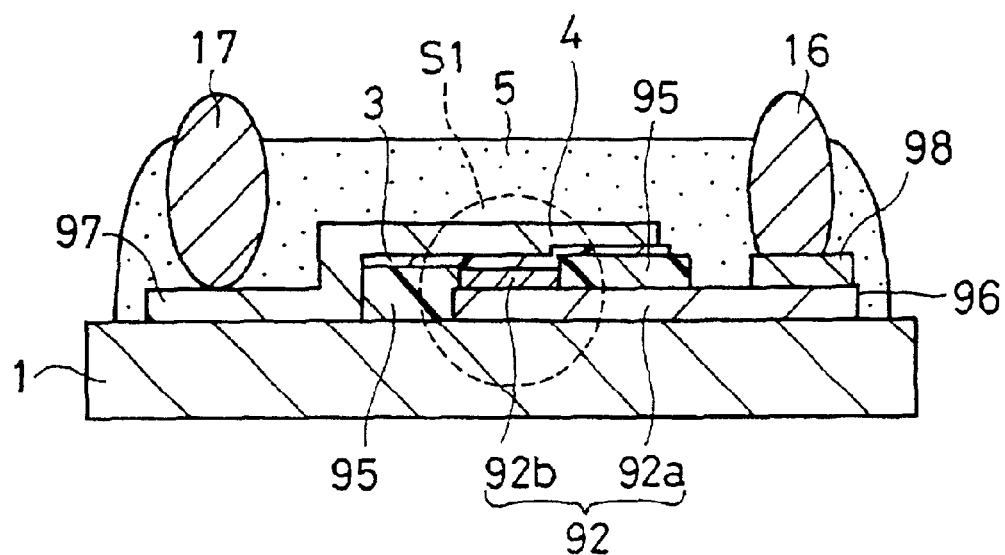
FIG. 10 is a sectional view of the tunable thin film capacitor of the sixth embodiment according to the invention.
Figure 11:
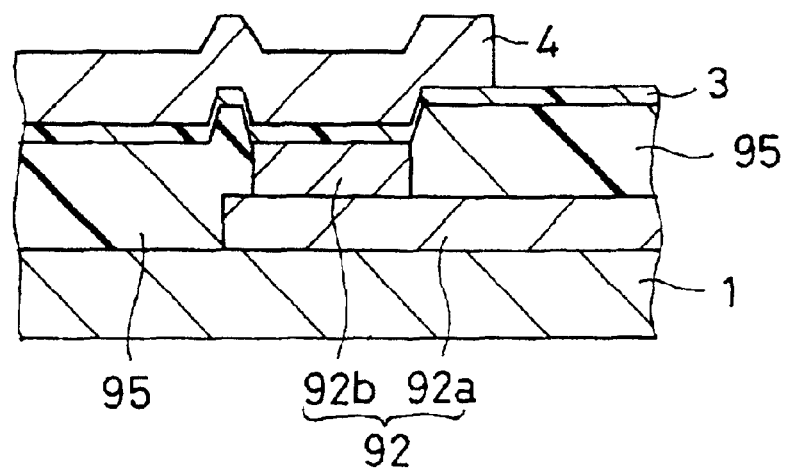
FIG. 11 is a sectional view of the essential portion of the tunable thin film capacitor of the sixth embodiment according to the invention.
Figure 12:
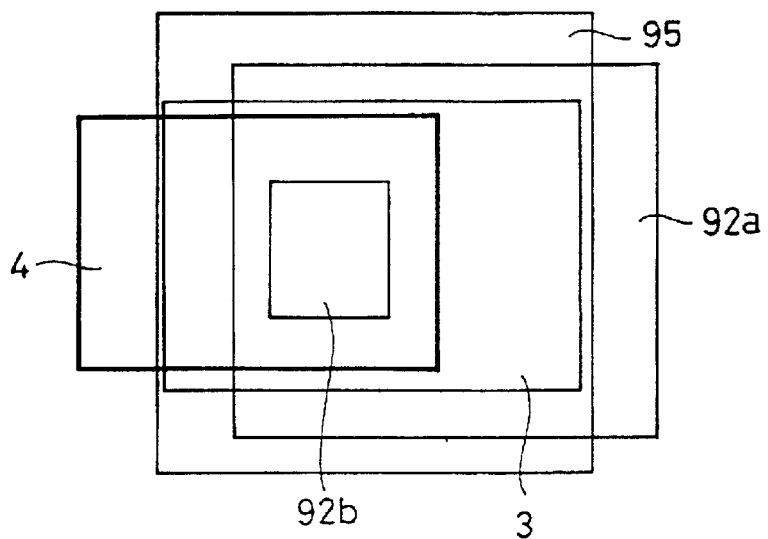
FIG. 12 is a plan view showing the tunable thin film capacitor in a state omitting the protective layer and the terminal portions shown in FIG. 7.

FIG. 10 is a sectional view of the tunable thin film capacitor of the sixth embodiment according to the invention, FIG. 11 is an enlarged sectional view of the capacitance-producing region portion shown encircled in FIG. 1, and FIG. 12 is a plan view showing the tunable thin film capacitor in a state omitting the protective layer. In this embodiment, the components that play the same or corresponding roles as in the above-described embodiments will be identified with the same reference symbols, and in some cases overlapping descriptions will be omitted.

In the drawings, the reference numeral 1 denotes a support substrate, numeral 92 denotes a lower electrode layer, numeral 3 denotes a thin film dielectric layer, numeral 4 denotes an upper electrode layer, numeral 5 denotes a protective layer, and numerals 16 and 17 denote terminal portions. The lower electrode layer 92 comprises a substratum conductor layer 92a formed closely adhering to the support substrate 1 and an upper conductor layer 92b that is smaller in area than the substratum conductor layer 92a and closely adheres to the thin film dielectric layer 3 to define the capacitance-producing region. Further, around the upper conductor layer 92b, there is disposed an insulator layer 95 for filling up the gap between the surface of the support substrate 1 and the surface of the upper conductor layer 92b. In this embodiment, as in the case of the above-described embodiments, the capacitance-producing region is plurally provided and they are electrically connected to one another.

Figure 13:
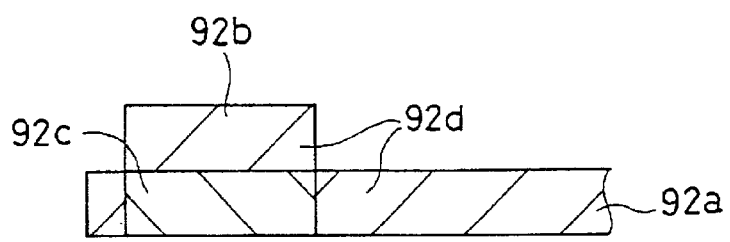
FIG. 13 is a sectional view of the lower electrode layer of the tunable thin film capacitor of the seventh embodiment according to the invention.

The support substrate 1 is a ceramic substrate comprised of alumina or the like or a monocrystalline substrate comprised of sapphire or the like. On the surface of the support substrate 1, the lower electrode layer 92 is formed. The lower electrode layer 92 is comprised of Pt or the like that has a high melting point and is a noble metal as heat treatment for the thin film dielectric layer 3 is required. This lower electrode layer 92 is formed by, e.g., the sputtering process at a substrate temperature of 150° C. to 600° C. More specifically, the substratum conductor layer 92a and the upper conductor layer 92b are respectively formed by different photolithography techniques (processes); they are formed eventually such that the upper conductor layer 92b is disposed on the substratum conductor layer 92a. For example, first, only the substratum conductor layer 92a is formed, and, in a portion thereof, the upper conductor layer 92b is selectively formed. Or, it is alternatively permissible to form the lower electrode layer 92 in such a manner that, as shown in FIG. 13, a first conductor layer 92c is formed corresponding to the shape of the upper conductor layer 92b, and then, a second conductor layer 92d is formed corresponding to the shape of the substratum conductor layer 92a; and thus, the lower electrode layer 92 is eventually formed such that a portion of the substratum conductor layer 92a has a protruded portion corresponding to the upper conductor layer 92b.

Referring to FIG. 10, numeral 96 denotes a terminal-disposing portion extended as far as the portion in which the terminal portion 16 is formed.

The thickness of the substratum conductor layer 92a of this lower electrode layer 92 is determined by taking into consideration the resistance component in the portion ranging from the terminal portion 16 to the capacitance-producing region and the continuity of the substratum conductor layer 92a (The larger the thickness is, the more desirable in either case) and the adherence of the substratum conductor layer 92a to the support substrate 1 (It is desirable that the thickness should be relatively small); and thus, the thickness of the substratum conductor layer 92a is set to, e.g., 0.1 to 2 μm. For example, in case that the thickness is smaller than 0.1 μm, the resistance of the electrode itself increases, and at the same time, the continuity of the electrode is lost; and thus, the reliability is deteriorated. On the other hand, in case that the thickness is set to a value larger than 2 μm, the reliability in the adherence of the substratum conductor layer 92a to the support substrate 1 deteriorates.

Further, the shape of the upper conductor layer 92b defines the area for producing a predetermined capacitance. The thickness of the upper conductor layer 92b is determined by taking into consideration the dielectric constant and thickness of the thin film dielectric layer 3. The thickness of the upper conductor layer 92b is determined by taking into consideration the loss of the electrode (The larger the thickness is, the more desirable it is) and the reliability in adherence (The smaller the thickness is, the more desirable it is); for example, the thickness of the upper conductor layer 92b is about 1 to 3 μm.

As the metal material for constituting the lower electrode layer 92, not only Pt but also Au, Ag, Al, Cu, etc. can be used.

The insulator layer 95 is formed around the upper conductor layer 92b constituting the lower electrode layer 92, and the material of the insulator layer 95 is ceramics such as, e.g., $SiO_2$ and $Si_3N_4$, a dielectric layer having the perovskite-type crystal structure, etc. In other words, the insulator layer 95 may be formed of the same material as that of the thin film dielectric layer 3 that will be described later. Further, in the invention, the insulator layer 95 is referred to as such in a broader sense of the terms; the material of the insulator layer 95 may be even a dielectric material.

Such an insulator layer 95 is formed on the lower electrode layer 92 including the upper conductor layer 92b and the support substrate 1, for example, and the unnecessary portion of the insulator layer 95 is removed by, e.g., wet etching or dry etching so that only the upper surface of the upper conductor layer 92b of the lower electrode layer 92 may be exposed.

Accordingly, the surface of the insulator layer 95 becomes substantially flush with the upper surface of the upper conductor layer 92b of the lower electrode layer 92, and thus, in the thin film dielectric layer 3 that is formed after this, any step coverage defect resulting from a step in the layer structure does not take place at all at least in the region of the upper conductor layer 92b and the region around the upper conductor layer 92b in which the insulator layer 95 is formed.

More specifically, though, as for the thickness of the insulator layer 95, some difference exists between the thickness of the portion of the insulator layer 95 that is deposited on the substratum conductor layer 92a portion of the lower electrode layer 92 and the thickness of the portion of insulator layer 95 that is directly deposited on the surface of the support substrate 1, the thickness of the insulator layer 95 is substantially the same as the thickness of the upper conductor layer 92b or the thickness of the lower electrode layer 92. Further, in order to unify the thickness of the insulator layer 95 and enhance the productivity, it is desirable to reduce the thickness of the substratum conductor layer 92a of the lower electrode layer 92 to such a degree as to cause no electrode loss.

Further, the insulator layer 95 is formed so as to expose a terminal disposing portion in which at least the terminal portions 16, 17 are formed.

The thin film dielectric layer 3 is a dielectric layer with a high dielectric constant that is comprised of perovskite-type oxide crystal grains containing at least Ba, Sr and Ti. This thin film dielectric layer 3 is formed on the surface of the insulator layer 95 including the upper conductor layer 92b of the lower electrode layer 92. For example, in the chamber of the sputtering apparatus, sputtering is performed using, as a target, a dielectric from which perovskite-type oxide crystal grains are obtained. By setting the substrate temperature at 600° C. for example, film formation is performed for a time determined by taking the thickness into consideration. As the target, a dielectric material in which the A-site component is excessive may be used to form the thin film dielectric layer 3, and then, heat treatment (900° C.) may be conducted in the air. As a result, the main body of the thin film dielectric layer 3 becomes a dielectric layer comprising a perovskite-type dielectric layer of the stoichiometric proportional composition with the excessive A-site component omitted and a newly formed dielectric layer comprising an oxide layer composed of the A-site component. In case that the upper surface side of the thin film dielectric layer 3 thus becomes an oxide layer composed of the A-site component, the adherence of the upper electrode layer 4 is enhanced, and the thickness of the upper electrode layer 4 can be improved.

The upper electrode layer 4 is formed by the use of, e.g., the sputtering process. As the material of this upper electrode layer 4, Au that has a low resistivity is desirable since Au lowers the resistance of the electrode. Besides, Al, Cu, etc. can also be used. The thickness of this upper electrode layer 4 is 0.1 to 5 μm. The lower limit of the thickness is set by taking the resistance of the electrode itself into consideration as in the case of the lower electrode layer 92. Further, the upper limit of the thickness is set by taking the deterioration of the adherence into consideration. Further, in FIG. 10, numerals 97 and 98 denote terminal-disposing portions that are formed by extending portions of the upper electrode layer 4 or formed at the same manufacturing step; the terminal-disposing portions 97, 98 are extended as far as the portions in which the terminal portions 16 and 17 are formed.

The protective film 5 is formed so as to expose the terminal-disposing portions 97, 98. As the material of the protective film, $SiO_2$, SiN, BCB (benzocyclobutene), polyimide, etc. are suitable. Further, the protective film 5 may be formed as a multi-layer structure comprised of these materials. This protective film 5 has the role protecting the capacitor from mechanical shocks from outside and, further, the role of preventing the deterioration due to moisture, the contamination of chemicals, oxidation, etc.

Further, as the terminal portions 16, 17, solder balls, metal bumps, etc. can be pointed out by way of example. Specifically, a solder ball may be formed on the terminal-disposing portions 97, 98 exposed from the protective film 5, or metal wires may be first-bonded and cut to a predetermined length, whereby bumps of gold or the like may be formed.

As described above, in the thin film capacitor, the capacitance-producing region is that portion of the thin film dielectric layer 3 which is sandwiched between the upper conductor layer 92b of the lower electrode layer 92 and the upper electrode layer 4. More specifically, either in the case of forming the thin film dielectric layer 3 or in the case of forming the upper electrode layer 4, it is not necessary to take the shape of the capacitance-producing region into consideration, but it is sufficient merely to form the thin film dielectric layer 3 and the upper electrode layer 4 in only a wide region including at least the capacitance-producing region. As for the actual determination of the capacitance-producing region, the shape of the capacitance-producing region is determined depending on the shape at the time of selectively patterning the upper conductor layer 92b of the lower electrode layer 92. At this point of time, only this lower electrode layer 92 exists on the support substrate 1, so that the upper conductor layer 92b of the lower electrode layer 92 can be formed accurately in a state in which no restrictive matter exists. Accordingly, it becomes easy to make the area of the capacitance-producing area small, and thus, a capacitor to be used in a high-frequency circuit can be easily realized.

In addition, since the thin film dielectric layer 3 can be formed by deposition into a surface that has a little step and thus constitutes substantially a plane, ranging over the upper conductor layer 92b of the lower electrode layer 92 and the insulator layer 95, no step coverage defect at all is produced in the thin film dielectric layer 3 or in the upper electrode layer 4.

Further, in case that a dielectric material is used as the material of the insulator layer 95, there is the possibility that an unnecessary capacitance component may be produced between the substratum conductor layer 92a of the lower electrode layer 92 and the upper electrode layer 4, but the interval between the portion of the substratum conductor layer 92a of the lower electrode layer 92 around the capacitance-producing region and the upper electrode layer 4 is very large as compared with the interval between the portion of the upper conductor layer 92b of the lower electrode layer 92 in the capacitance-producing region, so that the capacitance produced here is negligible as compared with the capacitance of the capacitance-producing region. In case that it is desired to further decrease the unnecessary capacitance produced around the capacitance-producing region, it is sufficient to make the substratum conductor layer 92a of the lower electrode layer 92 as thin as possible and make the upper conductor layer 92b of the lower electrode layer 92 as thick as possible, whereby the difference between the two intervals is enlarged.

In particular, in a tunable thin film capacitor constituted such that the thin film dielectric layer 3 is formed of a material such as $(Ba_xSr_{1-x})TiO_3$ or the like, and thus, the capacitance characteristic of the capacitor can be adjusted by applying a DC bias across the lower electrode layer 92 and the upper electrode layer 4 to change the dielectric constant of the thin film dielectric layer 3, particularly the upper electrode layer 4 and the thin film dielectric layer 3 can be stably formed, so that the dispersion of the voltage applied to the thin film dielectric layer 3 can be prevented, and a stable tunability can be obtained.

Figure 14:
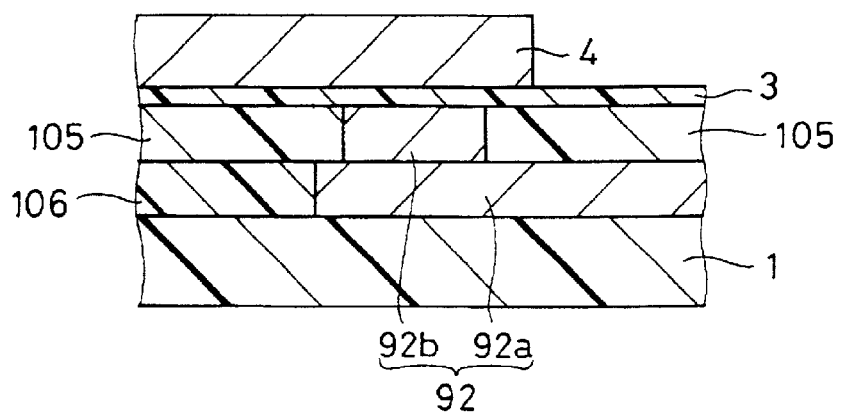
FIG. 14 is a sectional view of the essential portion of the tunable thin film capacitor of the eighth embodiment according to the invention.

FIG. 14 is a sectional view of tunable thin film capacitor of the eighth embodiment according to the invention. In this embodiment, a substratum insulator layer 106 closely adhering to the surface of the support substrate 1 and an insulator layer 105 closely adhering to the upper surface of the substratum insulator layer 106 and the upper surface of the substratum conductor layer 92a of the lower electrode layer 92 are separately formed. The insulator layers 105 and 106 are made of a ceramics material such as $SiO_2$, $Si_3N_4$, etc. or the dielectric material that constitutes the thin film dielectric layer 3 as in the case of the foregoing embodiment. First, the substratum insulator layer 106 with about the same thickness as that of the substratum conductor layer 92a of the lower electrode layer 92 is formed by sputtering or the like, and then, the unnecessary portion of the substratum insulator layer 106 are removed by wet etching or dry etching so as to expose the substratum conductor layer 92a of the lower electrode layer 92. Next, the insulator layer 105 with approximately the same thickness as that of the upper electrode layer 92b of the lower electrode layer 92 is formed by sputtering or the like, and then, the unnecessary portion of the insulator layer 105 is removed by wet etching or dry etching so as to expose the upper conductor layer 92b. By forming the insulator layers in correspondence to the structure of the lower electrode layer 92 as mentioned above, the surface of the insulator layer 105 and the surface of the upper conductor layer 92b of the lower electrode layer 92 can be made into a uniform plane.

Embodiment 4

On a sapphire R substrate as the support substrate 1, a Pt layer was formed as the lower electrode layer 92 by the sputtering process at a substrate temperature of 600° C. As the lower electrode layer 92, the substratum conductor layer 92a was formed and the upper conductor layer 92b that defines the capacitance-producing region was formed in a portion of the substratum conductor layer 92a. On the lower electrode layer 92, an insulator layer 95 comprised of a dielectric material was formed as the insulator layer 95 by the use of a target comprised of $(Ba_{0.5}Sr_{0.5})$ $TiO_3$. This layer-forming deposition was performed at a substrate temperature of 600° C. for a deposition time of 15 minutes.

On the upper conductor layer 92b and the insulator layer 95, the thin film dielectric layer 3 was formed by the use of a target comprised of the same $(Ba_{0.5}Sr_{0.5})$ $TiO_3$. The substrate temperature was 600° C., and the deposition time was 15 minutes. After taken out from the sputtering apparatus, the product was heat-treated in the air at 900° C. for 600 minutes.

Finally, an Au electrode layer was formed as the upper electrode layer 4; and thus, a thin film capacitor was formed. As a result of the measurement made by an impedance analyzer, the capacitance was about 1 pF, and, as a result of the measurement made by a Pico-ammeter, the leakage current was on the order of $10^{-12}$ A; a thin film capacitor that had a small capacitance and had an excellent leakage characteristic was obtained.

It was confirmed that, in this capacitor, no step coverage defect existed in the respective electrode layers 4, 92 and the thin film dielectric layer 3, the loss of the electrode portions was lowered, and the capacitor could be used as a capacitance element stable even in a high frequency region.

Figure 15:
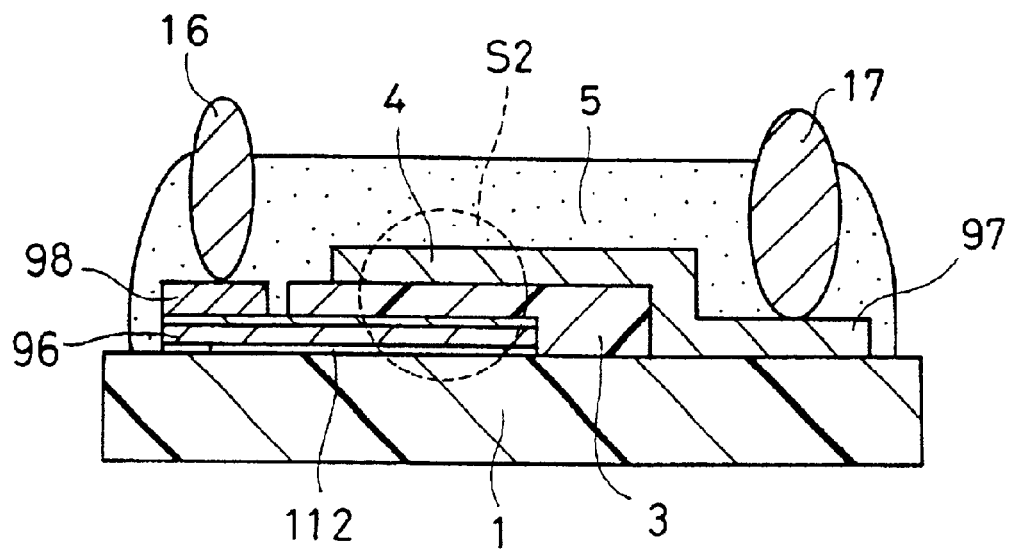
FIG. 15 is a sectional view of the tunable thin film capacitor of the ninth embodiment according to the present invention.
Figure 16:
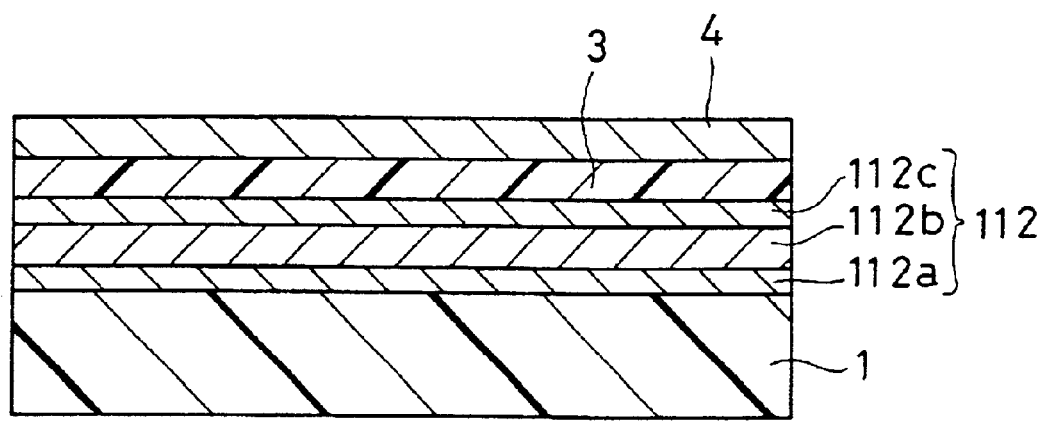
FIG. 16 is a sectional view of the essential portion of the tunable thin film capacitor of the ninth embodiment according to the invention.

FIG. 15 is a sectional view of the tunable thin film capacitor of the ninth embodiment according to the invention, and FIG. 16 is an enlarged sectional view of the capacitance-producing portion that is shown in a state encircled in FIG. 15. In this embodiment, the components that play the same or corresponding roles as in the above-described embodiments will be identified with the same reference symbols, and in some cases overlapping descriptions will be omitted.

Referring to the drawings, the reference numeral 1 denotes a support substrate, numeral 112 denotes a lower electrode layer, numeral 3 denotes a thin film dielectric layer, numeral 4 denotes an upper electrode layer, numeral 5 denotes a protective film, and numerals 16 and 17 denote external terminals. The lower electrode layer 112 has an extension terminal-disposing portion 96 so as to be able to stably conduct to the external terminal 16 that is connected to an external mother board or the like. Further, on this extension terminal-disposing portion 96 of the lower electrode layer 112, a terminal-disposing portion 98 formed at the same manufacturing step as the upper electrode layer 4 is provided. Further, the upper electrode layer 4 has an extension terminal-disposing portion 97 so as to be able to stably conduct with the external terminal 17 that is connected to an external mother board or the like.

In such a tunable thin film capacitor, the capacitance-producing region is a facing portion in which the thin film dielectric layer 3 is sandwiched between the lower electrode layer 112 and the upper electrode layer 4. In this embodiment, as in the case of the above-described embodiments, the capacitance-producing region is plurally provided and they are electrically connected to one another.

The support substrate 1 is a glass substrate, a ceramic substrate made of, e.g., alumina, a monocrystalline substrate made of, e.g., sapphire, a semiconductor substrate made of, e.g., Si, or the like. The material of the support substrate 1 is not particularly limited, but a glass substrate, an alumina ceramic substrate, a sapphire monocrystalline substrate, a silicon substrate, or the like is desirable in view of the strength, the easiness in processing, the price, etc.

On this support substrate 1, the material that will constitute the lower electrode layer 112 and the extension terminal-disposing portion 96 is formed by the thin film technique and patterned into a predetermined shape by the photolithography technique. This lower electrode layer 112 is constituted such that an adherent layer 112a, a thin film conductor layer 112b and a buffer layer 112c are successively laminated.

As the material of the buffer layer 112c, at least one of platinum, palladium and rhodium is used, but, in view of thermal and chemical stability, platinum is desirable. The thickness of the buffer layer 112c is at least 30 nm but not more than 0.5 μm and 6% or higher of the thickness of the thin film conductor layer 112b. In case that the thickness of the buffer layer 112c is less than 30 nm, the effect of preventing the change in properties of the thin film conductor layer, the oxidation thereof, and the reaction of thereof with the thin film dielectric layer 3 is reduced. Further, In case that the thickness of the buffer layer 112c is not more than 6% of the thickness of the thin film conductor layer 112b, the electrode surface is roughened by the change in properties of the thin film conductor layer 112b due to the high temperature during the manufacturing steps, which results in the occurrence of a leakage current, a short-circuit, the reaction with the dielectric layer. Further, in case that the thickness of the buffer layer 112c is larger than 0.5 μm, the thickness is too large, as a result of which, when the buffer layer 112c is formed by deposition, an internal stress is accumulated in the film thus formed, the peeling of the electrode, etc. are caused during the etching and heating steps. Further, since the material of the buffer layer 112c is a material whose conductivity is low as compared with that of the thin film conductor layer 112b, so that the conductivity falls, thus tending to increase the electrode loss of the lower electrode layer 112.

In order to manufacture the capacitor more stably, the thickness of the buffer layer 112c is desirably at least 40 nm but less than 0.5 $\mu$m and 10% or more of the thickness of the thin film conductor layer 112b.

As the material of the thin film conductor layer 112b, a high conductivity material like gold is used. This is because such a material has a good adherence to the materials constituting the buffer layer 112c and the adherent layer 112a and, further, is low in reactivity to the dielectric material of the thin film dielectric layer 3. On the thickness of the thin film conductor layer 112b, no particular limitation is placed as long as the thickness of the thin film conductor layer 112b is a thickness necessary for the capacitor to achieve a desirable Q-value; for example, the thickness is 0.1 to 5 $\mu$m. Further, this thickness is determined by taking into consideration the thickness of the other layers, i.e., the adherent layer 112a and the buffer layer 112c, that constitute the lower electrode layer 112. More specifically, in case the lower electrode layer 112 is extremely too thick, the step coverage defect of the thin film dielectric layer 3 is produced in the end portion of the lower electrode layer 112 when the thin film dielectric layer 3 is formed by deposition on the lower electrode layer 112.

As the material of the adherent layer 112a, at least one of platinum, palladium and rhodium is used, but it is desirable to use the same material as that of the buffer layer 112c in view of the matching in stress with the buffer layer 112c. The thickness of the adherent layer 112a is at least 5 nm but less than 0.5 $\mu$m and 12% or more of the thickness of the buffer layer 112c. In case that the thickness of the adherent layer 112a is less than 5 nm, the adherence of the adherent layer 112a to the support substrate 1 becomes poor, and thus, there are brought about problems such as, e.g., the peeling of the lower electrode layer 112. Further, in case that the thickness of the adherent layer 112a is more than 0.5 $\mu$m, the thickness is too large, as a result of which, when the adherent layer 112a is formed by deposition, an internal stress is accumulated in the thus formed film, and thus, at the etching and thermal steps, the peeling of the electrode, etc. are caused. Further, since the material of the adherent layer 112a is lower in conductivity as compared with the thin film conductor layer 112b, there is the tendency that the conductivity falls, and the electrode loss of the lower electrode layer 112 increases.

Further, in case that the thickness of the adherent layer 112a is less than 12% of the thickness of the buffer layer 112c, the stress caused by the buffer layer 112c cannot be cancelled out, as a result of which problems such as the peeling of the lower electrode layer 112 are caused.

In order to manufacture the capacitor more stably, the thickness of the adherent layer 112a should desirably be at least 10 nm but less than 0.5 $\mu$m, and the thickness of the buffer layer 112c should desirably be 50% or more.

The thin film dielectric layer 3 is fabricated by a thin film technology such as sputtering. The thin film technology includes, besides the sputtering process, the vacuum deposition process and the spin coating process using a sol-gel liquid. As the material of the thin film dielectric layer 3, a material with a high dielectric constant is desirable. Further, dielectric materials, such as, e.g., $BaTiO_3$, $SrTiO_3$ and $(BaSr)TiO_3$, whose dielectric constant can be changed by the external voltage applied across the lower electrode layer 112 and the upper electrode layer 4 are pointed out The thin film dielectric layer 3 is formed so as to cover the surface of the lower electrode layer 112, and then, the unnecessary portion thereof except the capacitance-producing region is removed by etching.

The upper electrode layer 4 and the terminal-disposing portions 97, 98 are formed by the use of Au or Ag as a conductor material. Besides this, Al, Cu, etc. can also be used. The thickness of the upper electrode layer 4 and the terminal-disposing portions 97, 98 is 0.1 to 5 $\mu$m. The lower limit of the thickness is set by taking the resistance of the electrode itself into consideration as in the case of the lower electrode layer 112. Further, the upper limit is set so as to prevent the occurrence of a peeling due to the concentration of the adhesion stress with respect to the member existing beneath when the upper electrode layer 4 is formed.

Further, by applying the lower electrode layer structure used in the tunable thin film capacitor according to the invention to the upper electrode layer for example, a strong upper electrode layer 4 that is low in reactivity to the thin film dielectric layer 3 and the external terminals 16, 17 comprised of solder can be obtained. Further, the tunable thin film capacitor according to the invention can alternatively be applied as a thin film resistor by changing the dielectric portion to, e.g., a resistor.

Embodiment 5

A sapphire R substrate was used as the support substrate 1, platinum was used as the material of the adherent layer 112a and the buffer layer 112c of the lower electrode layer 112, and gold was used as the material of the thin film conductor layer 112b. More specifically, by setting the substrate temperature of the support substrate 1 to 600° C., the lower electrode layer 112 was formed by the sputtering process. On the lower electrode layer 112, a thin film of BST was formed as the thin film dielectric layer 3 by the use of a target comprised of $(BaSr)Ti_xO_3$ (hereafter abbreviated to BST). Finally, by the sputtering process, the upper electrode layer 4 was formed of gold, thus forming a capacitor.

The characteristics of the thin film capacitor thus formed were measured at 1 MHz by the use of an impedance analyzer, the result of which is shown in FIG. 1.

TABLE 1

| Sample | Thickness of the adherent layer (nm) | Thickness of the thin film conductor layer (nm) | Thickness of the buffer layer (nm) | Dielectric constant | Q-value |
|---|---|---|---|---|---|
| 1 | 5 | 600 | 40 | 200 | 130 |
| 2 | 20 | 600 | 40 | 200 | 150 |
| 3* | 20 | 600 | 200 | Lower electrode peeled. | — |
| 4* | 20 | 800 | 40 | Short | — |
| 5 | 100 | 300 | 100 | 250 | 160 |
| 6* | 20 | 600 | 20 | Short | — |
| 7* | 0 | 300 | 40 | Lower electrode peeled. | — |
| 8 | 20 | 600 | 100 | 250 | 120 |
| 9 | 450 | 300 | 40 | 250 | 130 |

TABLE 1-continued

| Sample | Thickness of the adherent layer (nm) | Thickness of the thin film conductor layer (nm) | Thickness of the buffer layer (nm) | Dielectric constant | Q-value |
|---|---|---|---|---|---|
| 10* | 500 | 300 | 40 | Lower electrode peeled. | — |
| 11 | 100 | 300 | 450 | 250 | 120 |
| 12* | 100 | 300 | 500 | Lower electrode peeled. | — |

*Samples outside the technical scope of the invention.

As is apparent from Table 1, in the samples outside the technical scope of the invention, there occurred problems such as the peeling of the lower electrode layer 112 and short-circuits occurring in the thin film dielectric layers 3. Further, in the samples within the technical scope of the invention, troubles such as short-circuit, the peeling of the electrode, etc. were not caused, and good Q-values were obtained.

In the foregoing embodiment, a sapphire R was used as the material of the support substrate 1, platinum was used as the material of the lower electrode layer 112 (the adherent layer 112a and the buffer layer 112c) and gold was used as the material of (the thin film conductor layer 112b) of the lower electrode layer 112, BST was used as the dielectric material, and gold was used as the material of the upper electrode, but it was confirmed that, in case that palladium or rhodium were used as the materials of the adherent layer 112a and the buffer layer 112c of the lower electrode layer 112, similar results were likewise obtained.

Further, as the dielectric material, $TiO_2$, PZT, or PMN may also be used. The support substrate 1 is not limited to a sapphire substrate, either, but an alumina substrate, a glass substrate or a silicon substrate can also be used.

Further, the foregoing embodiment has been described with reference to a simple capacitor comprising only the support substrate 1, the lower electrode layer 112, the thin film dielectric layer 3, and the upper electrode layer 4 by way example, but the invention is not limited to this structure.

Figure 17:
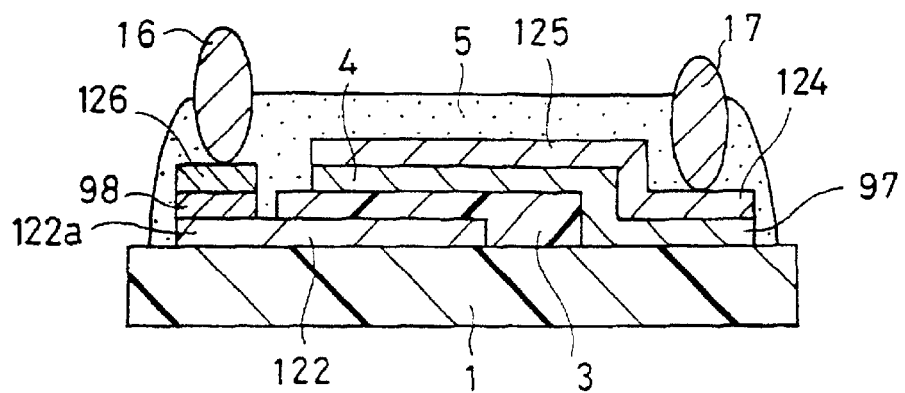
FIG. 17 is a sectional view of the tunable thin film capacitor of the tenth embodiment according to the invention.

FIG. 17 is a sectional view of the tunable thin film capacitor of the tenth embodiment according to the invention. In this embodiment, the components that play the same or corresponding roles as in the above-described embodiments will be identified with the same reference symbols, and in some cases overlapping descriptions will be omitted. Referring to FIG. 17, the reference numeral 1 denotes a support substrate, numeral 122 denotes a lower electrode layer, numeral 3 denotes a thin film dielectric layer whose dielectric constant is varied by the application of an external voltage, numeral 4 denotes an upper electrode layer, numeral 125 denotes an adherent layer, numeral 5 denotes a protective film, and numerals 16 and 17 denote external terminals. The lower electrode layer 122 has an extension terminal-disposing portion 122a so as to be stably conductible to the external terminal 16 that is connected to an external mother board or the like. Further, on this extension terminal-disposing portion 122a of the lower electrode layer 112, there are provided a terminal-disposing portion 98 that is formed by the same manufacturing step as that of the upper electrode layer 4, and a terminal-disposing portion 126 that is formed at the same manufacturing step as that of the adherent layer 125. The upper electrode layer 4 further has an extension terminal-disposing portion 97 so as to be stably conductible to the external terminal 17 that is connected to the external mother board or the like. Further, on this extension terminal-disposing portion 97 of the upper electrode layer 4, there is provided a terminal-disposing portion 124 that is formed by the same manufacturing step as that of the adherent layer 125.

In such a tunable thin film capacitor, the capacitance-producing region is a facing portion in which the thin film dielectric layer 3 is held between the lower electrode layer 122 and the upper electrode layer 4. In this embodiment, as in the case of the above-described embodiments, the capacitance-producing region is plurally provided and they are electrically connected to one another.

The support substrate 1 may be comprised of any material if it is electrically insulating; particularly suitable materials are $Al_2O_3$, sapphire, glass, MgO, $LaAlO_3$ and $SrTiO_3$.

On this support substrate 1, the lower electrode layer 122 and the extension terminal-disposing portion 122a are formed. As the conductor material for the lower electrode layer 122 and the extension terminal-disposing portion 122a, Au or Ag is suitable. Pt, Al, Cu, etc. can also be used, and the thickness thereof is 0.1 to 5 μm. For example, in case that the thickness is smaller than 0.1 μm, the resistance of the electrode itself increases, and at the same time, the continuity of the electrode is lost; and thus, the reliability is deteriorated. On the other hand, in case that the thickness is made larger than 5 μm, a step coverage defect (In the portion in which this electrode crosses the thin film dielectric layer, which will be described later, the thin film dielectric layer 3 is exposed) is produced, so that the upper electrode layer 4 and the lower electrode layer 122 are short-circuited to each other.

The thin film dielectric layers 3 are fabricated by a thin film technology such as sputtering. The thin film technology includes not only the sputtering process but also the vacuum evaporation process, and the spin coating process using a sol-gel liquid.

As the material of the thin film dielectric layer 3, a material that has a high dielectric constant is preferable, and in addition, a dielectric material such as, e.g., $BaTiO_3$, $SrTiO_3$, (Ba Sr) $TiO_3$, etc. whose dielectric constant can be changed by a voltage applied from outside can be pointed out.

The thin film dielectric layer 3 is formed, for example, so as to cover the surface of the lower electrode layer 122, and then, the unnecessary portion of the thin film dielectric layer 3 is removed by etching excepting the capacitance-producing region.

The upper electrode 4 and the terminal-disposing portions 97, 98 are formed by the use of Au or Ag as the conductor material thereof. Besides, Al, Cu, etc. can also be used. The thickness of the respective layers is set to 0.1 to 5 μm. The lower limit of the thickness is set by taking the resistance of the electrodes themselves into consideration as in the case of the lower electrode layer 122. Further, the upper limit of the thickness is set so as to prevent the occurrence of peeling due to the concentration of adhesion stress between the upper electrode layer 3 and the member existing there below when the upper electrode layer 3 is formed.

Further, as the conductor material for the adherent layer 125 and the terminal-disposing portions 124, 126, Pt and/or Pd are used. The thickness thereof is 0.01 to 1 μm. In case that the thickness of the adherent layer 125 and the terminal-disposing portions 124, 126 is less than 0.01 μm, the adherence thereof to the protective film 5 lowers. Further, the thickness is set so as to prevent the occurrence of peeling due to the residual stress that the terminal-disposing portions 124, 126 have.

Further, the protective film 5 is formed so as to expose portions of the terminal-disposing portions 124, 126. As the material of the protective film 5, $SiO_2$, SiN, BCB (benzocyclobutene), polyimide, etc. are suitable. Alternatively, the protective film 5 may be formed as a multi-layer structure comprised of these materials. This protective film 5 has the role of protecting the capacitor from mechanical shocks applied from outside and also the role of preventing the deterioration due to moisture, the contamination of chemicals, oxidation, etc. Moreover, the protective film 5 is kept in intimate contact with the surface of the support substrate 1. Thus, the protective film 5 is hard to peel off from the support substrate 1.

Further, as the external terminals 16, 17, the use of solder balls, metal bumps or the like can be pointed out by way of example. More specifically, it is permissible to form solder balls, for example, in the terminal-disposing portions 124, 126 exposed from the protective film 5 or to fast-bond metal wires to the exposed terminal-disposing portions 124, 126 and cut them to a predetermined length so as to form bumps of gold or the like.

In the tunable thin film capacitor according to the invention, the upper electrode layer 4 is a low-resistance conductor, so that the electrical resistance of the electrode of the upper electrode layer 4 can be decreased. In case that the reactance component of the capacitor is designated as X, the resistance thereof is designated as R, and the figure of merit thereof is designated as Q, Q is represented as $Q=|X|/R$, so that, by reducing the resistance R of the electrode, the Q-value of the capacitor can be increased.

The low-resistance conductor constituting the upper electrode layer 4 is superior in respect of its electrical resistance, but the adherence thereof to the protective film 5 is not good. Due to this, according to the invention, the adherent layer 125 is disposed in the interface between the upper electrode layer 4 and the protective film 5 to improve the adherence between the upper electrode layer 4 and the protective film 5.

As a result, the protective film 5 can protect the upper electrode layer 4 and the other element regions firmly and stably, and the moisture resistance of the whole capacitor can be enhanced; and thus, a tunable thin film capacitor with a high reliability can be realized.

Figure 18:
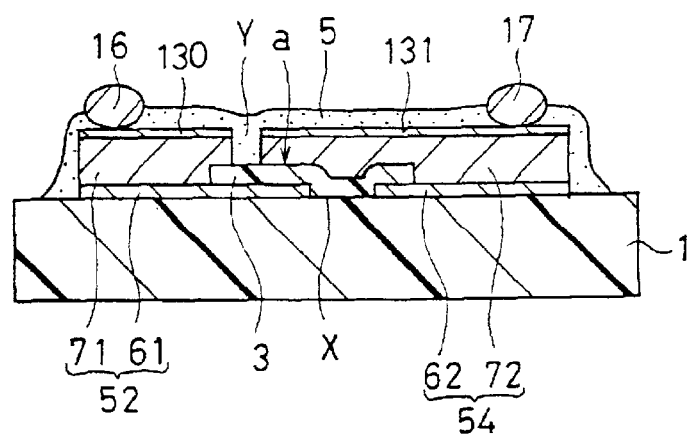
FIG. 18 is a sectional view of the tunable thin film capacitor of the eleventh embodiment according to the invention.

Further, by utilizing the change in the dielectric constant of the thin film dielectric layer 3 caused by applying an external voltage across the lower electrode 122 and the upper electrode layer 4, the capacitance characteristic of the capacitor is made variable, and in addition, coupled with the improvement in moisture resistance, the migration of the low-resistance conductor material of the upper electrode layer 4 can be effectively suppressed; and thus, the insulation resistance can be maintained at a fixed value or higher, whereby the occurrence of short-circuit due to a leakage current can be prevented. Thus, a tunable thin film capacitor with an excellent migration resistance and a high reliability can be realized. FIG. 18 is a sectional view of the tunable thin film capacitor of the eleventh embodiment according to the invention. The tunable thin film capacitor of this embodiment has basically the same structure as the tunable thin film capacitor of the fourth embodiment. A note worthy thing here is that the adherent layers 130, 131 are formed on the first and second thin film superstratum conductor layers 71, 72. In this construction, substantially the same effect as achieved in the tenth embodiment can be attained.

Embodiment 6

The tunable thin film capacitor shown in FIG. 17 was fabricated. On a sapphire substrate as the support substrate 1, a Pt layer with a thickness of 0.3 μm was deposited by the sputtering process for the formation of the lower electrode layer 122 and the terminal-disposing portion 122a, and the Pt layer was patterned by the photolithography technology. More concretely, a resist was applied to a predetermined shape, and then, the Pt layer was patterned by dry etching in the presence of Ar ions.

Subsequently, for the formation of the thin film dielectric layer 3, a (BaSr) $TiO_3$ film was deposited to a thickness of 0.3 μm by the sputtering process and patterned into the thin film dielectric layer 3 by the photolithography and wet-etching technique.

Subsequently, the upper electrode layer 4 and the terminal-disposing portions 97, 98 were formed by the same manufacturing step, and the adherent layer 125 and the terminal-disposing portions 124, 126 were formed by the same manufacturing step. More specifically, as the upper electrode layer 4 and the terminal-disposing portions 97, 98, an Au layer was deposited to a thickness of 1.2 μm by the sputtering process, and then, as the adherent layer 125 and the terminal-disposing portions 124, 126, a Pt layer was continuously formed to a thickness of 0.05 μm by the sputtering process, and, after the formation of the respective layers, they were patterned in the same method as in the case of the lower electrode layer 122 and the terminal-disposing portion 122a.

Subsequently, the protective film 5 was formed. First, an SiN film with a thickness of 0.2 μm was formed by the RF sputtering process, BCB was then applied by the spin coating process, and the SiN film was etched by exposure processing for patterning the SiN film so as to expose the terminal-disposing portions 124, 126.

Finally, on these terminal-disposing portions 124, 126, solder bumps were printed and reflow-processed; thus, the external terminals 16, 17 were formed in the form of solder bumps.

The facing area of the capacitance-producing region thus fabricated was set to 0.02 mm×0.01 mm.

As a result of evaluating the electrical characteristics of the tunable thin film capacitor, the electrostatic capacitance thereof was 2 pF, and the self-resonant frequency thereof was 5 GHz.

Figure 24:
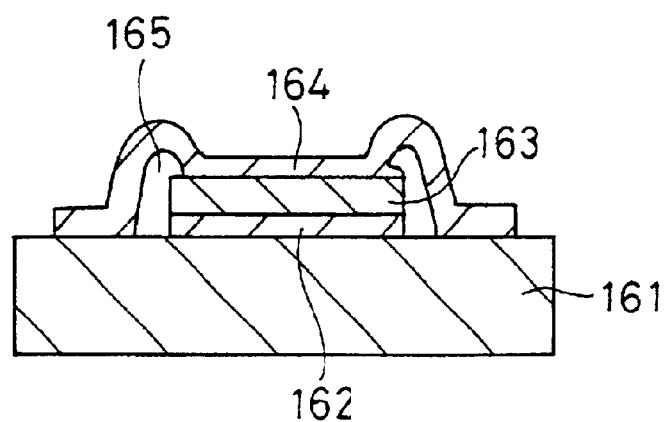
FIG. 24 is a sectional view of a known tunable thin film capacitor.
Figure 25:
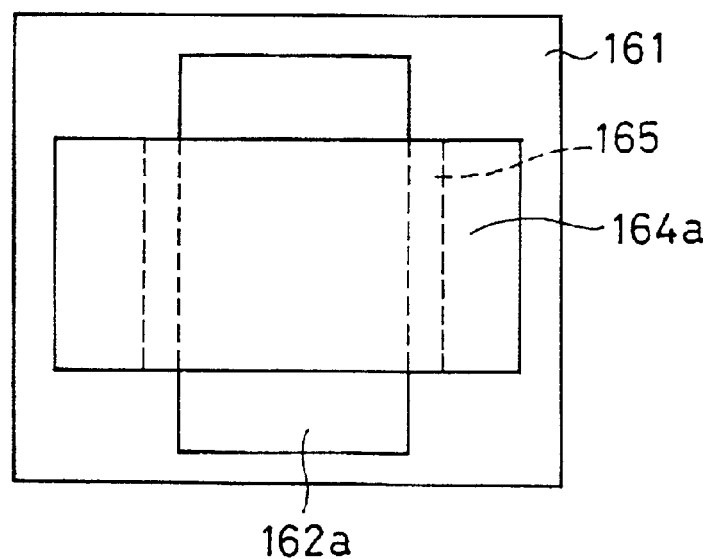
FIG. 25 is a plan view of the known tunable thin film capacitor.

In case that, in the known tunable thin film capacitor shown in FIG. 24, the facing area of the capacitance-producing region was set to 0.02 mm×0.01 mm, the electrostatic capacitance thereof was 2 pF, and the self-resonant frequency thereof was 3 GHz.

In other words, in the tunable thin film capacitor according to the invention, the parasitic inductance could be reduced as compared with the known capacitors, so that the self-resonant frequency could be enhanced.

Further, the insulation resistance of the tunable thin film capacitor according to the invention which had been placed under the application of a 85% moisture for a predetermined time was measured, as a result of which it was found that the insulation resistance thus measured was the same as the insulation resistance value before the moisture application.

For comparison's sake, a tunable thin film capacitor in which the adherent layer 125 and the terminal-disposing portions 124, 126 were not formed was fabricated and placed under the application of a 85% moisture for the same length of time; and the insulation resistance of this tunable thin film capacitor was measured, as a result of which it was found that the insulation resistance fell to ⅒ of the insulation resistance value before the moisture application.

This was because, in the case of the tunable thin film capacitor according to the invention, the adherence between the low-resistance upper electrode layer 4 and the protective film 5 was enhanced due to the existence of the adherent layer 125, and thus, the protective film 5 effectively prevented the infiltration of water.

Further, in the tunable thin film capacitor according to the invention, an external control voltage was applied across the lower electrode layer 122 and the upper electrode layer 4 through the external terminals 16, 17 in order to control the dielectric constant of the thin film dielectric layer 3. When the external control voltage was 10 V, the dielectric constant of the thin film dielectric layer 3 could be reduced by so much as 26% as compared with that in case that no external control was applied. As the external control voltage was further increased, the dielectric constant was further reduced; and, when the external control voltage was 30 V, a short-circuit took place in the thin film dielectric layer 3 of the tunable thin film capacitor.

In contrast, in the case of the tunable thin film capacitor with no adherent layer, when the external control voltage was 10V, the dielectric constant of the thin film dielectric layer 3 could be reduced by so much as 26%, but, when the external control voltage was 20 V, a short-circuit took place in the tunable thin film capacitor.

In the tunable thin film capacitor according to the invention, due to the formation of the adherent layer 125, the withstand voltage of the thin film dielectric layer 3 can be enhanced, the allowable voltage range of the external control voltage can be widened, and the range of change in the dielectric constant of the thin film dielectric layer 3 can be widened.

Figure 19:
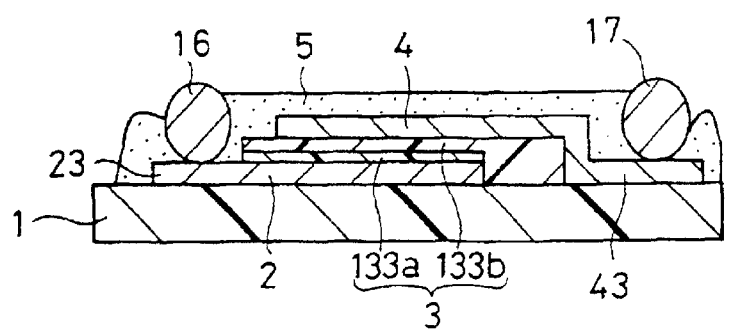
FIG. 19 is a sectional view of the tunable thin film capacitor of the twelfth embodiment according to the invention.

FIG. 19 is a sectional view of the tunable thin film capacitor of the twelfth embodiment according to the present invention. Note that the tunable thin film capacitor of this embodiment is substantially identical in plane figure with the tunable thin film capacitor shown in FIG. 2. In this embodiment, the components that play the same or corresponding roles as in the above-described embodiments will be identified with the same reference symbols, and in some cases overlapping descriptions will be omitted.

Referring to FIG. 2 and FIG. 19, the reference numeral 1 denotes a support substrate, numerals 21 and 22 denote lower electrode layers (In FIG. 19, simply referenced by the numeral 2), numeral 23 denotes a lower terminal electrode layer, numerals 31 and 32 denote thin film dielectric layers (In FIG. 19, simply referenced by the numeral 3), numerals 41 and 42 denote upper electrode layers (In FIG. 19, the whole upper electrode layer is collectively referenced by the numeral 4), numeral 5 denotes a protective layer, and numerals 16 and 17 denote external terminals.

Further, as shown in FIG. 2, the capacitance-producing regions refer to a facing portion of the thin film dielectric layer 31 that is sandwiched between the lower electrode layer 21 and the upper electrode layer 41 and to a facing portion of the thin film dielectric layer 32 that is sandwiched between the lower electrode layer 22 and the upper electrode layer 42. In FIG. 2, two capacitance-producing regions a and b are provided.

The support substrate 1 is a ceramic substrate made of, e.g., alumina, a monocrystalline substrate made of, e.g., sapphire, or the like, and, on the surface of the support substrate 1, lower electrode layers 21, 22 and a lower terminal electrode layer 23 are formed. In particular, the lower electrode layers 21, 22 constituting capacitance-producing regions a, b are comprised of Pt, Au or a solid solution orientated in the (111) plane. Further, an adherent layer made of Ti, $TiO_2$ or the like may be interposed between the support substrate 1 and the lower electrode layers 21, 22. The thickness of the lower electrode layers 21, 22 and the lower terminal electrode layer 23 is 1 μm or more and should desirably be 3 μm or more in view of reducing the dielectric loss due to the lower electrode layers 21, 22, the thickness. For example, in order to ensure that, in the lower electrode layers, the (111) plane of Pt is preferentially orientated, a sapphire R monocrystalline substrate is used as the support substrate 1, and, on the surface thereof, the lower electrode layers 21, 22 are formed of Pt by the sputtering process at 150° C. to 600° C. On these lower electrode layers 21, 22, thin film dielectric layers 31, 32 are formed.

The thin film dielectric layers 31, 32 are comprised of perovskite-type oxide crystal grains containing at least Ba, Sr and Ti, and the crystal grains are disposed in the (111) plane. By applying an external control voltage to these thin film dielectric layers 31, 32, the dielectric constant of the thin film dielectric layers 31, 32 themselves can be variably controlled. In the perovskite-type oxide constituting these thin film dielectric layers 31, 32, the range of x in $(Ba_xSr_{1-x})TiO_3$ is 0.4 to 0.6. Here, in case that the range of x is below 0.4, the influence of $SrTi_3$ increases, so that the rate of change of the dielectric constant when the external control voltage is applied decreases. Further, in case that the range of x is larger than 0.6, the influence by $BaTiO_3$ increases, so that the temperature characteristic is deteriorated.

The thickness of these thin film dielectric layers 31, 32 is desirably 1 μm or less, and the average grain diameter in the film surface direction of the dielectric crystal grains constituting the thin film dielectric layers 31, 32 is less than 0.5 μm.

The reason for setting the thickness of the thin film dielectric layers 31, 32 to 1 μm or less is that, in case that the thickness is larger than 1 μm, the time required for sputtering for forming the thin film becomes long, and, in case that the variable capacitance capacitor has been formed, the voltage to be applied for changing the capacitance becomes large.

Further, the thin film dielectric layers 31, 32 each comprises a laminated structure of a lower dielectric layer 133a and an upper dielectric layer 133b. The lower dielectric layer 133a is a layer for determining the orientation direction of the thin film dielectric layers 31, 32, and the upper dielectric layer 133b is a layer formed following the orientation of the lower dielectric layer 133a. Further, the thickness of the lower dielectric layer 133a is ½ or less—for example, 0.5 μm or less—of the whole thickness of the thin film dielectric layers 31, 32. The thickness of the upper dielectric layer 133b is the remaining thickness.

The reason why the average grain diameter in the film surface direction of the dielectric crystal grains of the thin film dielectric layers 31, 32 is set to be less than 0.5 μm is that the dielectric constant of the thin film dielectric layers 31, 32 increases depending on the grain diameter, and in addition, in the case of the same material, the loss increases in proportion to the dielectric constant, and thus, the larger the grain diameter becomes, the greater the dielectric constant becomes, as a result of which the loss is increased.

Here, the thin film dielectric layers 31, 32 are fabricated in the following manner, for example: As the target for sputtering, a sintered material comprising a perovskite-type oxide crystal grains containing at least Ba, Sr and Ti is used. As the sputtering apparatus, an RF sputtering apparatus is used for sputtering the sintered compact of an oxide that is electrically insulating. First, the lower dielectric layer 133a is formed. The lower dielectric layer 133a is fabricated by the use of a target of the same composition as the thin film dielectric layers 31, 32, and the thickness of the lower dielectric layer 133a is set to ½ or less of the whole thickness of the dielectric layers. The target and the substrate 1 are set in the chamber of the sputtering apparatus in order to perform sputtering, and, after evacuation of the chamber, the support substrate 1 is heated by a heater at the back surface side of the substrate 1. In order to prevent the elimination of the oxygen from the dielectric film, which will become the lower dielectric layer 133a, deposited on the substrate during the sputtering, a reactive sputtering process using a mixture gas consisting of argon and oxygen is employed as the sputtering atmosphere. After the sputtering is over, the support substrate 1 is taken out from the chamber and heat-treated in an atmosphere furnace at 700° C. to 1000° C. for several minutes to about one hour. Here, the reason why the thickness of the lower dielectric layer 133a is set to ½ or less of the whole thickness of the thin film dielectric layers is that, in case that the thickness is larger than this, heat treatment for a longer time is needed; for shortening the heat treatment time, it is desirable to set the thickness of the lower dielectric layer 133a to about ⅟₁₀ or less of the whole thickness of the thin film dielectric layers 31, 32.

Further, since the lower electrode layers 21, 22 are comprised of Pt, Au or an alloy thereof orientated in the (111), the orientation of the lower dielectric layer 133a thus heat-treated is the (111) orientation.

Next, in order to form the thin film dielectric layers 31, 32 with a predetermined thickness on the lower dielectric layer 133a, sputtering is again performed on the same condition. Since the upper dielectric layer 133b is formed on the lower dielectric layer 133a in which the (111) plane is orientated is formed, the upper dielectric layer 133b follows this orientation and becomes the dielectric layer 133b in which the (111) plane is orientated. In other words, the thin film dielectric layers 31, 32 comprising the lower dielectric layer 133a and the upper dielectric layer 133b become, as a whole, a dielectric layer in which the (111) plane is orientated.

Upper electrode layers 41, 42 and an upper terminal electrode layer 43 are formed extending over the upper surfaces of these thin film dielectric layers 31, 32 and the support substrate 1.

The upper electrode layers 41, 42 and the upper terminal electrode layer 43 are comprised of Pt, Au or a solid solution thereof. Further, between the substrate 1 and the upper electrode layers 41, 42 as well as the upper terminal electrode layer 43, an adherent layer made of Ti, $TiO_2$ or the like may be interposed. The thickness of the upper electrode layers 41, 42 is 1 μm or more and, more preferably, 3 μm or more in view of reducing the conductor loss.

Embodiment 7

On a sapphire R substrate as the support substrate 1, the lower electrode layer was formed of Pt by the sputtering process at a substrate temperature of 600° C. On the lower electrode layer, the lower dielectric layer 133a of BST was formed by the use of a target comprising $(Ba_xSr_{1-x})TiO_3$ (wherein x is 0.4 to 0.6). The substrate temperature was 600° C., and the deposition time was 4 minutes, and, after the product was taken out from the sputtering apparatus and then heat-treated in the air at 900° C. for 60 minutes. Further, again, sputtering was performed for 40 minutes under the same condition, whereby the upper dielectric layer 133b made of BST was formed. Finally, as the upper electrode layers 41, 42, Au electrode layers were formed, whereby a capacitor was formed. Further, at the time of forming the lower electrode layer, the lower terminal electrode layer 23 was formed, and, at the time of forming the upper electrode layers, the upper terminal electrode layer 43 was formed.

Then, in such a variable capacitance capacitor, the orientation of the lower electrode layers 21, 22 comprised of Pt and the thin film dielectric layers 31, 32 comprising the lower dielectric layer 133a and the upper dielectric layer 133b was checked by X-ray diffraction.

Further, by observation of the section SEM and the section TEM, the thickness of the thin film dielectric layers 31, 32 was measured, and moreover, the average grain diameter in the film surface direction of the perovskite grains was measured. The measurement of the dielectric characteristic was made by the use of an impedance analyzer. As for the loss, the values thereof at 100 MHz are shown in Table 2. As for the rate of change of the dielectric constant, the value thereof at the time of applying 10 V was measured.

TABLE 2

| Sample | X | Substratum layer | Heat treatment | Diameter in the film surface direction | Loss |
|---|---|---|---|---|---|
| 4 | 0.4 | Present | Not made | 0.2 μm | 0.6% |
| 5 | 0.5 | Present | Not made | 0.2 μm | 0.8% |
| 6 | 0.6 | Present | Not made | 0.2 μm | 0.9% |
| 7* | 0.5 | Absent | Not made | 0.2 μm | 2.5% |
| 8* | 0.5 | Absent | 900° C., 600 min | 0.6 μm | 1.4% |

The mark "*" indicates samples outside the technical scope of the present invention.

As samples according to Comparative Examples, there are shown those samples (Sample Nos. 17 and 18) in which no lower dielectric layer of BST is formed, that is, dielectric layers are formed through the series of manufacturing steps. Further, heat treatment was performed to the whole dielectric layer for a long time (900° C., 600 minutes) (Sample No. 5).

As a result, it was found that, in all the samples, the lower electrode layers 21, 22 were orientated in the (111) plane.

Further, those samples in which the dielectric layers of BST were heat treated as in case of Sample No. 1 to 3 were orientated in the (111) plane, but a sample in which the dielectric layer of BST that was not heat treated as in the case of Sample No. 4 was orientated in the (110) plane.

The grain diameter in the film surface direction of the crystal grains of BST was more than 0.5 μm in the sample (Sample No. 18) which was subjected to heat treatment for a long time, but the grain diameter was less than 0.5 μmin the case of the samples (Sample Nos. 14 to 17) which were subjected to no heat treatment and subjected to heat treatment for a short time. In the case of the samples (Sample Nos. 14 to 16) in which the lower dielectric layer 133a was formed by heat treatment for a short time, the loss was 1% or less.

In the case of the sample (Sample No. 18) which was subjected to heat treatment for a long time, the average grain diameter in the film surface direction was large, and the loss was also large. In the samples which were not subjected to heat treatment, the grain diameters remained small, but a large number of lattice defects of oxygen exist, so that the loss was large. Further, as for the rate of change of the dielectric constant, the samples showed high values of 20% or more regardless of the fabrication conditions.

As mentioned above, the thin film dielectric layers 31, 32 constituting the tunable thin film capacitor according to the invention are obtained in such a manner that, on the lower electrode layers 21, 22 comprised of Pt, Au or a solid solution thereof orientated in the (111) plane, a dielectric layer that is orientated in the (111) plane by a heat treatment for a short time is formed as the lower dielectric layer 133a, and then, an upper dielectric layer 133b is formed again. Accordingly, according to the tunable thin film capacitor of the invention, the deterioration in the dielectric loss due to the lattice defects of oxygen or the production itself of the lattice defects of oxygen, which were caused in the known tunable thin film capacitor, can be suppressed. Further, the heat treatment extending over a long time which was needed in the case of the known tunable thin film capacitor is not needed any more, and thus, a large quantity of tunable thin film capacitors can be fabricated efficiently and at low costs.

The foregoing embodiment has been described, by way of example, with reference to a variable capacitance capacitor constituted such that the capacitance-producing region is divided into a plurality of capacitance-producing regions, but the invention is not limited to this structure but can also be applied to variable capacitance capacitors of every structure that comprises a lower electrode layer, a thin film dielectric layer and an upper electrode layer.

Further, in the embodiment shown in FIG. 2, the value of x in the perovskite-type oxide, (BaSr) $Ti_xO_3$) that constitutes these thin film dielectric layers 31, 32 may range from 0.7 to 0.9. Here, in case that the range of x is less than 0.7, the deviation from the specified composition range is too large, so that the perovskite structure can not be maintained and the electric characteristic is lost. Further, in case that the range of x is more than 0.9, the effect brought about by the reduction of Ti is small, and the dielectric loss increases.

The thin film dielectric layers 31, 32 are fabricated in the following manner, for example: As the target in sputtering, a sintered material comprising perovskite-type oxide crystal grains containing at least Ba, Sr and Ti is used. The composition of the sintered material is defined by (BaSr) $Ti_xO_3$ wherein the range of x is 0.7 to 0.9. The sputtering apparatus sputters a sintered compact of an oxide that is electrically insulating, so that an RF sputtering is used. In order to perform sputtering, the target and the support substrate 1 are disposed in the chamber of the sputtering apparatus, and, after evacuating the chamber, the substrate is heated by the heater on the back surface side of the substrate.

The temperature at this time is set to 400° C. to 600° C. In order to prevent the elimination of oxygen from the film deposited on the substrate during the sputtering, the reactive sputtering method using a mixture gas consisting of argon and oxygen is employed as the sputtering atmosphere.

Here, the lower electrode layers 21, 22 are composed of Pt, Au or an alloy of them that is orientated in the (111) plane. By sputtering the thin film dielectric layers 31, 32, under the same condition as the above-mentioned condition, on the lower electrode layers 21, 22 made of Pt, Au or the like that is orientated in the (111) plane, the thin film dielectric layers 31, 32 can be orientated in the (110) plane.

Embodiment 8

As the support substrate 1, a sapphire R substrate was used, and, as the lower electrode layers 21, 22, Pt electrode layers were used. More specifically, the substrate temperature of the support substrate was set to 600° C., the lower electrode layers 21, 22 were formed by sputtering Pt. On the thus formed lower electrodes 21, 22, a thin film of BST was formed, using a target comprised of (BaSr) $Ti_xO_3$ (wherein x is 0.7 to 0.9).

The substrate temperature was 400° C. or 600° C., and the deposition time was 44 minutes.

Finally, by sputtering Au, the upper electrode layers 41, 42 were formed, whereby a capacitor was formed. Further, at the time of forming the lower electrode layers, the lower terminal electrode layer 23 was formed simultaneously, and, at the time of forming the upper electrode layers, the upper terminal electrode layer 43 was formed.

Then, by subjecting the thus formed tunable thin film capacitor to X-ray diffraction, the orientation of the lower electrode layers 21, 22 comprised of Pt and the thin film dielectric layers 31, 32 was checked.

Further, by observing the section SEM and the section TEM, the thickness of the thin film dielectric layers was measured, and the average grain diameter in the film surface direction of the perovskite grains was measured. The measurement of the dielectric characteristic was made by the use of an impedance analyzer. Table 3 shows the result obtained through the measurement of the dielectric loss and the rate of change of the dielectric constant made at 100 MHz.

TABLE 3

| Sample | x | Sputtering temperature | Diameter in the film surface direction | Dielectric loss | Rate of change of the dielectric constant |
|---|---|---|---|---|---|
| 19 | 0.90 | 600° C. | 0.4 µm | 0.9% | ○ |
| 20 | 0.85 | 400° C. | 0.2 µm | 0.7% | ○ |
| 21 | 0.70 | 400° C. | 0.2 µm | 0.9% | ○ |
| 22* | 1.00 | 400° C. | 0.2 µm | 2.2% | ○ |
| 23* | 0.60 | 400° C. | 0.2 µm | 0.8% | X |
| 24* | 0.85 | 300° C. | 0.2 µm | 0.7% | X |
| 25* | 0.85 | 700° C. | 0.6 µm | 1.9% | ○ |

Mark "*" indicates samples outside the technical scope of the invention.

As for the rate of change of the dielectric constant, the mark "○" indicates the cases where the values observed by application of 10V are larger by 20% or more as compared with the dielectric constant exhibited when no voltage is applied.

As comparative examples, samples in each of which x in (BaSr) $Ti_xO_3$ was an arbitrary value between 0.6 to 1.0, and sputtering was performed at a predetermined substrate temperature of from 300° C. to 700° C. were evaluated.

It was confirmed that the lower electrode layers 21, 22 (2), on which the thin film dielectric layer 3 (31, 32) was formed, were orientated in the (111) plane in all the samples. Those samples in which the thin film dielectric layers 3 made of BST were sputtered at substrate temperatures of 600° C. or below, were orientated in the (110) plane, but samples in which the thin film dielectric layers were sputtered at 700° C. as in the case of Sample No. 25 were orientated in the (111) plane, and the average grain diameter in the film surface direction of the crystal grains of BST became 0.6 µm in all the samples. As a result, the dielectric loss became so large as 1.9%. Further, the dielectric loss was less than 1% in the samples other than those samples of which the thin film dielectric layers 3 were formed by sputtering at a sputtering temperature of 700° C. or below and the samples of which x in (BaSr) $Ti_xO_3$ was 1.0. In those samples of which the dielectric layers were formed by sputtering at 700° C., the average grain diameters in the film surface direction were 0.5 μm or larger, and the dielectric constants became large, as a result of which the dielectric losses increased. Further, in a sample (Sample No. 24) of which the dielectric layer was formed at 300° C., the grain boundaries were unclear, and the change rate of the dielectric constant of the thin film dielectric layer 3 became 20% or less.

Further, in case of the thin film dielectric layer 3(Sample No. 22) in which x in (BaSr) $Ti_xO_3$ is 1.0, the influence by the lattice defects of oxygen takes effect, though the sputtering temperature was 300 to 700° C., and thus, the dielectric loss became so large as 2.2%. Further, in the case of a thin film dielectric layer 3 (Sample No. 23) in which x is 0.6, the rate of change of the dielectric constant of the dielectric became less than 20%.

As a result of examining various points as mentioned above, it is found that, by setting the sputtering temperature to 400 to 600° C. and setting x in (BaSr) $Ti_xO_3$ within the range of 0.7 to 0.90, the dielectric loss becomes 1.0% or less, and there can be obtained a dielectric constant change rate larger of 20% or more by application of 10 V, as compared with the state in which no external control voltage is applied.

By setting x in (BaSr) $Ti_xO_3$ within the range of 0.7 to 0.90, shift is made to the direction for increasing Ti, the perovskite structure becomes easy to be maintained, the rate of change of the dielectric constant is increased, and in addition, the dielectric loss is reduced. Further, the thin film dielectric layer which was formed by sputtering at 300° C. is not perfectly crystallized, and the rate of change of the dielectric constant becomes small. Therefore, by performing the sputtering at 400° C. or higher, crystallization can be achieved, and the rage of change of the dielectric constant can be increased. Further, in case that the sputtering is performed at 700° C., the average grain diameter in the film surface direction becomes 0.5 μm or larger as mentioned above, and the dielectric constant increases, as a result of which the dielectric loss increases.

In the case of the thin film dielectric layer 3 (Sample No. 23) that was subjected to heat treatment extending over a long time, the grain diameter in the film surface direction increased, and the dielectric loss also increased. In a sample that was not subjected to heat treatment, the grain diameter remained small, but the dielectric loss became large since large number of lattice defects of oxygen existed. Further, the rate of change of the dielectric constant assumed a value higher by 20% or more, regardless of the fabricating condition.

As described above, the thin film dielectric layer 3 (31, 32) of the tunable thin film capacitor according to the invention can be formed, by a short-time processing, as a thin film dielectric layer 3 orientated in the (110) plane, on the lower electrode layer 2 (21, 22) comprised of Pt, Au or a solid solution thereof orientated in the (111) plane; and thus, the deterioration in respect of the dielectric loss due to the lattice defects of oxygen or the occurrence itself of the lattice defects of oxygen, which inconveniences took place in the known variable capacitance capacitor, can be suppressed.

Further, heat treatment for a long time that was necessary in the case of the known technique need not be performed, and a large amount of tunable thin film capacitor s can be fabricated efficiently and at low costs.

The foregoing embodiment has been described by way of example concerning a tunable thin film capacitor of the structure in which the capacitance-producing region is divided into a plurality of regions, but the invention is not limited to this structure and can also be applied to tunable thin film capacitors of all structures that each have a lower electrode layer, a dielectric layer and an upper electrode layer.

In the embodiment shown in FIG. 2, the thin film dielectric layers 31, 32 are comprised of perovskite-type oxide crystal grains containing at least Ba, Sr and Ti and may be formed in a randomly orientated state. By applying an external control voltage to these thin film dielectric layers 31, 32, the dielectric constant of the thin film dielectric layers 31, 32 themselves can be variably controlled.

The crystal grains of the thin film dielectric layers 31, 32 are formed into amorphous dielectric layers by sputtering at a low temperature of 200° C. or below and crystallized by a subsequent heat treatment. The perovskite-type oxide grains after crystallized are in a randomly orientated state (the state in which the dielectric crystal grains constituting the dielectric layers are not orientated in any specific crystal plane).

Further, in the perovskite-type oxide constituting these thin film dielectric layers 31, 32, the range of x in $(Ba_xSr_{1-x})TiO_3$ is 0.4 to 0.6. This is because, in case that the range of x is smaller than 0.4, the influence by $SrTiO_3$ increases, and the rate of change of the dielectric constant reduces, while, in case that the range of x is larger than 0.6, the influence by $BaTiO_3$ increases, and the temperature characteristic is deteriorated.

The thin film dielectric layers 31, 32 are fabricated in the following manner, for example: A sintered material comprising perovskite-type oxide crystal grains containing at least Ba, Sr and Ti is used as a target. As the sputtering apparatus, an RF sputtering apparatus is used for sputtering a sintered compact of an oxide that is electrically insulating. First, an amorphous dielectric layer that has the same composition as the perovskite-type oxide is formed. The target for sputtering and the support substrate 1 are disposed in the chamber of the sputtering apparatus, and, after evacuating the interior of the chamber, the support substrate 1 is heated by a heater on the back surface side of the substrate. In case that the sputtering is performed at room temperature, the heating by the heater is not performed, and the substrate may be water-cooled during the sputtering. In order to prevent the elimination of the oxygen from the film deposited on the substrate during the sputtering, the reactive sputtering processing using a mixture gas of argon and oxygen is used as the sputtering atmosphere. After the termination of the sputtering, the substrate is taken out from the chamber. In this way, a dielectric layer in an amorphous state is obtained. The dielectric layer is then heat-treated in an atmosphere furnace at 700° C. to 1000° C. for several tens of seconds to about one hour. By this heat treatment, the amorphous dielectric layers are crystallized, and thus, a thin film dielectric layer comprising a perovskite-type oxide that is not orientated in any specific plane orientation is obtained. In the perovskite-type oxide constituting the thin film dielectric layers 31, 32, the range of x in $(Ba_xSr_{1-x})TiO_3$ is 0.4 to 0.6. This is because, in case that the range of x is below 0.4, the influence by $SrTiO_3$ increases, and the rate of change of the dielectric constant when the external control voltage is applied decreases, while, in case that the range of x is larger than 0.6, the influence by the $BaTiO_3$ increases, so that the temperature characteristic is deteriorated.

Embodiment 9

As the support substrate 1, a sapphire R substrate was used, and, as the lower electrode layers 21, 22 (2), Pt layers were used. Further, on the support substrate 1 on which this lower electrode layer 2 was formed, an amorphous dielectric layer of BST was deposited by the sputtering process using a target comprised of (BaSr) TiO$_3$. In this sputtering process, the heating of the substrate by a heater was not performed. Due to this, the substrate temperature was room temperature, and an amorphous dielectric layer was formed, spending a deposition time of 44 minutes. After taken out from the sputtering apparatus, the amorphous dielectric layer was heat-treated in the air at 900° C. for one minute to 600 minutes. As a result, the amorphous dielectric layer was crystallized, and thus, the thin film dielectric layer 3 (31, 32) comprised of a perovskite-type oxide that was not orientated in any specific plane orientation. Further, on the thin film dielectric layer 3, the upper electrode layer 41, 42 (4) comprised of Au was formed, whereby a capacitor was formed. At the time of forming the lower electrode layer, the lower terminal electrode layer 23 was simultaneously formed, and, at the time of forming the upper electrode layer, the upper terminal electrode layer 43 was formed.

Then the tunable thin film capacitor thus formed was subjected to X-ray diffraction to check the orientation of the lower electrode layer 2 comprised of Pt and the thin film dielectric layer 3. Further, by the observation of the cross section SEM and the cross section TEM, the thickness of the dielectric layer was measured, and further, the average grain diameter in the film surface direction of the perovskite grains was measured. The measurement of the dielectric characteristic was performed by the use of an impedance analyzer. As for the loss, the values thereof assumed at 100 MHz are shown in Table 4. As for the rate of change of the dielectric constant, the values thereof observed when 10 V was applied were measured.

TABLE 4

| Sample | Sputtering temperature | Heat treatment time | Grain diameter | Loss |
| --- | --- | --- | --- | --- |
| 26 | Room temperature | 1 min. | 0.2 μm | 0.6% |
| 27 | Room temperature | 60 min. | 0.4 μm | 0.8% |
| 28* | Room temperature | 600 min. | 0.8 μm | 1.5% |
| 29* | 400° C. | 1 min. | 0.2 μm | 2.0% |
| 30* | 400° C. | 60 min. | 0.5 μm | 1.8% |
| 31* | 400° C. | 600 min. | 0.9 μm | 1.4% |

The mark "*" means samples outside the technical scope of the invention.

As comparative examples, thin films of BST formed by sputtering at 400° C. and heat-treated were evaluated (Sample Nos. 29 to 31). The lower electrode layers 2 of all the samples were orientated in the (111) plane.

Those BST thin films that were formed by sputtering at room temperature and heat-treated were not orientated in any specific plane (Sample No. 26 and 27). Those BST thin films which were formed by sputtering at 400° C. and heat-treated were orientated in the (110) plane. Further, in case that the heat treatment time was so long as 600 minutes (Sample No. 28), the BST dielectric layer was orientated in the (111) plane.

In those BST thin films that were formed by sputtering at room temperature and heat-treated, the average grain diameters in the film surface direction of the crystal grains were less than 0.5 μm in case that heat treatment time was short, but, in case that heat treatment was performed for a long time as in Sample No. 28, the grain diameter of the crystal grains became 0.5 μm or more due to the growth of crystal grains.

In those BST thin films that were formed by sputtering at 400° C. and heat-treated (Sample No. 29 to 31), the crystal grains were columnar grains that were long in the film thickness direction, and the average grain diameters in the film surface direction of the crystal grains were less than 0.5 μm in case that heat treatment was performed for a short time but were 0.5 μm or more in case heat treatment was performed for a long time.

The dielectric loss was 1% or less in the samples (Sample Nos. 26 and 27) that were formed by sputtering at room temperature and heat-treated for a short time, but the dielectric loss was less than 1% in a sample (Sample No. 28) that was formed by sputtering at room temperature and heat-treated for a long time and in those samples (Sample No. 29 to 31) that were formed by sputtering at 400° C. This is because, in case that grain growth of crystal grains takes place through a long-time heat treatment, the dielectric constant becomes large, while, conversely, the dielectric loss increases. Further, in a sample that was formed by sputtering at 400° C. and by a heat treatment for a short time, the lattice defects of oxygen were not decreased, nor was the dielectric loss lowered. The rate of change of the dielectric constant when an external control voltage was applied to the dielectric layer assumed a value so high as 20% or more, regardless of the fabricating condition.

As described above, the thin film dielectric layer 3 (31, 32) constituting the tunable thin film capacitor according to the invention can be obtained, on the lower electrode layer 2 (21, 22) comprising a Pt, Au or a solid solution thereof orientated in the (111) plane, as a thin film dielectric layer 3 constituted such that the deterioration in the dielectric loss due to the lattice defects of oxygen or the generation itself of the lattice defects of oxygen is suppressed by a short-time heat treatment.

Figure 20:
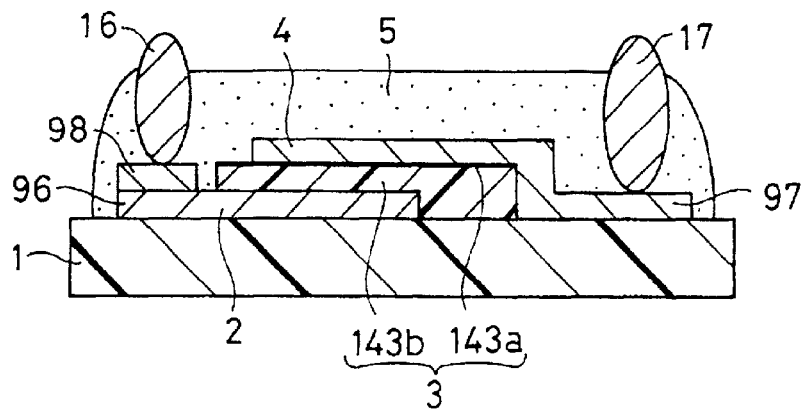
FIG. 20 is a sectional view of the tunable thin film capacitor of the thirteenth embodiment according to the invention.
Figure 21:
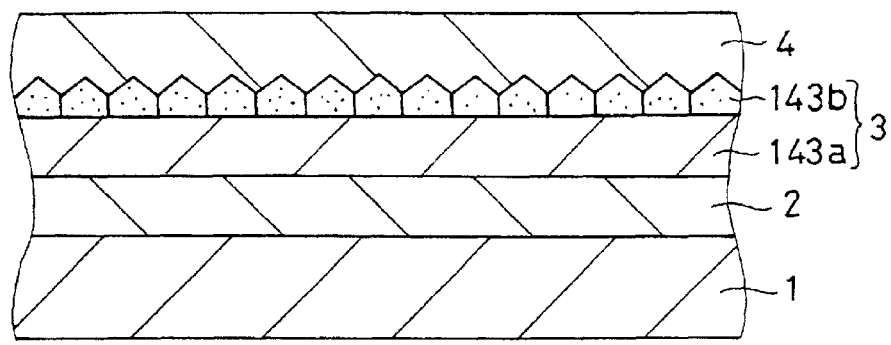
FIG. 21 is a sectional view of the capacitance-producing region shown in FIG. 20.

FIG. 20 is a sectional view of the tunable thin film capacitor of the thirteenth embodiment according to the invention, and FIG. 21 is an enlarged sectional view of the capacitance-producing region of FIG. 20. In this embodiment, the components that play the same or corresponding roles as in the above-described embodiments will be identified with the same reference symbols, and in some cases overlapping descriptions will be omitted.

Referring to the drawings, the reference numeral 1 denotes a support substrate, numeral 2 denotes a lower electrode layer, numeral 3 denotes a thin film dialectic layer, numeral 4 denotes an upper electrode layer, numeral 5 denotes a protective layer, and numerals 16 and 17 denote terminal portions. The thin film dielectric layer 3 is comprised of a dielectric layer 143a having a high dielectric constant and a dielectric layer 143b having a low dielectric constant.

The support substrate 1 is a ceramic substrate made of, e.g., alumina, a monocrystalline substrate made of, e.g., sapphire, or the like. On the surface of the support substrate 1, the lower electrode layer 2 is formed. The lower electrode layer is made of Pt or the like that has a high melting point and is a noble metal since it is necessary to heat-treat the thin film dielectric layer 3. This lower electrode layer 2 is formed by, e.g., the sputtering process at a substrate temperature of 150° C. to 600° C. In FIG. 20, numeral 96 denotes a terminal-disposing portion that comprises a portion of the lower electrode layer 2 extended up to the position at which the terminal portion 16 is formed. The thickness of this lower electrode 2 is 0.1 to 5 μm. In case that the thickness of the lower electrode layer 2 is made smaller than 0.1 μm for example, the resistance of the electrode itself becomes large, and at the same time, the continuity of the electrode is lost, which results in deteriorating the reliability. On the other hand, in case that the thickness of the lower electrode layer 2 is made larger than 5 μm, a step coverage defect is caused in the thin film dielectric layer 3.

The thin film dielectric layer 3 is comprised of the dielectric layer 143a with a high dielectric constant which is positioned at the side of the lower electrode layer 2 and composed of perovskite-type oxide crystal grains containing at least Ba, Sr and Ti, and the dielectric layer 143b with a low dielectric constant which is positioned on this dielectric layer 143a, will adhere to the upper electrode layer 4 and is composed of oxide grains containing Ba and/or Sr.

Such a thin film dielectric layer 3 is formed in the following manner, for example.

First, in the chamber of a sputtering apparatus, a dielectric layer comprising a single layer is formed by sputtering by the use, as a target, of a perovskite-type oxide in which the A-site is excessive. This single layer is a layer that will constitute the dielectric layer 143a with a high dielectric constant and the dielectric layer 143b with a low dielectric constant. Thereafter, in the air, heat treatment is performed at a high temperature of, e.g., 800° C. or higher.

At this time, the oxide being the A-site component excessively contained in the dielectric film is released out of the dielectric film, as a result of which the dielectric layer 143a with a high dielectric constant that is positioned at the side of the lower electrode layer 2 and comprised of perovskite-type oxide crystal grains containing at least Ba, Sr and Ti is maintained, and, on this dielectric layer 143a with a high dielectric constant, the dielectric layer 143b with a low dielectric constant that is comprised of oxide grains containing Ba and/or Sr is produced.

In the thus constituted thin film dielectric layer 3, the dielectric layer 143b comprised of the oxide being the A-site component is newly formed. As the mechanism for forming he dielectric layer 143b comprised of the oxide being the A-site component, there is evaporation-condensation as well as diffusion. In the case of the thin film dielectric layer 3 shown in FIG. 20, the perovskite-type dielectric layer of the stoichiometric composition in which the excessive A-site component has left out from the dielectric film with the excessive A-site formed by sputtering is designated as the dielectric layer 143a, and the newly formed oxide layer comprising the A-site component is designated as the dielectric layer 143b.

The upper electrode layer 4 is formed by the use of, e.g., the sputtering process. As the material of this electrode layer 4, Au that has a small resistivity is desirable in view of lowering the resistance of the electrode. Besides, Al, Cu, etc. can also be used. The thickness of this upper electrode layer 4 is 0.1 to 5 μm. The lower limit of this thickness is set by taking the resistance of the electrode itself into consideration as in the case of the lower electrode layer 2. Further, in FIG. 20, numerals 97 and 98 denote terminal-disposing portions that are comprised of extension portions of the upper electrode layer 4 or formed at the same step of forming the upper electrode 4, and these terminal-disposing portions 97, 98 are extended to the positions at which the terminal portions 16, 17 are formed.

Figure 22:
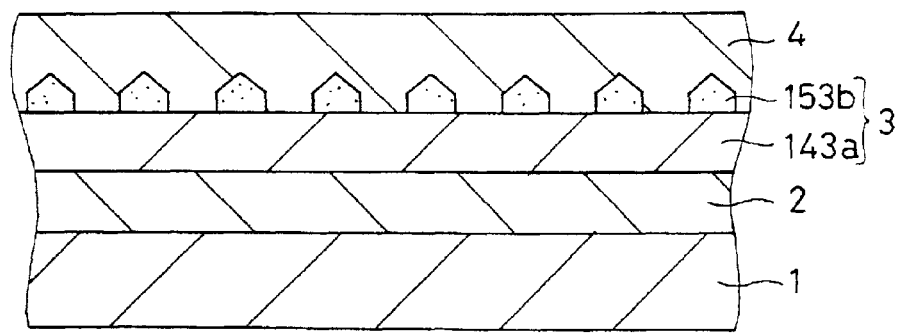
FIG. 22 is a sectional view of the capacitance-producing region in the tunable thin film capacitor of the fourteenth embodiment according to the invention.
Figure 23A:
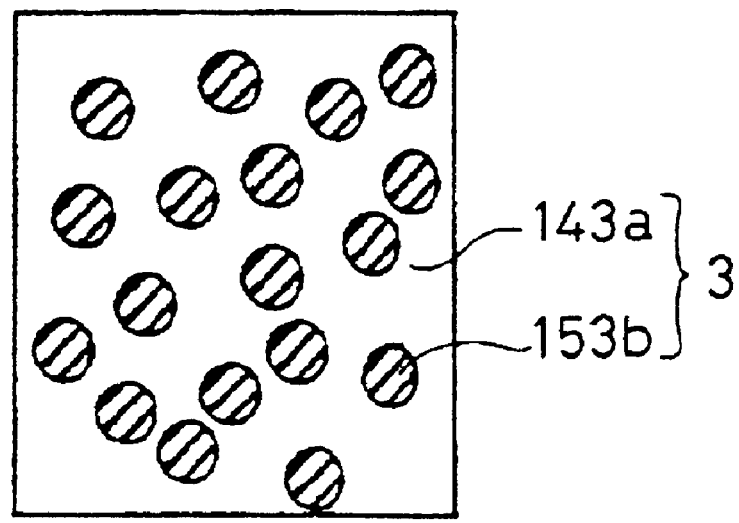
FIGS. 23A and 23B are each alike a plan view of the surface side of a thin film dielectric layer.
Figure 23B:
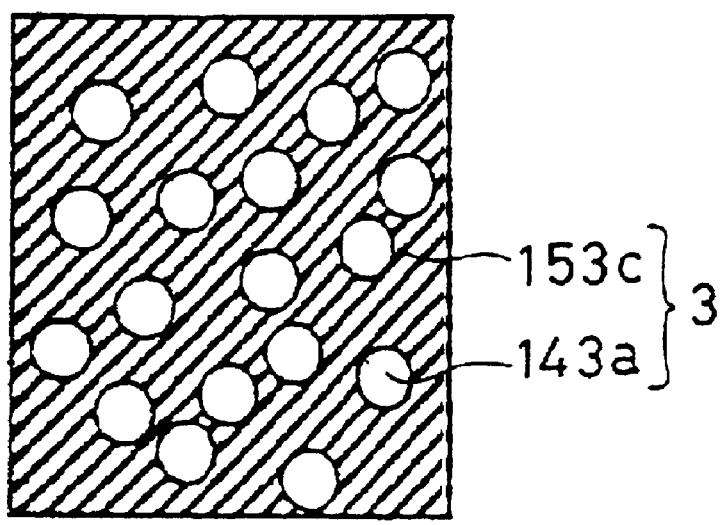

The thin film dielectric layer 3 constituting the tunable thin film capacitor according to the invention is formed such that, as mentioned above, the dielectric layer, which was originally one layer, is divided into two layers by heat treatment. By controlling the thickness of the original dielectric layer formed by sputtering and the amount of the excessive A site component, the thickness of the dielectric layer 143b with a low dielectric constant can be controlled. In case that the thickness of the original dielectric layer formed by sputtering is large or in case that the dielectric layer 143b with a low dielectric constant is thick, the dielectric layer 143b with a low dielectric constant becomes a perfect film (a uniformly continuous film) on the dielectric layer 143a with a high dielectric constant as shown in FIG. 21, but, in case that the thickness of the original dielectric layer formed by sputtering is small or in case that the thickness of the dielectric layer is reduced by reducing the excessive A-site element, there results such a dielectric layer 153b with a low dielectric constant that the dielectric layer with a low dielectric constant sporadically exists on the dielectric layer 143a with a high dielectric constant as shown in tunable thin film capacitor of the fourteenth embodiment of FIG. 22. FIG. 21 and FIG. 22 are sectional views showing the capacitance-producing region in which the thin film dielectric layer 3 is sandwiched between the lower electrode layer 2 and the upper electrode layer 4. Further, to view plane-wise by paying attention to the surface of the thin film dielectric layer 3, as shown in FIG. 23A, the thin film dielectric layer 3 appears as the dielectric layer 153b with a low dielectric constant arranged like scattered islands. Or, the thin film dielectric layer 3 appears as a reticulate dielectric layer 153c with a low dielectric constant as shown in FIG. 23B.

Any of the dielectric layers 143b, 153b and 153c with a low dielectric constant is comprised mainly of the excessive A-site component such as, e.g., the oxide grains of Ba or Sr, and, depending on the difference in growth of the individual oxide grains when they are produced, projections and depressions are produced in the surface of the dielectric layer for a cause pertaining to the crystal grain diameters.

Embodiment 10

On a sapphire R substrate as the support substrate 1, a Pt layer was formed as the lower electrode layer 2 by the sputtering process at a substrate temperature of 600° C. On the Pt layer, a single dielectric layer was formed by the use of a target comprised of $(Ba_{0.5}Sr_{0.5})_{1.2}TiO_3$. The substrate temperature was 600° C., and the deposition time was 15 minutes. After this, the product was taken out from the sputtering apparatus and then heat-treated in the air at 900° C. for 600 minutes, whereby the dielectric layer 143a with a high dielectric constant and the dielectric layer 143b with a low dielectric constant were formed.

Finally, as the upper electrode 4, an Au electrode layer with a thickness of 1.2 μm was formed, whereby a capacitor was formed. By SEM observation, it was confirmed that projections and depressions due to the crystal grain diameters were formed on the surface of the dielectric.

Further, the peeling of the upper electrode layer 4 from the thin film dielectric layer 3 was not found at all. Further, by TEM observation, it was confirmed that the dielectric layer was in a state divided to two layers, and the dielectric layer 143a with a high dielectric constant positioned at the lower electrode side was comprised of Sr-rich perovskite-type oxide grains. It was also confirmed that the dielectric layer 143b with a low dielectric constant positioned at the upper electrode side was comprised of Ba-rich barium oxide type oxide grains. By these observations, it was confirmed that the dielectric layer at the lower electrode side was the perovskite-type layer 143a with a high dielectric constant, the dielectric layer at the upper electrode side was the barium oxide type layer 143b with a low dielectric constant, and the dielectric layer 143b with a low dielectric constant had projections and depressions due to the crystal gain diameters.

Further, it was confirmed that Au that constituted the upper electrode layer 4 existed in such a state as to bite into the depressions of the projections and depressions.

Due to this, the thickness of the upper electrode layer 4 was increased in order to reduce the loss due to the electrode, but the peeling phenomenon of the upper electrode layer 4 was not found.

Comparative Example

Samples were fabricated by the use of the same materials as those used in the embodiment. More specifically, on a sapphire R substrate as the support substrate 1, a Pt layer was formed as the lower electrode layer by the sputtering process at a substrate temperature of 600° C. On the Pt layer, a dielectric layer was formed by the use of a target comprised of $(Ba_{0.5} Sr_{0.5})_{1.2}TiO_3$. The substrate temperature was 600° C., and the deposition time was 15 minutes. Finally, as the upper electrode 4, an Au electrode layer with a thickness of 1.2 μm was formed, whereby a capacitor was formed. In other words, the dielectric layer was formed by the use of a target comprised of $(Ba_{0.5} Sr_{0.5})_{1.2}TiO_3$, and, after this, no heat treatment was conducted.

By SEM observation, it was found that the surface of the dielectric was flat and did not firmly adhere to the upper electrode 4; and thus, the peeling of the upper electrode layer 4 took place. Further, even in case that the upper electrode layers 4 did not perfectly peel off in some other samples, it was found that the corner portions of the upper electrodes peeled off.

In any of the tunable thin film capacitors in accordance with the first to fourteenth embodiments, the capacitance exerts influence on the characteristics of a high-frequency circuit, so that it becomes possible to change the filter transmission characteristic, the detection frequency, etc.; and thus, the variable capacitance element can be widely applied to various high-frequency devices such as, e.g., a high-frequency filter, an impedance antenna, a delay element, an array antenna, and a coupling type strip line.

Moreover, the frequency at which the tunable thin film capacitor embodying the invention should preferably fall in a range of 0.5 GHz to 5 GHz.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A tunable thin film capacitor comprising
   a support substrate,
   a lower electrode layer provided on the support substrate,
   a thin film dielectric layer which is provided on the lower electrode layer and whose dielectric constant is changed by application of a control voltage, and
   an upper electrode layer provided on the thin film dielectric layer,
   wherein the thin film dielectric layer is held between the lower electrode layer and the upper electrode layer so an to form a plurality of capacitance-producing regions; and the respective capacitance-producing regions are electrically connected to each other,
   wherein the thin film dielectric layer comprises perovskite-type oxide crystal grains containing at least Ba, Sr and Ti, and the crystal grains are orientated in a plane (111).

2. The tunable thin film capacitor of claim 1,
   wherein, in the perovskite-type oxide constituting the thin film dielectric layer, x in $(Ba_xSr_{1-x}) TiO_3$ is in a range of 0.4 to 0.6.

3. The tunable thin film capacitor of claim 1,
   wherein the thickness of the thin film dielectric layer is 1 μm or less, the dielectric crystal grains constituting the thin film dielectric layer are columnar grains that are long in the film thickness direction, and an average grain diameter in the film surface direction of the crystal grains is smaller than 0.5 μm.

4. The tunable thin film capacitor of claim 1,
   wherein the lower electrode layer contacted with the thin film dielectric layer comprises Pt, Au or a solid solution thereof that is orientated in the plane (111).

5. The tunable thin film capacitor of claim 1,
   wherein the thin film dielectric layer is composed of a lower thin film dielectric layer having a thickness that is ½ or less of the thickness of the thin film dielectric layer and an upper thin film dielectric layer being the remainder, wherein, after the lower thin film dielectric layer is formed by deposition, the lower thin film dielectric layer is orientated in the plane (111) by heat-treating.

6. A tunable thin film capacitor comprising:
   a support substrate,
   a lower electrode layer provided on the support substrate,
   a thin film dielectric layer which is provided on the lower electrode layer end whose dielectric constant is changed by application of a control voltage, and
   an upper electrode layer provided on the thin film dielectric layer,
   wherein the thin film dielectric layer is held between the lower electrode layer and the upper electrode layer so as to form a plurality of capacitance-producing regions, and the respective capacitance-producing regions are electrically connected to each other,
   wherein the thin film dielectric layer comprises perovskite-type crystal grains containing at least Ba, Sr and Ti, and a composition thereof is represented as $(BaSr) Ti_xO_3$, wherein x in the composition is in a range of 0.7 to 0.9.

7. The tunable thin film capacitor of claim 6,
   wherein the perovskite-type oxide crystal grains constituting the thin film dielectric layer are orientated in a plane (110).

8. The tunable thin film capacitor of claim 6,
   wherein the thin film dielectric layer is formed on a lower electrode layer comprising Pt, Au or a solid solution thereof orientated in the plane (111) on the support substrate, by the sputtering process at a substrate temperature of 400° C. to 600° C.

9. A tunable thin film capacitor comprising:
   a support substrate,
   a lower electrode layer provided on the support substrate,
   a thin film dielectric layer which in provided on the lower electrode layer and whose dielectric constant is changed by application of a control voltage, and
   an upper electrode layer provided on the thin film dielectric layer,
   wherein the thin film dielectric layer is held between the lower electrode layer and the upper electrode layer so as to form a plurality of capacitance-producing regions, and the respective capacitance-producing regions are electrically connected to each other, wherein the thin film dielectric layer comprises perovskite-type oxide crystal grains containing at least Ba, Sr and Ti, and the crystal grains are orientated at random.

10. The tunable thin film capacitor of claim 9, wherein x in perovskite-type oxide, $(Ba_xSr_{1-x})TiO_3$, constituting the thin film dielectric layer is in a range of 0.4 to 0.6.

11. The tunable thin film capacitor of claim 9, wherein a thickness of the thin film dielectric layer is 1 μm or less, and the dielectric crystal grains constituting the thin film dielectric layer are equiaxial grains, and an average grain diameter of the crystal grains is 0.5 μm or less.

12. The tunable thin film capacitor of claim 9, wherein the thin film dielectric layer is constituted such that, on the lower electrode layer, an amorphous dielectric layer is deposited, and then the amorphous dielectric layer is crystallized, by heat treatment to orientate the crystal grains at random.

* * * * *